United States Patent
Yamazaki et al.

(10) Patent No.: US 7,214,573 B2
(45) Date of Patent: May 8, 2007

(54) METHOD OF MANUFACTURING A SEMICONDUCTOR DEVICE THAT INCLUDES PATTERNING SUB-ISLANDS

(75) Inventors: Shunpei Yamazaki, Tokyo (JP); Hiroshi Shibata, Yamagata (JP); Koichiro Tanaka, Kanagawa (JP); Masaaki Hiroki, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/314,452

(22) Filed: Dec. 9, 2002

(65) Prior Publication Data

US 2003/0228723 A1 Dec. 11, 2003

(30) Foreign Application Priority Data

Dec. 11, 2001 (JP) ............................. 2001-376549

(51) Int. Cl.
*H01L 21/00* (2006.01)
(52) U.S. Cl. ...................... 438/164; 438/795; 438/942; 257/E21.347
(58) Field of Classification Search ................ 438/149, 438/150, 164, 479, 482, 486–488, 795, 942; 257/E21.347
See application file for complete search history.

(56) References Cited

U.S. PATENT DOCUMENTS

| 4,177,372 A | 12/1979 | Kotera et al. |
|---|---|---|
| 4,316,074 A | 2/1982 | Daly |
| 4,330,363 A | 5/1982 | Biegesen et al. |
| 4,370,175 A | 1/1983 | Levatter |
| 4,388,145 A | 6/1983 | Hawkins et al. |
| 4,406,709 A | 9/1983 | Celler et al. |
| 4,409,724 A * | 10/1983 | Tasch, Jr. et al. ............. 438/30 |

(Continued)

FOREIGN PATENT DOCUMENTS

EP 0 088 004 9/1983

(Continued)

OTHER PUBLICATIONS

Im et al., Appl.Phys.Lett., "On the Super Lateral Growth Phenomenon Observed in Excimer Laser-Induced Crystallization of Thin Si Films", Apr. 25, 1994, (vol. 64/No. 17/pp. 2303-2305).

(Continued)

*Primary Examiner*—Michael Lebentritt
*Assistant Examiner*—Stanetta Isaac
(74) *Attorney, Agent, or Firm*—Nixon Peabody LLP; Jeffrey L. Costellia

(57) ABSTRACT

A method of manufacturing a semiconductor device is provided which uses a laser crystallization method capable of increasing substrate processing efficiency. An island-like semiconductor film including one or more islands is formed by patterning (sub-island). The sub-island is then irradiated with laser light to improve its crystallinity, and thereafter patterned to form an island. From pattern information of a sub-island, a laser light scanning path on a substrate is determined such that at least the sub-island is irradiated with laser light. In other words, the present invention runs laser light so as to obtain at least the minimum degree of crystallization of a portion that has to be crystallized, instead of irradiating the entire substrate with laser light.

44 Claims, 41 Drawing Sheets

U.S. PATENT DOCUMENTS

| | | | |
|---|---|---|---|
| 4,554,823 A | 11/1985 | Lilley | |
| 4,566,043 A | 1/1986 | Tamura | |
| 4,592,799 A | 6/1986 | Hayafuji | |
| 4,668,089 A | 5/1987 | Oshida et al. | |
| 4,692,191 A | 9/1987 | Maeda et al. | |
| 4,780,590 A | 10/1988 | Griner et al. | |
| 4,861,964 A | 8/1989 | Sinohara | |
| 4,978,970 A | 12/1990 | Okazaki | |
| RE33,947 E | 6/1992 | Shinohara | |
| 5,147,826 A | 9/1992 | Liu et al. | |
| 5,214,001 A | 5/1993 | Ipposhi et al. | |
| 5,225,886 A | 7/1993 | Koizumi et al. | |
| 5,246,870 A | 9/1993 | Merchant | |
| 5,275,851 A | 1/1994 | Fonash et al. | |
| 5,294,555 A | 3/1994 | Mano et al. | |
| 5,306,584 A | 4/1994 | Palmer | |
| 5,315,101 A | 5/1994 | Hughes et al. | |
| 5,365,875 A | 11/1994 | Asai et al. | |
| 5,367,392 A | 11/1994 | Janai | |
| 5,403,772 A | 4/1995 | Zhang et al. | |
| 5,409,867 A | 4/1995 | Asano | |
| 5,432,122 A * | 7/1995 | Chae | 438/157 |
| 5,466,958 A | 11/1995 | Kakumu | |
| 5,488,000 A | 1/1996 | Zhang et al. | |
| 5,488,005 A | 1/1996 | Han et al. | |
| 5,517,312 A | 5/1996 | Finarov | |
| 5,521,107 A | 5/1996 | Yamazaki et al. | |
| 5,528,056 A | 6/1996 | Shimada et al. | |
| 5,529,630 A * | 6/1996 | Imahashi et al. | 118/665 |
| 5,529,937 A | 6/1996 | Zhang et al. | |
| 5,543,636 A | 8/1996 | Yamazaki | |
| 5,563,427 A | 10/1996 | Yudasaka et al. | |
| 5,569,610 A | 10/1996 | Zhang et al. | |
| 5,580,801 A | 12/1996 | Maegawa et al. | |
| 5,591,668 A | 1/1997 | Maegawa et al. | |
| 5,592,318 A | 1/1997 | Majima et al. | |
| 5,604,360 A | 2/1997 | Zhang et al. | |
| 5,608,232 A | 3/1997 | Yamazaki et al. | |
| 5,618,741 A | 4/1997 | Young et al. | |
| 5,620,906 A | 4/1997 | Yamaguchi et al. | |
| 5,625,473 A | 4/1997 | Kondo et al. | |
| 5,632,915 A | 5/1997 | Schnetzer et al. | |
| 5,643,826 A | 7/1997 | Ohtani et al. | |
| 5,656,825 A | 8/1997 | Kusumoto et al. | |
| 5,679,588 A | 10/1997 | Choi et al. | |
| 5,696,003 A | 12/1997 | Makita et al. | |
| 5,698,882 A | 12/1997 | Park | |
| 5,708,252 A | 1/1998 | Shinohara et al. | |
| 5,712,191 A | 1/1998 | Nakajima et al. | |
| 5,736,751 A | 4/1998 | Mano et al. | |
| 5,761,381 A | 6/1998 | Arci et al. | |
| 5,795,816 A | 8/1998 | Teramoto et al. | |
| 5,803,965 A | 9/1998 | Yoon | |
| 5,804,471 A | 9/1998 | Yamazaki et al. | |
| 5,815,494 A | 9/1998 | Yamazaki et al. | |
| 5,821,137 A | 10/1998 | Wakai et al. | |
| 5,851,862 A | 12/1998 | Ohtani et al. | |
| 5,854,803 A | 12/1998 | Yamazaki et al. | |
| 5,886,320 A | 3/1999 | Gallo et al. | |
| 5,886,366 A | 3/1999 | Yamazaki et al. | |
| 5,891,764 A | 4/1999 | Ishihara et al. | |
| 5,923,962 A | 7/1999 | Ohtani et al. | |
| 5,937,282 A | 8/1999 | Nakajima et al. | |
| 5,940,690 A | 8/1999 | Kusumoto et al. | |
| 5,943,593 A | 8/1999 | Noguchi et al. | |
| 5,953,597 A | 9/1999 | Kusumoto et al. | |
| 5,980,088 A | 11/1999 | Iwasaki et al. | |
| 5,986,306 A | 11/1999 | Nakajima et al. | |
| 6,020,224 A | 2/2000 | Shimogaichi et al. | |
| 6,043,453 A | 3/2000 | Arai | |
| 6,059,873 A | 5/2000 | Yamaguchi et al. | |
| 6,066,516 A | 5/2000 | Miyasaka | |
| 6,071,765 A | 6/2000 | Noguchi et al. | |
| 6,136,632 A | 10/2000 | Higashi | |
| 6,149,988 A | 11/2000 | Shinohara et al. | |
| 6,169,292 B1 | 1/2001 | Yamazaki et al. | |
| 6,174,374 B1 | 1/2001 | Zhang et al. | |
| 6,176,922 B1 | 1/2001 | Aklufi et al. | |
| 6,177,301 B1 | 1/2001 | Jung | |
| 6,204,099 B1 | 3/2001 | Kusumoto et al. | |
| 6,210,996 B1 | 4/2001 | Yamazaki et al. | |
| 6,221,701 B1 | 4/2001 | Yamazaki | |
| 6,242,289 B1 | 6/2001 | Nakajima et al. | |
| 6,256,849 B1 | 7/2001 | Kim | |
| 6,261,856 B1 | 7/2001 | Shinohara et al. | |
| 6,265,745 B1 | 7/2001 | Kusumoto et al. | |
| 6,285,042 B1 | 9/2001 | Ohtani et al. | |
| 6,322,625 B2 | 11/2001 | Im | |
| 6,335,541 B1 | 1/2002 | Ohtani et al. | |
| 6,337,232 B1 | 1/2002 | Kusumoto et al. | |
| 6,363,296 B1 | 3/2002 | Schulze | |
| 6,365,933 B1 | 4/2002 | Yamazaki et al. | |
| 6,372,039 B1 * | 4/2002 | Okumura et al. | 117/8 |
| 6,373,870 B1 | 4/2002 | Yamazaki et al. | |
| 6,393,042 B1 | 5/2002 | Tanaka | |
| 6,396,616 B1 | 5/2002 | Fitzer et al. | |
| 6,437,284 B1 | 8/2002 | Okamoto et al. | |
| 6,449,123 B1 | 9/2002 | Tsujimoto et al. | |
| 6,468,842 B2 | 10/2002 | Yamazaki et al. | |
| 6,469,729 B1 | 10/2002 | Ryan | |
| 6,475,872 B1 | 11/2002 | Jung | |
| 6,479,329 B2 | 11/2002 | Nakajima et al. | |
| 6,487,307 B1 * | 11/2002 | Hennessey et al. | 382/149 |
| 6,489,188 B2 | 12/2002 | Jung | |
| 6,521,492 B2 | 2/2003 | Miyasaka et al. | |
| 6,524,977 B1 * | 2/2003 | Yamazaki et al. | 438/799 |
| 6,556,652 B1 * | 4/2003 | Mazor et al. | 378/86 |
| 6,558,991 B2 | 5/2003 | Yamazaki et al. | |
| 6,573,163 B2 | 6/2003 | Voutsas et al. | |
| 6,573,919 B2 | 6/2003 | Benear et al. | |
| 6,576,919 B1 | 6/2003 | Yoshida | |
| 6,577,380 B1 | 6/2003 | Sposili et al. | |
| 6,583,381 B1 | 6/2003 | Duignan | |
| 6,590,230 B1 | 7/2003 | Yamazaki et al. | |
| 6,590,698 B1 | 7/2003 | Ohtsuki et al. | |
| 6,599,788 B1 | 7/2003 | Kawasaki et al. | |
| 6,602,744 B1 | 8/2003 | Ino et al. | |
| 6,642,091 B1 | 11/2003 | Tanabe | |
| 6,657,154 B1 | 12/2003 | Tanabe et al. | |
| 6,660,085 B2 | 12/2003 | Hara et al. | |
| 6,662,063 B2 | 12/2003 | Hunter et al. | |
| 6,677,222 B1 | 1/2004 | Mishima et al. | |
| 6,698,944 B2 | 3/2004 | Fujita | |
| 6,700,096 B2 | 3/2004 | Yamazaki et al. | |
| 6,709,905 B2 | 3/2004 | Kusumoto et al. | |
| 6,727,125 B2 | 4/2004 | Adachi et al. | |
| 6,730,550 B1 | 5/2004 | Yamazaki et al. | |
| 6,753,212 B2 | 6/2004 | Yamazaki et al. | |
| 6,759,628 B1 * | 7/2004 | Ino et al. | 219/121.8 |
| 6,764,886 B2 | 7/2004 | Yamazaki et al. | |
| 6,822,263 B2 * | 11/2004 | Satou et al. | 257/59 |
| 6,830,617 B1 | 12/2004 | Ohtani et al. | |
| 6,863,733 B1 | 3/2005 | Tanabe | |
| 6,893,987 B2 * | 5/2005 | Shiota et al. | 438/401 |
| 6,921,686 B2 | 7/2005 | Kusumoto et al. | |
| 6,974,731 B2 | 12/2005 | Yamazaki et al. | |
| 7,045,403 B2 | 5/2006 | Kusumoto et al. | |
| 2001/0000243 A1 | 4/2001 | Sugano et al. | |
| 2001/0019861 A1 | 9/2001 | Yamazaki et al. | |
| 2001/0038127 A1 | 11/2001 | Yamazaki et al. | |
| 2001/0055830 A1 | 12/2001 | Yoshimoto | |
| 2002/0045288 A1 | 4/2002 | Yamazaki et al. | |
| 2002/0054231 A1 | 5/2002 | Masuyuki | |
| 2002/0068391 A1 | 6/2002 | Jung | |

| | | | |
|---|---|---|---|
| 2002/0094008 A1 | 7/2002 | Tanaka | |
| 2002/0096680 A1 | 7/2002 | Sugano et al. | |
| 2002/0100937 A1 | 8/2002 | Yamazaki et al. | |
| 2002/0119609 A1 | 8/2002 | Hatano et al. | |
| 2002/0145711 A1 | 10/2002 | Magome et al. | |
| 2002/0146873 A1 | 10/2002 | Tanaka | |
| 2003/0024905 A1 | 2/2003 | Tanaka | |
| 2003/0047732 A1 | 3/2003 | Yamazaki et al. | |
| 2003/0059990 A1 | 3/2003 | Yamazaki | |
| 2003/0075733 A1 | 4/2003 | Yamazaki et al. | |
| 2003/0089691 A1 | 5/2003 | Tanaka | |
| 2003/0089907 A1 | 5/2003 | Yamaguchi et al. | |
| 2003/0112322 A1 | 6/2003 | Tanaka | |
| 2003/0136772 A1 | 7/2003 | Yamazaki et al. | |
| 2003/0148594 A1 | 8/2003 | Yamazaki et al. | |
| 2003/0153182 A1 | 8/2003 | Yamazaki et al. | |
| 2003/0153999 A1 | 8/2003 | Miyanaga et al. | |
| 2003/0171837 A1 | 9/2003 | Yamazaki et al. | |
| 2003/0211714 A1 | 11/2003 | Yamazaki et al. | |
| 2003/0215973 A1 | 11/2003 | Yamazaki et al. | |
| 2003/0228723 A1 | 12/2003 | Yamazaki et al. | |
| 2003/0234395 A1 | 12/2003 | Kokubo et al. | |
| 2003/0235971 A1 | 12/2003 | Yamazaki et al. | |
| 2004/0040938 A1 | 3/2004 | Yamazaki et al. | |
| 2004/0053450 A1 | 3/2004 | Sposili | |
| 2004/0053480 A1 | 3/2004 | Tanabe et al. | |
| 2004/0060515 A1 | 4/2004 | Tanabe et al. | |
| 2004/0106237 A1 | 6/2004 | Yamazaki | |
| 2004/0132266 A1 | 7/2004 | Yamazaki et al. | |
| 2004/0224449 A1 | 11/2004 | Yamazaloi et al. | |
| 2005/0009251 A1 | 1/2005 | Yamazaki et al. | |
| 2005/0037554 A1 | 2/2005 | Ohtani et al. | |
| 2006/0141688 A1 | 6/2006 | Kisumoto et al. | |

FOREIGN PATENT DOCUMENTS

| | | | |
|---|---|---|---|
| EP | 0 488 801 B1 | 6/1992 | |
| EP | 0 646 950 A2 | 4/1995 | |
| EP | 1 049 144 A1 | 11/2000 | |
| GB | 2 35 4111 A | 3/2001 | |
| JP | 57-109322 | 7/1982 | |
| JP | 59-165450 | 9/1984 | |
| JP | 59-205761 | 11/1984 | |
| JP | 60-161396 | 8/1985 | |
| JP | 60-245172 | 12/1985 | |
| JP | 60-245173 | 12/1985 | |
| JP | 60-245174 | 12/1985 | |
| JP | 61-048976 | 3/1986 | |
| JP | 61-071636 | 4/1986 | |
| JP | 61-085868 | 5/1986 | |
| JP | 61-251115 | 11/1986 | |
| JP | 62-104117 | 5/1987 | |
| JP | 63-142807 | 6/1988 | |
| JP | 01-134345 | 5/1989 | |
| JP | 01-154124 | 6/1989 | |
| JP | 01-194351 | 8/1989 | |
| JP | 02-140915 | 5/1990 | |
| JP | 02-181419 | 7/1990 | |
| JP | 04-170067 | 6/1992 | |
| JP | 04-206970 | 7/1992 | |
| JP | 04-282869 | 10/1992 | |
| JP | 04-313272 | 11/1992 | |
| JP | 05-067785 | 3/1993 | |
| JP | 05-090589 | 4/1993 | |
| JP | 05-206464 | 8/1993 | |
| JP | 05-226790 | 9/1993 | |
| JP | 05-315278 | 11/1993 | |
| JP | 11-354463 | 12/1993 | |
| JP | 06-163401 | 6/1994 | |
| JP | 07-130652 | 5/1995 | |
| JP | 07-183540 | 7/1995 | |
| JP | 07-193247 | 7/1995 | |
| JP | 07-326769 | 12/1995 | |
| JP | 08-078329 | 3/1996 | |
| JP | 08-195357 | 7/1996 | |
| JP | 08-213629 | 8/1996 | |
| JP | 08-228006 | 9/1996 | |
| JP | 09-045616 | 2/1997 | |
| JP | 09-219380 | 8/1997 | |
| JP | 09-253879 | 9/1997 | |
| JP | 09-260681 | 10/1997 | |
| JP | 09-270393 | 10/1997 | |
| JP | 09-289321 | 11/1997 | |
| JP | 09-320961 | 12/1997 | |
| JP | 10-012891 | 1/1998 | |
| JP | 10-135468 | 5/1998 | |
| JP | 10-135469 | 5/1998 | |
| JP | 2000-068520 | 3/2000 | |
| JP | 2000-277450 | 10/2000 | |
| JP | 2001-036089 | 2/2001 | |
| JP | 2001-102373 | 4/2001 | |
| JP | 2001-144027 | 5/2001 | |
| JP | 3221724 | 8/2001 | |
| JP | 2003-229432 | 8/2003 | |

OTHER PUBLICATIONS

Sposili et al., Appl.Phys.Lett., "Sequential Lateral Solidification of Thin Silicon Films on SIO$_2$", Nov. 4, 1996, (69,19,2864-2866).

Yamazaki et al, "Manufacturing Method of Semiconductor Device", Ser. No. 10/882,343 (US6127D1), Specificaion, Claims 1-14 and Drawings 1-14.

Kakkad et al. Journal of *Non-Crystalline Solids vol. 155/pp. 66-68* (1989) "*Low Temperature Selective Crystallization of Amorphous Silicon*".

Liu et al. Appl. Phys. Lett. vol. 55/No. 7/pp. 660-662 (Aug. 1989) "*Selective area crystallization of amorphous silicon films by low-temperature rapid thermal annealing*".

Lin et al. IEEE Electron Device Letters vol. 15/No. 4/pp. 138-139 (Apr. 1984) "*The Impact of Scaling-Down Oxide Thickness on Poly-Si Thin-Film Transistors' I-V Characteristics*" (Lin et al.).

Li et al. IEEE Device Letters vol. 14/No. 5/pp. 240-242 (May 1993) "*On the Pseudo-Subthreshold Characteristics of Polycrystalline-Silicon Thin-Film Transistors with Large Grain Size*".

Lee et al. IEEE Electron Device Letters vol. 15/ No. 8/ pp. 301-303 (Aug. 1994) "*High Performance Low Temperature Polysilicon Thin Film Transistor Using ECR Plasma Thermal Oxide as Gate Insulator*" (Lee et al.).

Lee et al. IEDM 94 pp. 523-526 (1994) "*ECR Plasma Oxidation Effects on Performance and Stability of Polysilicon Thin Film Transistors*".

Dvureschenskii et al. Phys. Stat. Sol. vol. 95/ pp. 635-640 (1986) "*Transport Phenomena in Amorphous Silicon Doped by Ion Implantation of 3d Metals*".

Hayzelden et al. Appl. Phys. Letters vol. 60/ No. 2/ pp. 225-227 (Jan. 13, 1992) "*In situ transmission electron microscopy studies of silicide-mediated crystallization of amporphous silicon*".

Hempel et al. Solid State Communications vol. 85/ No. 11/ pp. 921-924 (1993) "*Needle-Like Crystallization of Ni Doped Amorphous Silicon Thin Films*".

Kakkad et al. J. Appl. Phys. vol. 65/ pp. 2069-2072 (Mar. 11, 1989) *Crystallized Si film by low-temperature rapid thermal annealing of amorphous silicon.*

Liu et al. Appl. Phys. Letters vol. 62/ No. 20/ pp. 2554-2556 (May 1993) "*Polycrystalline silicon thin film transistors on Cornin 7059 glass substrates using short time, low-temperature processing*".

Caune et al. Applied Surface Science vol. 36/pp. 597-604 (1989) "*Combined CW Laser and Furnace Annealing of Amorphous Si and Ge in Contact with Some Metals*".

Takeuchi et al. "*Performance of poly-Si TFT using the CW laser lateral crystallization (CLC)*" IDMC 2002 pp. 73-76.

Takeuchi et al. "*Performance of poly-Si TFTs fabricated by a suitable scanning CW laser crystallization*" AM-LCD'01 pp. 251-254.

Hara et al. "*High-Performance polycrystalline silicon thin film transistor on non-alkali glass produced using continuous wave laser lateral crystallization*" Jpn. J. Appl. Phys. vol. 41/ pp. L311-L313 (May 15, 2002).

Hara et al., "*Ultra-High Performance Poly-Si TFT's on a Glass by a Stable Scanning CW Laser Lateral Crystallization*" AM-LCE'01 pp. 227-230.

*Office Action* (Application No. 10/305,361), Dated May 13, 2004.

*Search Report* (Application No. 200207340-1), Dated Sep. 6, 2004.

*Search Report* (Application No. 02026824.9), Dated Feb. 21, 2005.

Hara "*High Performance of poly-Si TFT's on a Glass by a Stable Scanning CW laser Lateral Crystallization*" IEDM2001 (pp. 747-750).

* cited by examiner

Fig.3A    B−B'
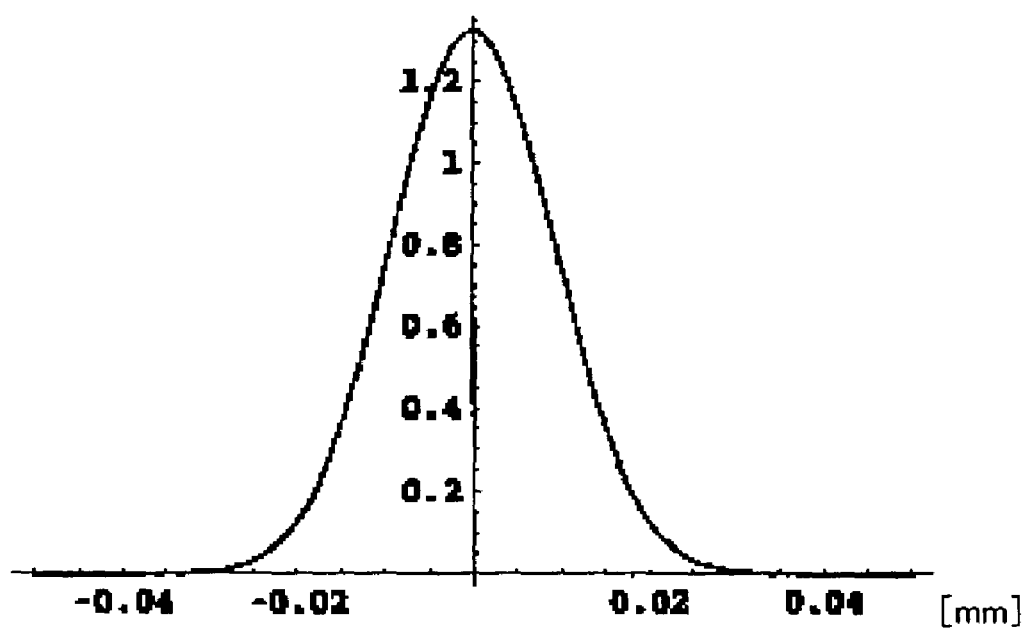
Fig.3B    C−C'
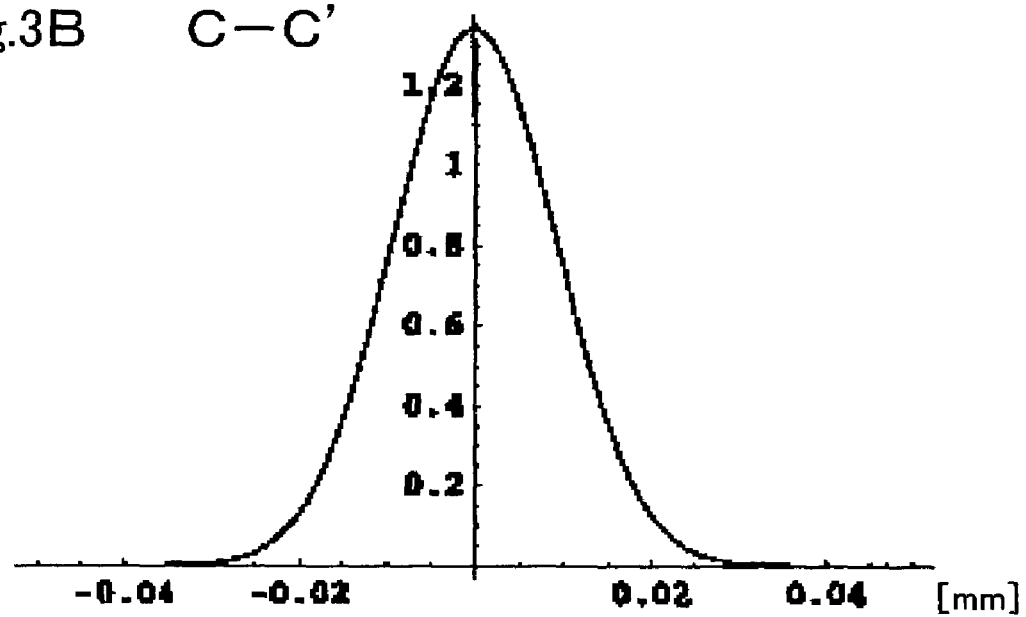

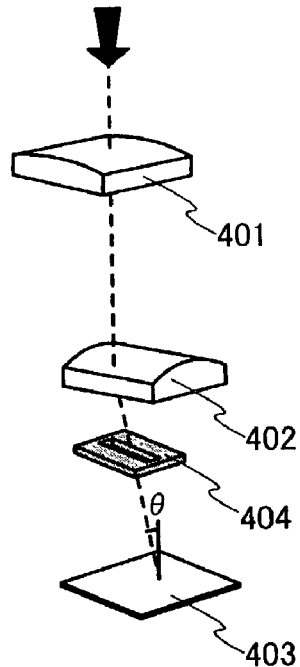
Fig..17A
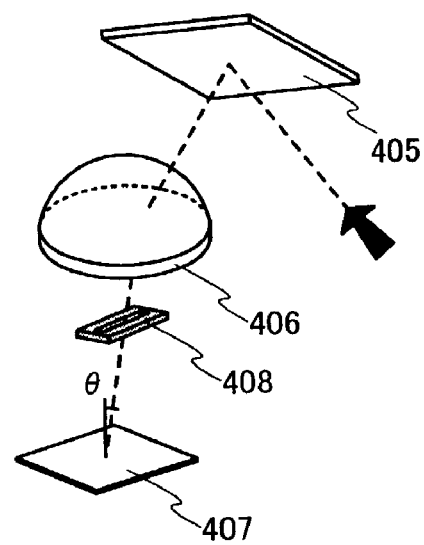
Fig.17B
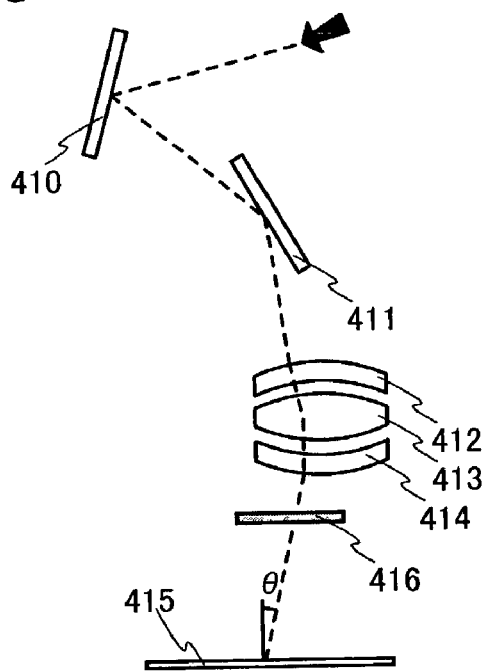
Fig..17C
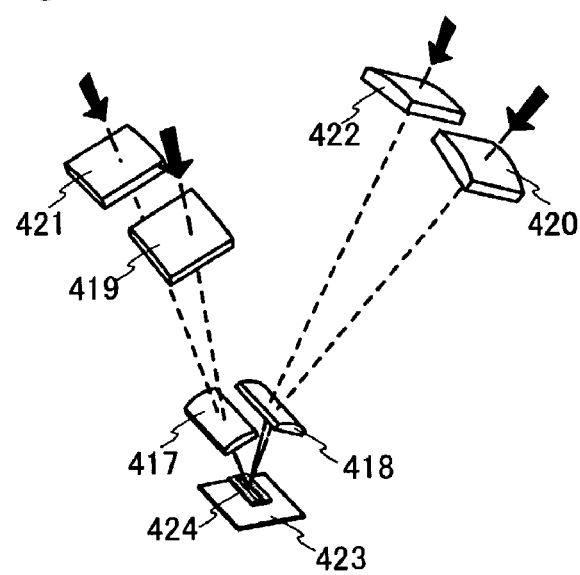
Fig.17D

ビーム4つ

ビーム2つ

Fig..22A
Fig..22B
Fig..22C
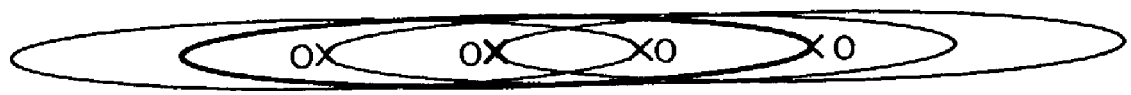

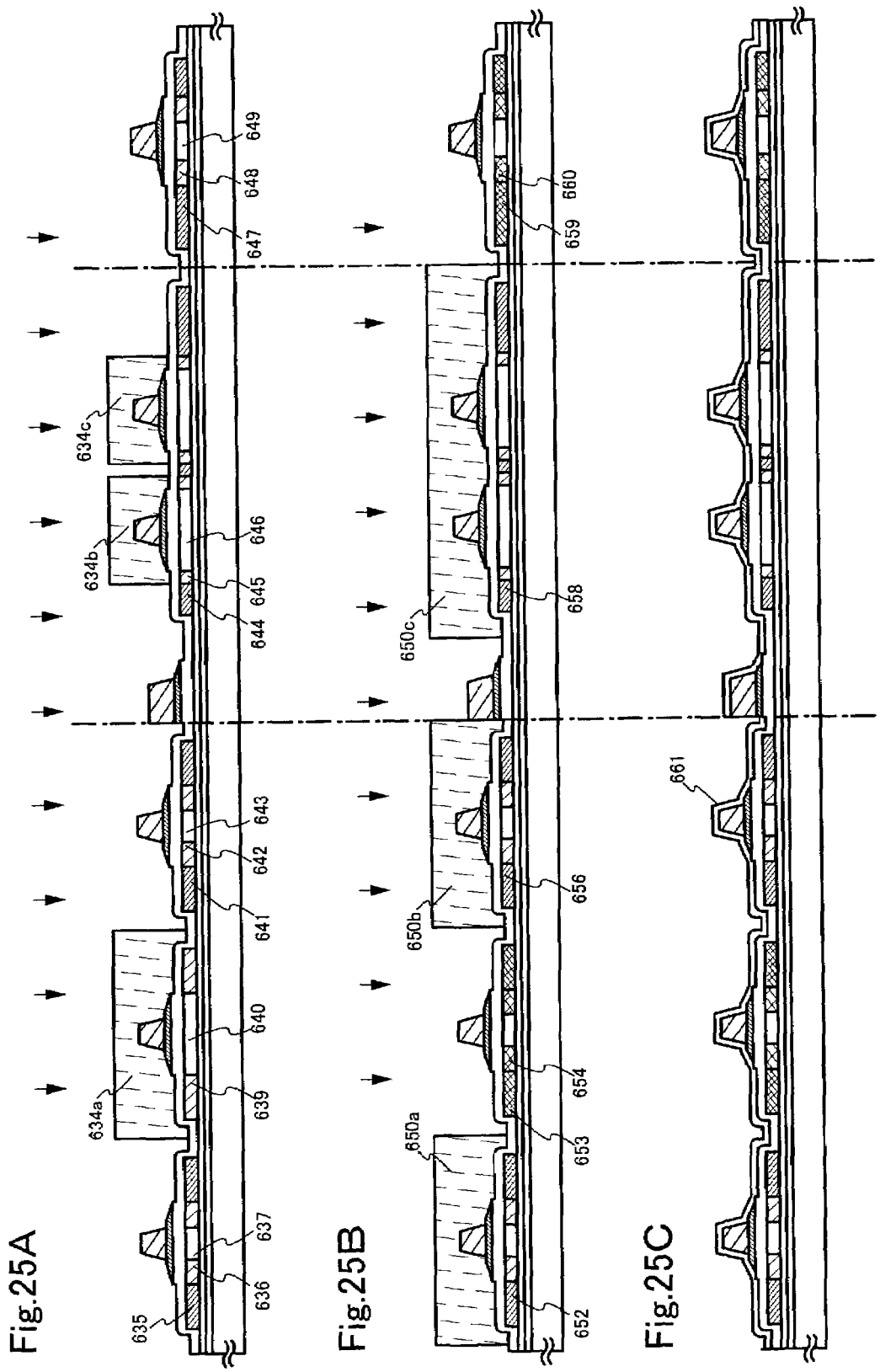

METHOD OF MANUFACTURING A SEMICONDUCTOR DEVICE THAT INCLUDES PATTERNING SUB-ISLANDS

BACKGROUND OF THE INVENTION

1. Field of the Invention

The present invention relates to a laser irradiation method for crystallizing a semiconductor film using a laser light or for performing activation after ion implantation and to a method of manufacturing a semiconductor device.

2. Description of the Related Art

In recent years, a technique of forming a TFT on a substrate has greatly progressed, and its application and development for active matrix semiconductor display devices have been advanced. In particular, since a TFT using a polycrystalline semiconductor film has higher field-effect mobility (also referred to as mobility) than a TFT using a conventional amorphous semiconductor film, it enables high-speed operation. Although the pixel is conventionally controlled by a driving circuit provided outside the substrate, it is therefore possible to control the pixel by the driving circuit formed on the same substrate where the pixel is formed.

Incidentally, as for the substrate used in the semiconductor device, a glass substrate is regarded as promising in comparison with a single crystal silicon substrate in terms of the cost. A glass substrate is inferior in heat resistance and is easily subjected to thermal deformation. Therefore, in the case where a polysilicon TFT is formed on the glass substrate, in order to avoid thermal deformation of the glass substrate, the use of laser annealing for crystallization of the semiconductor film is extremely effective.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film, for example.

Note that the laser annealing method here indicates a technique of re-crystallizing the damaged layer formed on the semiconductor substrate or the semiconductor film, and a technique of crystallizing the semiconductor film formed on the substrate. Also, the laser annealing method here includes a technique applied to leveling or surface reforming of the semiconductor substrate or the semiconductor film. A laser oscillation apparatus applied thereto is a gas laser oscillation apparatus represented by an excimer laser or a solid laser oscillation apparatus represented by a YAG laser. It is known that the apparatus performs crystallization by heating a surface layer of the semiconductor by irradiation of the laser light in an extremely short period of time of about several tens of nanoseconds to several tens of microseconds.

Lasers are roughly divided into two types: pulse oscillation and continuous oscillation, according to an oscillation method. In the pulse oscillation laser, an output energy is relatively high, so that mass productivity can be increased by setting the size of a beam spot to several $cm^2$ or more. In particular, when the shape of the beam spot is processed using an optical system and made to be a linear shape of 10 cm or more in length, it is possible to efficiently perform irradiation of the laser light to the substrate and further enhance the mass productivity. Thus, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous wave laser is used than the case where the pulse oscillation laser is used. When the crystal grain size in the semiconductor film becomes large, the mobility of the TFT formed using the semiconductor film becomes high. For this reason, a continuous wave laser has been attracting attention recently.

However, since the maximum output energy of the continuous wave laser is generally small in comparison with that of the pulse oscillation laser, the size of the beam spot is as small as about $10^{-3}$ $mm^2$. Accordingly, in order to perform processing on one large substrate, it is necessary to move a beam irradiation position on the substrate upward and downward, and right and left, and the processing time per substrate is prolonged. As a result, the efficiency of substrate processing is poor and there is an important problem of how to improve the processing speed of the substrate.

Note that beam spot length adjustment technologies using a slit have conventionally been used (refer to, for example, Patent Document 1 and Patent Document 2 below).

Further, technologies using a laser light of continuous oscillation for crystallization after forming the semiconductor film into an island shape have conventionally been used (refer to, for example Non-Patent Document 1 below).

(Patent Document 1)
JP 11-354463 A (page 3, FIG. 3)

(Patent Document 2)
JP 09-270393 A (pages 3 to 4, FIG. 2)

(Non-Patent Document 1)
Akito Hara, Yasuyoshi Mishima, Tatsuya Kakehi, Fumiyo Takeuchi, Michiko Takei, Kenichi Yoshino, Katsuyuki Suga, Mitsuru Chida, and Nobuo Sasaki, Fujitsu Laboratories Ltd., "High Performance Poly-Si TFTs on a Glass by a Stable Scanning CW Laser Lateral Crystallization", IEDM2001.

SUMMARY OF THE INVENTION

The present invention has been made in view of the above problem, and an object of the present invention is therefore to provide a laser irradiation method using a laser crystallization method that can raise the substrate processing efficiency and mobility of a semiconductor film from those of prior art and to provide a method of manufacturing a semiconductor device which uses the laser irradiation method.

The present invention uses shape data (pattern information) of a mask of a semiconductor film to grasp which part of the semiconductor film becomes an island-like semiconductor film (island). Then, an island-like semiconductor film that includes one or more of such islands is formed by patterning (sub-island). The sub-island is improved in crystallinity by laser light irradiation, and then patterned to form an island.

Furthermore, the present invention uses pattern information of a sub-island to determine a laser light scanning path on a substrate so that at least the sub-island is irradiated with laser light. In other words, the present invention runs laser light so as to obtain at least the minimum degree of crystallization of a portion that has to be crystallized, instead of irradiating the entire substrate with laser light. With the above structure, time for laser irradiation of other portions than a sub-island can be saved to shorten the whole laser irradiation time and improve the substrate processing speed. The above structure also makes it possible to avoid damage to a substrate which is caused by irradiating a portion that does not need laser irradiation with laser light.

In the present invention, a marker may be formed in advance on a substrate by laser light or the like, or a marker and a sub-island may be formed at the same time. By forming a marker and a sub-island simultaneously, one less marker mask is needed and the marker can be positioned more accurately than when forming it by laser light to thereby improve the positioning accuracy. The present invention uses the marker as the reference and determines the laser light scanning position based on pattern information of the sub-island.

The present invention sets intentionally the laser light scanning direction such that, as the beam spot reaches a sub-island while the substrate is scanned with laser light, one point of the beam spot comes into contact with the sub-island viewed from the direction perpendicular to the substrate. For example, if a sub-island has a polygonal shape when viewed from above the substrate, laser light first runs in a manner that brings the beam spot into contact with one corner of the sub-island. If a part or the entire length of a sub-island is curved when viewed from above the substrate, the laser light scanning direction is determined such that one point of the beam spot comes into contact with the curved portion of the sub-island first. Laser light irradiation is started from the one contact point to commence growth of crystals having <100> orientation from the contact point and the vicinity thereof. The laser light scanning is continued until irradiation of the sub-island with laser light is finished. As a result, the <100> orientation ratio of the entire sub-island is improved.

When an island with a high <100> orientation ratio is used for an active layer of a TFT, the TFT can have high mobility. An active layer having a high <100> orientation ratio can reduce fluctuation in film quality of a gate insulating film formed thereon and accordingly can reduce fluctuation in TFT threshold voltage.

When a sub-island is irradiated with laser light, microcrystals are undesirably formed in the vicinity of edges of the sub-island viewed from above the substrate. For instance, a large number of microcrystals having a grain size of less than 0.1 μm are found in the vicinity of edges of a sub-island irradiated with a pulse oscillation excimer laser light, although it depends on the thickness of a semiconductor film, and the grain sizes of the microcrystals are smaller than the grain sizes of crystals formed in the center of the sub-island. This is supposedly because heat by laser light diffuses to the substrate differently in the vicinity of edges and in the center.

Therefore, the present invention removes, after laser light crystallization, portions in the vicinity of edges that have poor crystallinity by patterning and uses the center of the sub-island that has better crystallinity to form an island. Which part of a sub-island is to be removed by patterning to form an island can be appropriately determined at designer's discretion. The crystallinity of an island can be enhanced more by crystallizing a sub-island with laser light and then forming an island in this way instead of directly crystallizing an island with laser light.

Furthermore, the present invention uses a slit to cut off a portion of a beam spot that is low in energy density. The use of a slit allows a sub-island to receive irradiation by laser light of relatively uniform laser energy density and the sub-island can be crystallized uniformly. Providing a slit also makes it possible to change the width of a part of a beam spot in accordance with pattern information of a sub-island. This reduces restrictions in layout of a sub-island and an active layer of a TFT as well. The beam spot width means the length of a beam spot in the direction perpendicular to the scanning direction.

Shapes of beam spots that can be used in the present invention include an ellipse, a rectangle, a line, and others.

One beam spot obtained by synthesizing laser lights that are emitted from plural laser oscillation apparatuses may be used in laser crystallization. This structure allows low energy density portions of laser lights to compensate one another.

After a semiconductor film is formed, or after a sub-island is formed, the semiconductor film may be crystallized by laser light irradiation without exposing the film to the air (rare gas, nitrogen, oxygen, or other specific gas atmosphere or a reduced pressure atmosphere is employed). This structure can prevent molecule-level contaminants in a clean room, such as boron contained in a filter for enhancing the cleanliness of air, from mixing in the semiconductor film during laser light crystallization.

BRIEF DESCRIPTION OF THE DRAWINGS

In the accompanying drawings:

FIGS. 3A and 3B are diagrams showing the energy density distribution of a laser beam;

FIGS. 17A to 17D are diagrams each showing an optical system of laser irradiation apparatus;

FIGS. 22A to 22C are diagrams showing how beam spots are overlapped;

FIGS. 25A to 25C are diagrams showing a method of manufacturing a semiconductor device which uses a laser irradiation method of the present invention;

DETAILED DESCRIPTION OF THE PREFERRED EMBODIMENTS

Embodiment Mode

Descriptions will be given below on a laser irradiation method and semiconductor device manufacturing method of the present invention with reference to FIGS. 1A to 1D.

Figure 1A:
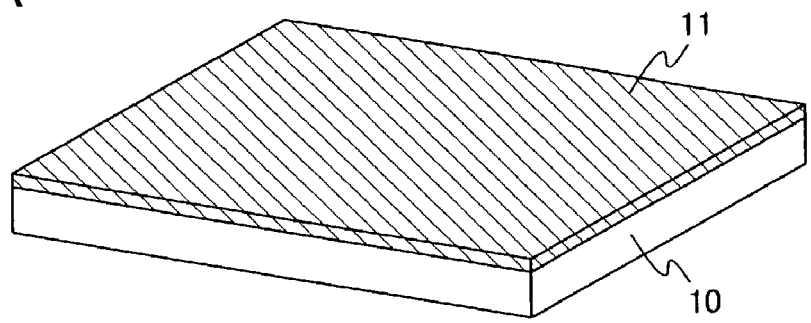
FIGS. 1A to 1D are diagrams showing a laser irradiation method of the present invention.

First, as shown in FIG. 1A, a semiconductor film 11 is formed on a substrate 10. The substrate 10 can be any material as long as it can withstand the processing temperature in later steps. For example, a quartz substrate, silicon substrate, glass substrate, metal substrate, or stainless steel substrate with an insulating film formed on its surface can be employed. The glass substrate is formed of barium borosilicate glass, aluminoborosilicate glass, or the like. A plastic substrate may also be employed if it has enough heat resistance to withstand the processing temperature.

An insulating film is formed between the substrate 10 and the semiconductor film 11 to serve as a base film for preventing an alkaline metal or other impurities contained in the substrate 10 from entering the semiconductor film 11.

The semiconductor film 11 can be formed by a known method (sputtering, LPCVD, plasma CVD, or the like). The semiconductor film may be an amorphous semiconductor film, a microcrystalline semiconductor film, or a crystalline semiconductor film.

Figure 1B:
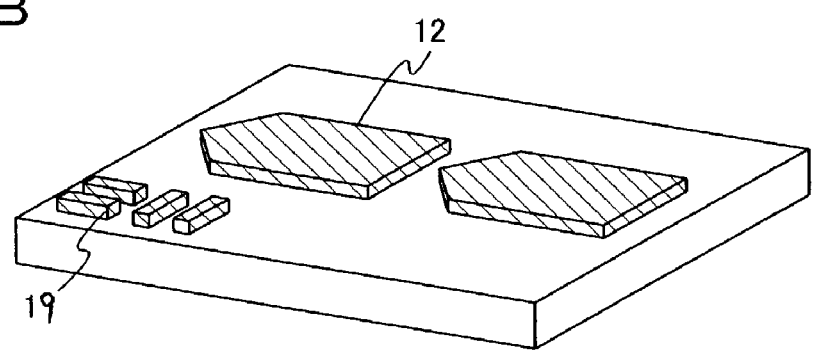

Next, the semiconductor film 11 is patterned as shown in FIG. 1B to form a sub-island (before laser crystallization (Pre-LC)) 12 and a marker 19. The shape of the marker is not limited to the one shown in FIG. 1B.

Figure 1C:
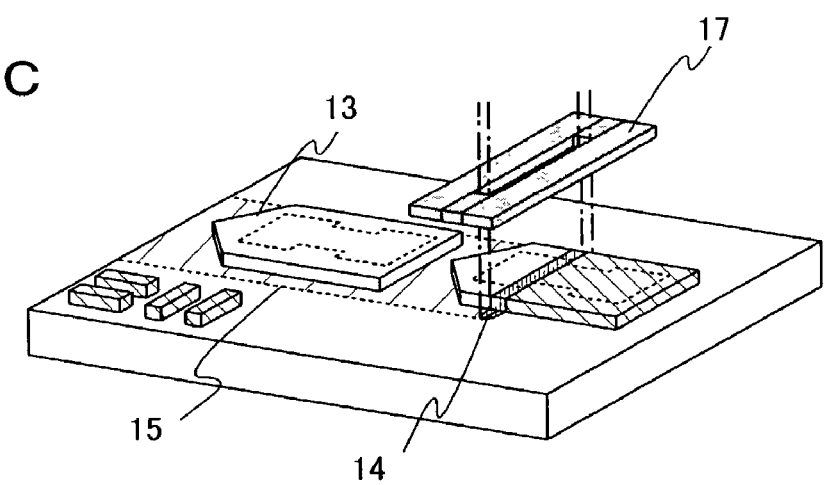

The sub-island (Pre-LC) 12 is then irradiated with laser light as shown in FIG. 1C to form a sub-island (Post-LC) 13 with enhanced crystallinity. In the present invention, a portion of a beam spot that is low in energy density is cut off by a slit 17. The slit 17 is desirably formed of a material that can block laser light and is not deformed or damaged by laser light. The width of the slit in the slit 17 is variable and a beam spot can be changed in width by changing the width of the slit.

A laser beam is judged as being low in energy density when it does not meet the value necessary to obtain desired crystals. Whether a crystal qualifies as a desired crystal or not is appropriately decided at designer's discretion. Therefore, if a laser beam cannot provide the crystallinity that the designer wants, the laser beam is judged as being low in energy density.

The laser light energy density is lower in the vicinity of edges of a beam spot that has passed through the slit. The vicinity of edges therefore can only provide small crystal grains and causes a ridge along the grain boundary. For that reason, edges 15 of the track of a beam spot 14 of laser light has to be prevented from overlapping the sub-island (Pre-LC) 12 or an island formed after the sub-island.

The laser light scanning direction is determined such that, as the beam spot reaches the sub-island during laser light scanning, one point of the beam spot comes into contact with the sub-island viewed from the direction perpendicular to the substrate. Laser light irradiation is started from the one contact point to commence growth of crystals having <100> orientation from the vicinity of the contact point. When irradiation of the sub-island with laser light is finished, the <100> orientation ratio of the entire sub-island is now improved.

The present invention can employ known lasers. A pulse oscillation or continuous wave gas laser or solid-state laser may be employed. Examples of the gas laser include an excimer laser, an Ar laser, and a Kr laser. Examples of the solid-state laser include a YAG laser, a $YVO_4$ laser, a YLF laser, a $YAlO_3$ laser, a glass laser, a ruby laser, an alexandrite laser, a Ti: sapphire laser, and a $Y_2O_3$ laser. The solid-state laser employed is a laser that uses crystals of YAG, $YVO_4$, YLF, $YAlO_3$ or the like doped with Cr, Nd, Er, Ho, Ce, Co, Ti, Yb, or Tm. The fundamental wave of the laser is varied depending on the material used for doping but laser light obtained has a fundamental wave of about 1 μm. A non-linear optical element is used to obtain harmonic of the fundamental wave.

Ultraviolet laser light may also be employed. The ultraviolet laser light is obtained by using a non-linear optical element to convert infrared laser light that is emitted from a solid-state laser into green laser light and then using another non-linear optical element to convert the green laser light.

The marker 19 may not be irradiated with laser light.

Figure 1D:
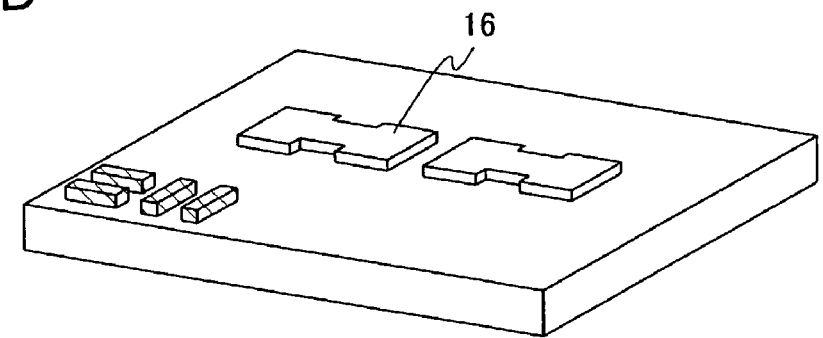

Next, the sub-island (Post-LC) 13 is patterned as shown in FIG. 1D to form an island 16. Desirably, a portion at the center of the sub-island that has better crystallinity is used to form the island 16 while discarding the vicinity of edges of the sub-island. The marker 19 is not removed by the patterning but is left for mask positioning in a later step.

The island 16 formed through the above steps has excellent crystallinity as well as enhanced <100> orientation ratio.

The description given next is about the shape of a beam spot synthesized by overlapping plural beam spots.

Figure 4A:
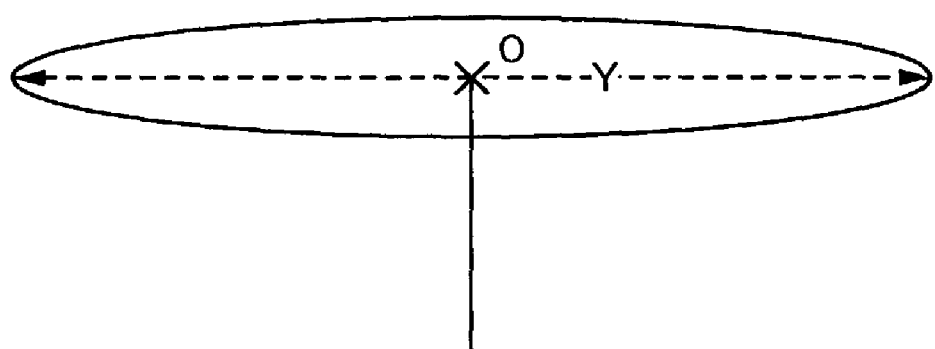
FIGS. 4A and 4B are diagrams showing the shape and energy density distribution of a laser beam.

FIG. 4A shows an example of the beam spot shape on a processing object when laser light emitted from plural laser oscillation apparatuses does not pass through a slit. The beam spot shown in FIG. 4A has an elliptical shape. In the present invention, the beam spot shape of laser light emitted from laser oscillation apparatus is not limited to an ellipse. The beam spot shape is varied depending on the laser type and may be shaped by an optical system. For instance, the shape of laser light emitted from the XeCl excimer laser (wavelength: 308 nm, pulse width: 30 ns) L3308, a product of Lambda Physik, is a 10 mm×30 mm (each is half width in beam profile) rectangle. The shape of laser light emitted from a YAG laser is circular if the rod is cylindrical and is rectangular if the rod is slab-like. Such laser light may be further shaped by an optical system to give the laser light a desired size.

Figure 4B:
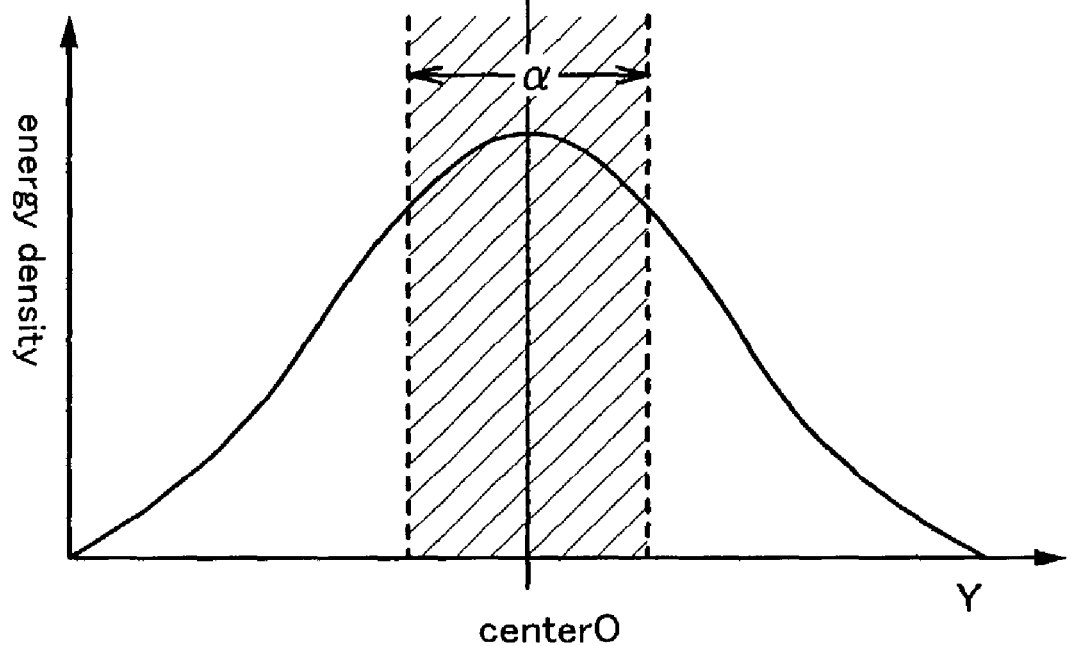

FIG. 4B shows the energy density distribution of laser light in the direction of a major axis Y of the beam spot shown in FIG. 4A. The energy density distribution of laser light whose beam spot has an elliptical shape becomes higher toward a center O of the ellipse. α corresponds to the width in the direction of a major axis Y where the energy density exceeds the value necessary to obtain desired crystals.

Figure 2A:
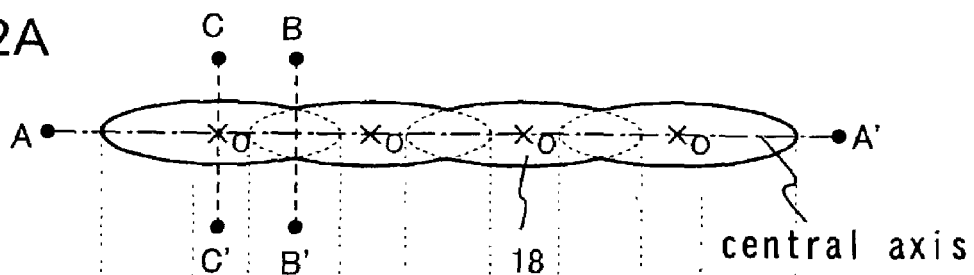
FIGS. 2A to 2D are diagrams showing a shape and energy density distribution of a laser beam.

FIG. 2A shows the beam spot shape of when laser light that have the beam spot shown in FIGS. 4A and 4B are synthesized. In the case shown in FIG. 2A, one linear beam spot is formed by overlapping four laser beam spots. However, the number of beam spots overlapped is not limited thereto.

As shown in FIG. 2A, the beam spots of the laser beams are synthesized by lining the ellipses up along their major axes to have them partially overlapped with one another. One beam spot 18 is thus formed. Hereinafter, the straight line obtained by connecting centers O of the ellipses will be called a central axis.

Figure 2B:
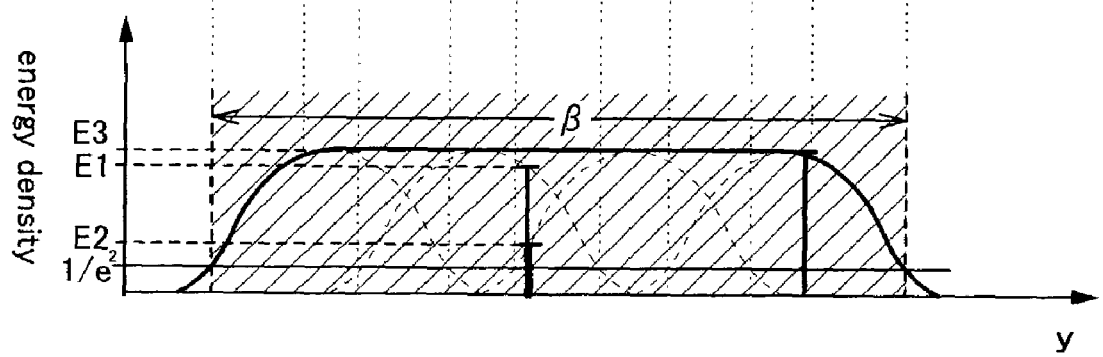

FIG. 2B shows the laser light energy density distribution in a central axis y of the synthesized beam spot shown in FIG. 2A. The beam spot shown in FIG. 2A corresponds to a region that meets the peak energy density $1/e^2$ in FIG. 2B. In the portions where the beam spots before synthesization overlap one another, the energy density is added. For instance, as shown in the drawing, energy densities E1 and E2 of the overlapping beams are added and the sum is almost equal to the peak energy density of the beam, E3. The energy density is thus evened out between the centers O of the ellipses.

The sum of E1 and E2 is ideally E3 but this is not always true in practice. The acceptable deviation of the sum of E1 and E2 from E3 can be set appropriately at designer's discretion.

As FIG. 2B shows, the crystallinity of a semiconductor film can be enhanced more efficiently when plural laser beams are overlapped to compensate one another's low energy density portions than when using a single laser beam. Assume that the energy density value necessary to obtain desired crystals is met only in the hatched regions of FIG. 1B and not in the rest as a result of irradiation by a single beam spot. In this case, only a hatched region of the beam spot whose width in the central axis direction is α can provide desired crystals. If beam spots are overlapped instead as shown in FIG. 2B, a region whose width in the central axis direction is β (β>4α) can provide desired crystals and a semiconductor film can be crystallized more efficiently.

The energy density distributions in B–B' and C–C' of FIG. 2A are calculated and shown in FIGS. 3A and 3B, respectively. In FIGS. 3A and 3B, regions of beam spots before synthesization where the peak energy density $1/e^2$ is met are used as the reference. The energy density distributions in B–B' and C–C' shown in FIGS. 3A and 3B are of when each beam spot before synthesization measures 37 μm in length in the minor axis direction and 410 μm in length in the major axis direction and the distance between centers of the beam spots is set to 192 μm. Although the distribution in B-B' is slightly smaller than the distribution in C–C', the two have almost the same size. Therefore, it can be said that the shape of the synthesized beam spot is linear in the regions of the beam spots before synthesization where the peak energy density $1/e^2$ is met.

There are regions where the energy density fails to meet the desired value even after laser beams are overlapped. The present invention uses the slit 17 to cut off the low energy density regions of the synthesized beam spot and prevents them from irradiating the semiconductor film 11. The positional relation between the synthesized beam spot and the slit is described with reference to FIG. 2C.

Figure 2C:
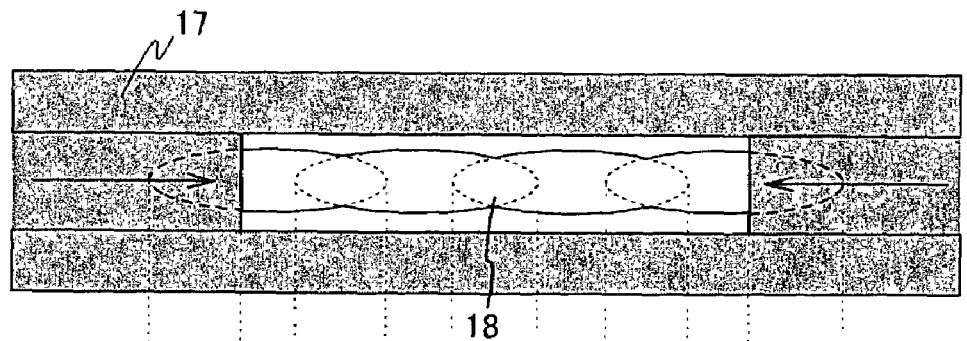

The slit 17 used in the present invention has a slit variable in width and the width is controlled by a computer. In FIG. 2C, 18 denotes the shape of the beam spot 18 obtained by synthesization as the one shown in FIG. 2A and 17 denotes the slit.

Figure 2D:
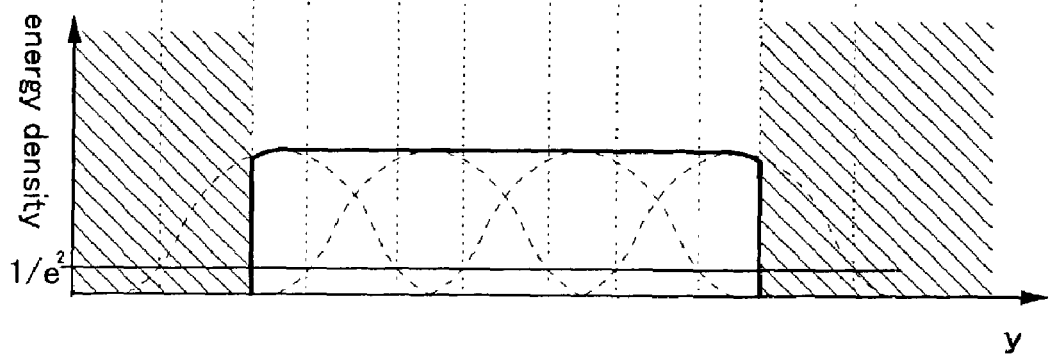

FIG. 2D shows the energy density distribution in a direction y that is the direction of the central axis A–A' of the beam spot shown in FIG. 2B. Unlike the case shown in FIG. 3B, regions low in energy density are cut off by the slit 17.

Figure 5A:
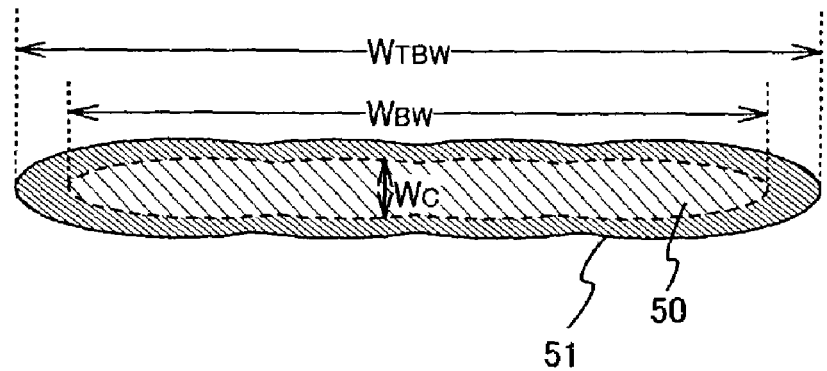
FIGS. 5A and 5B are diagrams showing the laser beam shape and a positional relation between the laser beam and a sub-island.

A semiconductor film irradiated with a region of laser light that is low in energy density has poor crystallinity. Specifically, crystal grains of such film are smaller in size than ones in a film irradiated with a laser light region having enough energy density and the crystal grains grow in different directions. FIG. 5A shows the shape of a synthesized beam spot on a substrate. In a region denoted by 50, a desired energy density is met. A region denoted by 51 does not meet the desired energy density. The length in the central axis direction of the beam spot is given as $W_{TBW}$, the length in the central axis direction of the region having enough energy density is given as $W_{BW}$, and the length in the direction perpendicular to the central axis direction of the region having enough energy density is given as $W_C$.

Figure 5B:
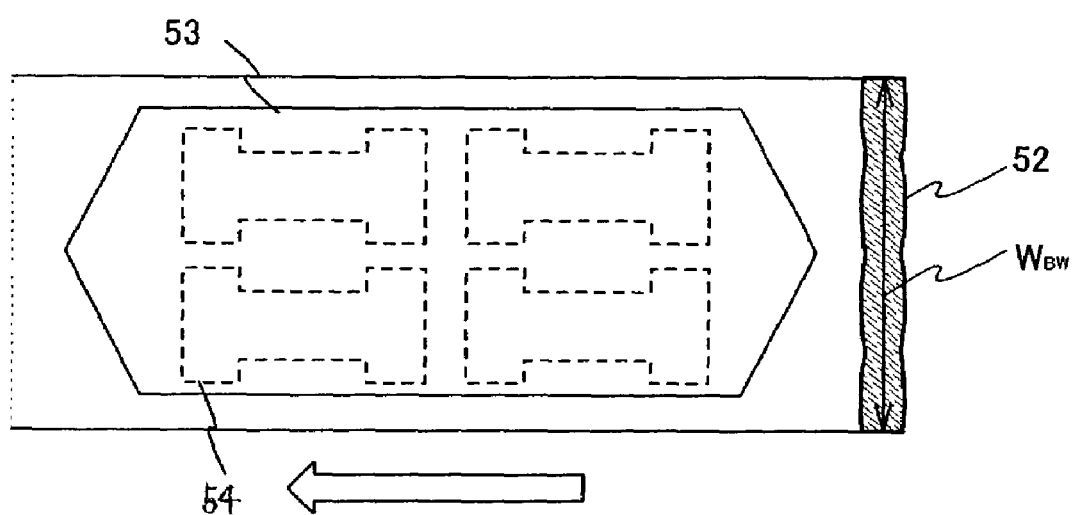

FIG. 5B shows the positional relation between the scanning path of a beam spot 52 and a sub-island pattern. The length in the central axis direction of the beam spot 52 is set equal to or less than $W_{BW}$ by making the beam spot shown in FIG. 5A travel through a slit. FIG. 5B shows scanning by the beam spot 52 whose low energy density portions are cut off widthwise in the direction perpendicular to the scanning direction. The beam spot 52 runs so as to cover a sub-island 53 and edges of the track of the beam spot does not overlap the sub-island 53. It is not always necessary to prevent the edges of the track of the beam spot from overlapping the sub-island. What is important is to prevent the edges from overlapping an island 54 that is obtained through the minimum patterning of the sub-island.

In the present invention, there is no low energy density region, or if there is any, the width thereof is smaller than in the case where a slit is not used. This makes it easier to avoid overlapping of laser light edges and the sub-island 53. By using a slit, regions low in energy density are cut off and therefore limitations in setting the laser light scanning path and layout of a sub-island and island can be reduced.

Also the present invention can prevent laser light edges from overlapping an island or its channel formation region because the beam spot width can be changed without stopping output of laser oscillation apparatus while keeping the energy density constant. A portion that does not need laser irradiation is not irradiated with laser light and therefore damage to the substrate can be avoided.

In the case shown in FIGS. 5A and 5B, the central axis direction of the beam spot is kept perpendicular to the scanning direction. However, it is not always necessary to set the central axis direction of the beam spot perpendicular to the scanning direction. For example, an acute angle $\theta_A$ formed between the central axis direction of the beam spot and the scanning direction may be set to 45°±35°, desirably 45°. The substrate processing efficiency is the highest when the central axis of a beam spot is perpendicular to the scanning direction. On the other hand, when the central axis of a synthesized beam spot and the scanning direction form an angle of 45°±35°, desirably closer to 45°, crystal grains present in the active layer can be increased in number than when the central axis of the beam spot is perpendicular to the scanning direction. Accordingly, fluctuation in characteristic due to crystal orientation and crystal grains can be reduced. In addition, if the scanning speed is the same, the laser light irradiation time per substrate is longer when the central axis of a synthesized beam spot and the scanning direction form an angle of 45°±35° than when the central axis of the beam spot is perpendicular to the scanning direction.

Figure 6A:
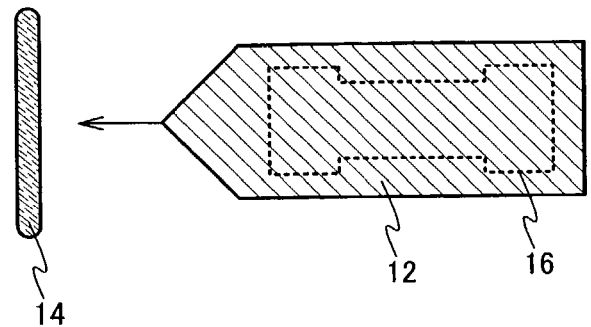
FIGS. 6A to 6D are diagrams showing the positional relation between a portion irradiated with laser light and a mask.
Figure 6B:
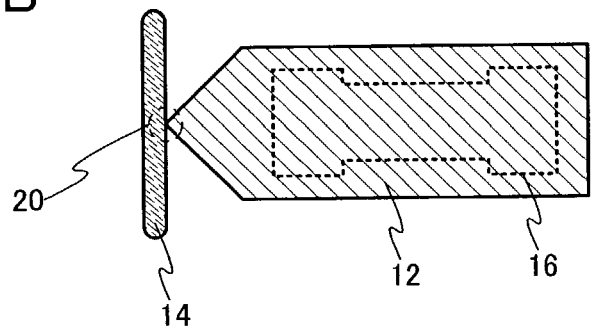

Next, a description is given on the relation between the shapes of a sub-island and island and the laser light scanning direction. FIG. 6A is a top view of the sub-island 12 shown in FIG. 1B. A portion 16 to be an island is indicated by a dashed line inside the sub-island (Pre-LC) 12. Denoted by 14 is a beam spot, which in FIG. 6A is in a state before laser irradiation.

From the state in FIG. 6A, the beam spot 14 approaches the sub-island (Pre-LC) 12 as time passes. The position of the beam spot is changed by moving the substrate.

Figure 6C:
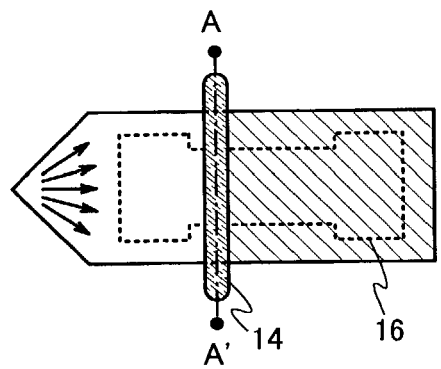

As the beam spot 14 reaches the sub-island (Pre-LC) 12, one point of the beam spot 14 comes into contact with the sub-island (Pre-LC) 12. Crystallization of the sub-island begins from the vicinity of this contact point, which is denoted by 20, and the crystallization proceeds in the direction indicated by the arrow as the beam spot 14 moves as shown in FIG. 6C. Since the crystallization starts from a seed crystal formed in the contact point vicinity 20 first, the <110> orientation ratio is raised.

When the island is used as an active layer of a TFT, the laser light scanning direction is desirably kept parallel to the direction in which carriers of a channel formation region move.

The track of the beam spot 14 may not completely cover the sub-island 12, and it only has to cover the island 16 completely. However, by running laser light so as to completely cover the sub-island, a region that is not irradiated with laser light is prevented from working as a seed crystal for crystal growth and the <110> orientation ratio can be enhanced more.

Figure 6D:
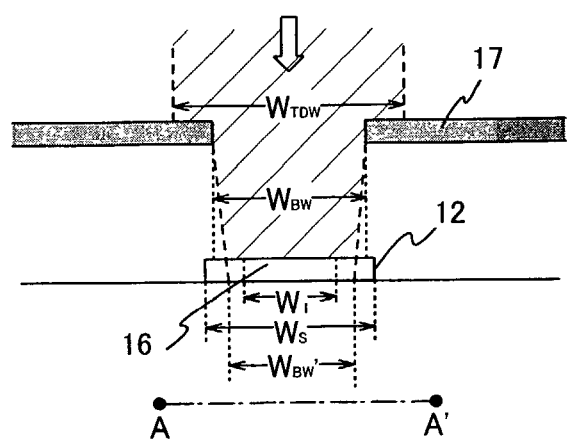

FIG. 6D shows a sectional view taken along the line A–A' of FIG. 6C in relation to the beam spot. Laser light that has passed through the slit 17 to irradiate the substrate is partially blocked by the slit and its width $W_{TDW}$ in the major axis direction is reduced to $W_{BW}$. Then, ideally, the beam spot of the laser light on the sub-island becomes equal in width with $W_{BW}$. However, the slit 17 is actually distanced from the sub-island 12 and therefore the actual width in the major axis direction of the beam spot of the laser light is $W_{BW}'$ on the sub-island 12. $W_{BW}'$ is smaller than $W_{BW}$. ($W_{BW}' < W_{BW}$). Therefore, it is desirable to set the slit width taking diffraction into consideration.

In irradiating the entire sub-island with laser light, it is sufficient if $W_{BW} > W_S$ is satisfied when diffraction is not taken into account and $W_{BW}' > W_S$ is satisfied when diffraction is taken into account. In the minimum laser irradiation for irradiating the island alone, it is sufficient if $W_{BW} > W_I$ is satisfied when diffraction is not taken into account and $W_{BW}' > W_I$ is satisfied when diffraction is taken into account. $W_S$ is the longest length of the sub-island 12 in the direction perpendicular to the moving direction of the beam spot. $W_I$ represents the longest length of the island 16 in the direction perpendicular to the moving direction of the beam spot.

Figure 7A:
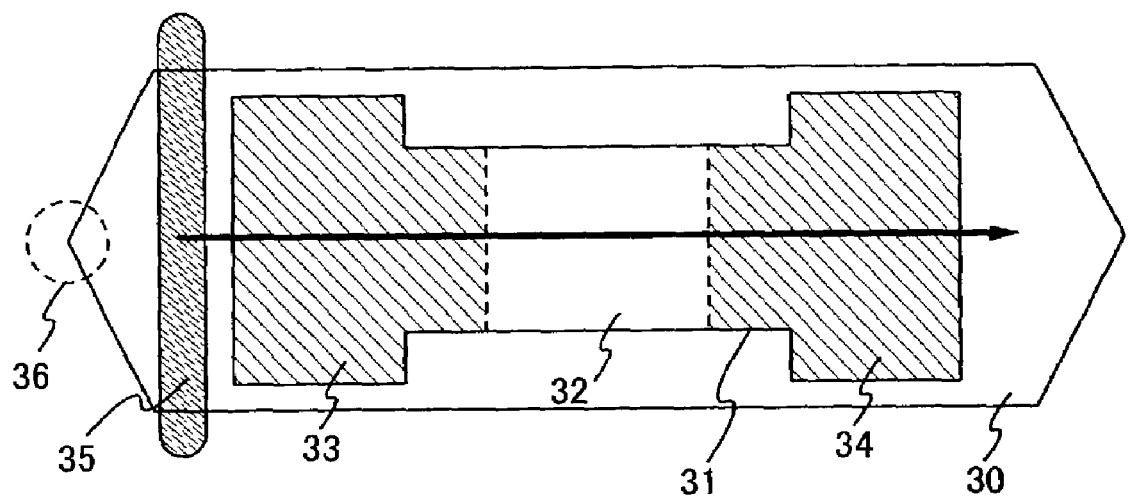
FIGS. 7A and 7B are diagrams showing the positional relation between a portion irradiated with laser light and a mask.
Figure 7B:
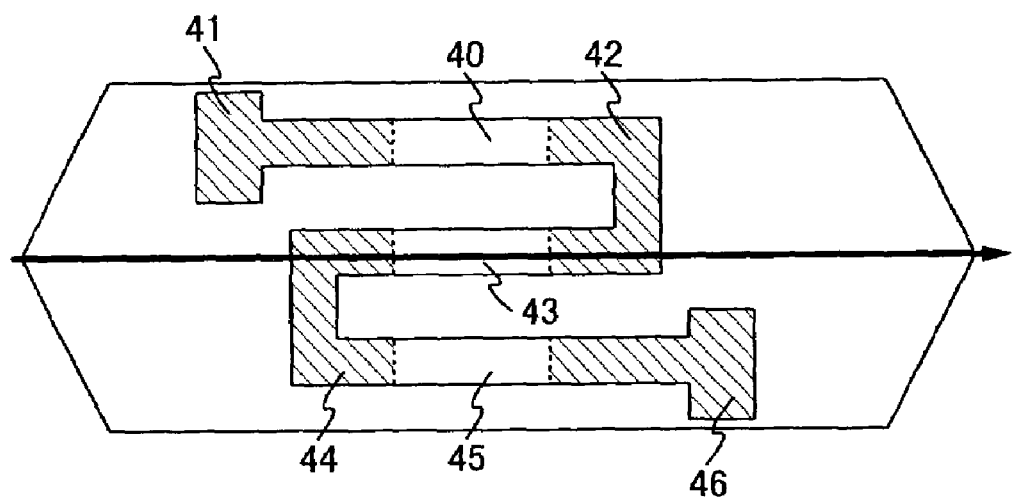

FIGS. 7A and 7B show examples of layout of an island used as an active layer of a TFT in relation to the moving direction of a beam spot. In FIG. 7A, a portion 31 indicated by the dashed line inside a sub-island 30 becomes an island. When the island 31 is used as an active layer of a TFT which has one channel formation region, impurity regions 33 and 34 are provided so as to sandwich a channel formation region 32. One of the impurity regions 33 and 34 serves as a source region and the other serves as a drain region. The reference numeral 35 shows the shape of the beam spot. In crystallizing the sub-island 30, the laser light scanning direction is set parallel to the direction in which carriers of the channel formation region 32 move as indicated by the arrow. One point of the beam spot 35 is in contact with the sub-island. A seed crystal is formed in the vicinity of the contact point, which is denoted by 36, and crystals grow from the seed crystal. The <110> orientation ratio of the sub-island is thus enhanced.

FIG. 7B shows an active layer having three channel formation regions. Impurity regions 41 and 42 are provided so as to sandwich a channel formation region 40. The impurity region 42 and an impurity region 44 are provided so as to sandwich a channel formation region 43. The impurity region 44 and an impurity region 46 are provided so as to sandwich a channel formation region 45. The beam spot runs in parallel to the direction in which carriers of the channel formation regions 40, 43, and 45 move as indicated by the arrow.

Figure 8A:
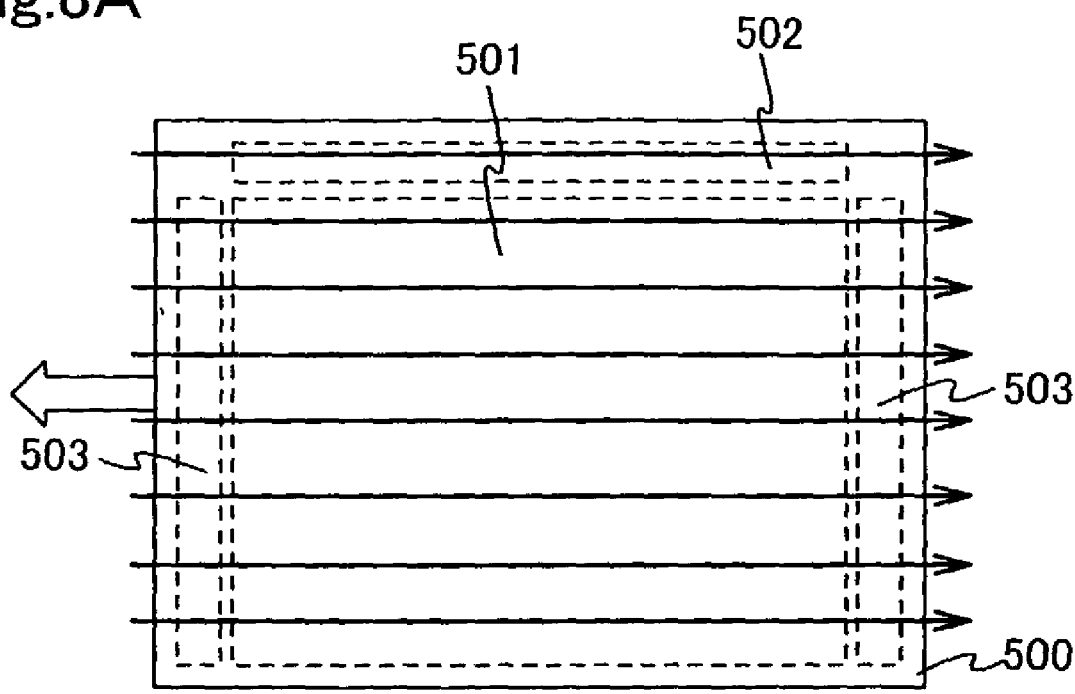
FIGS. 8A and 8B are diagrams showing the positional relation between a laser light moving direction on a processing object and a mask.

Described next with reference to FIG. 8A is the laser light scanning direction on a substrate 500 where a sub-island is formed to manufacture an active matrix semiconductor device. In FIG. 8A, a pixel portion, a signal line driving circuit, and a scanning line driving circuit are formed in the areas indicated by dashed lines 501, 502, and 503, respectively.

Figure 8B:
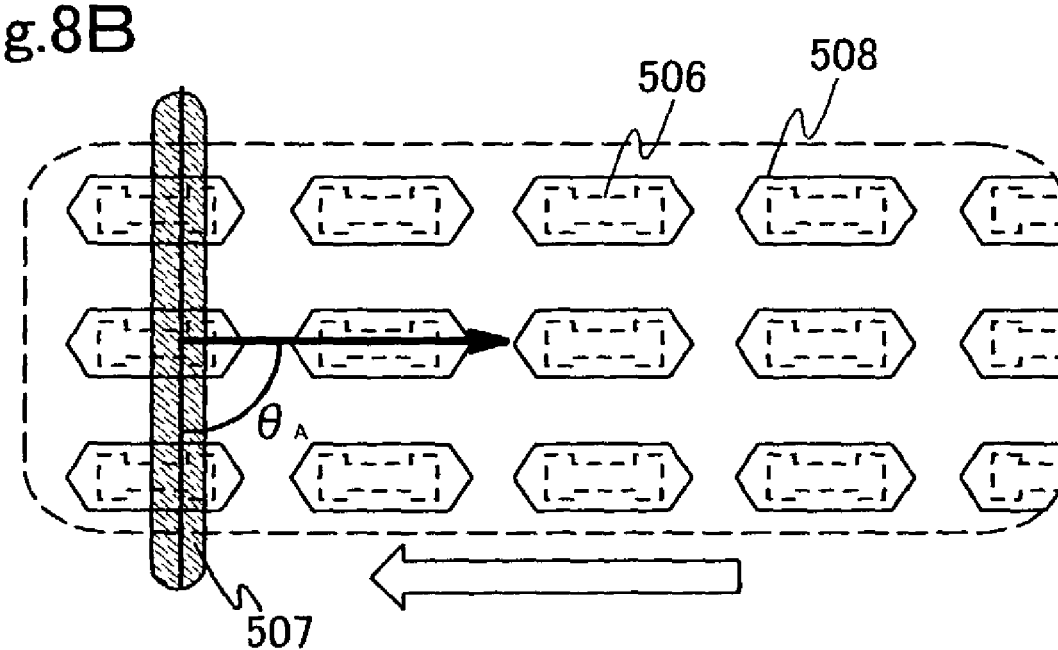

In the example shown in FIG. 8A, laser light runs over the substrate 500 only once. The substrate moves in the direction indicated by the outlined arrow and the solid line arrow indicates the relative laser light scanning direction. The beam spot may be moved by moving the substrate 500 or by using an optical system. FIG. 8B is an enlarged view of a beam spot 507 in the area 501 where the pixel portion is to be formed. Sub-islands 506 are laid out in a region irradiated with laser light.

It is desirable in FIGS. 8A and 8B to irradiate the substrate with laser light so as to prevent edges of the beam spot from overlapping islands 508, more desirably, the sub-islands 506. The islands 508 are obtained by patterning the sub-islands. In the present invention, which portion is to be scanned with laser light is determined in accordance with pattern information of a mask of a sub-island.

Figure 9A:
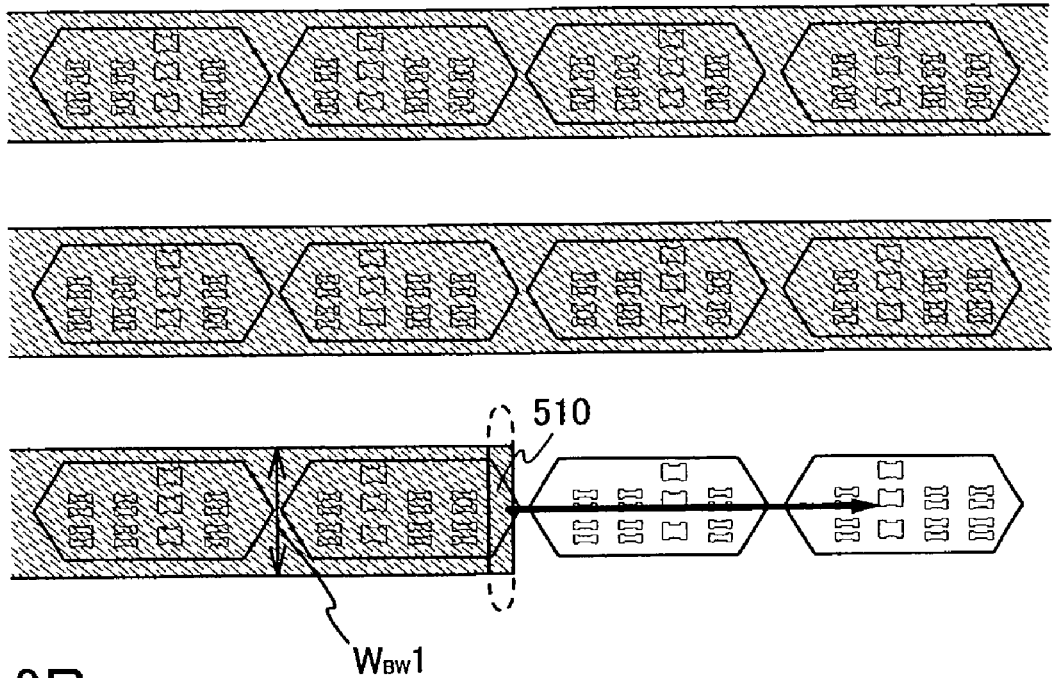
FIGS. 9A and 9B are diagrams showing the positional relation between a portion irradiated with laser light and a mask.
Figure 9B:
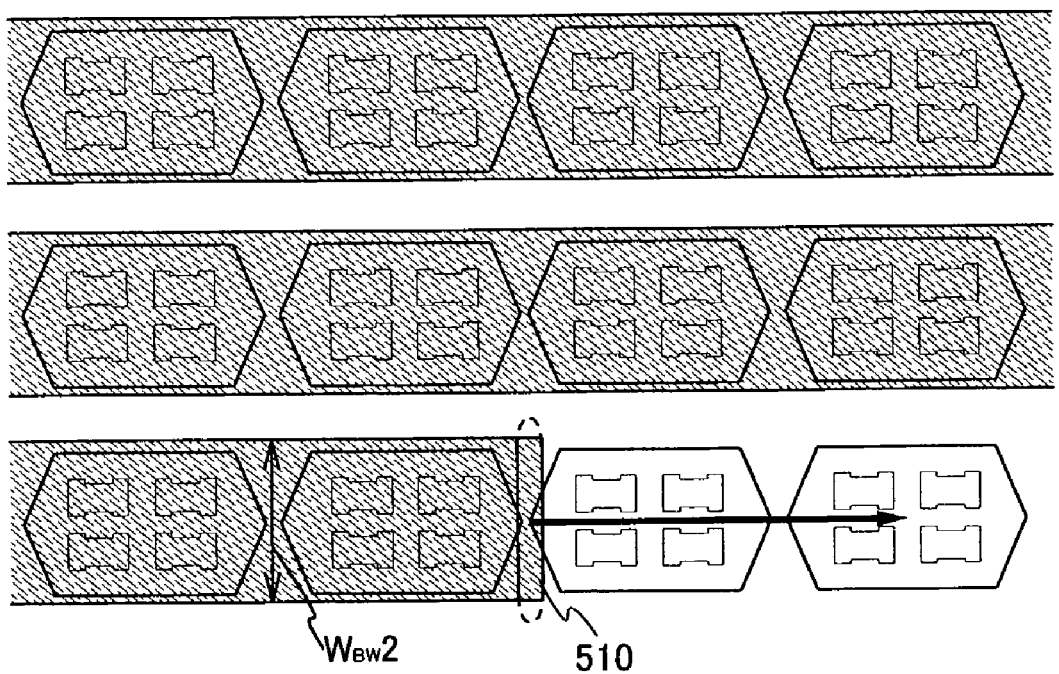

The beam spot width can be changed to suite the size of a sub-island or island. For example, in a TFT of a driving circuit where a relatively large amount of current flows, the channel width is large and accordingly the island size tends to be larger than in a pixel portion. In FIGS. 9A and 9B, the slit width is changed to run laser light over two types of sub-islands having different sizes. FIG. 9A shows the relation between a portion scanned with laser light and a sub-island when the sub-island is shorter in the direction perpendicular to the scanning direction. FIG. 9B shows the relation between a portion scanned with laser light and a sub-island when the sub-island is longer in the direction perpendicular to the scanning direction.

When the beam spot width in FIG. 9A is given as $W_{BW1}$ and the beam spot width in FIG. 9B is given as $W_{BW2}$, $W_{BW1}$ is smaller than $W_{BW2}$. The beam spot width is not limited thereto and can be set freely if there is a margin in the gap between sub-islands in the direction perpendicular to the scanning direction.

The present invention runs laser light so as to obtain the minimum degree of crystallization of a sub-island as shown in FIGS. 9A and 9B, instead of irradiating the entire surface of the substrate with laser light. Since the minimum portion is irradiated with laser light so that a sub-island is crystallized instead of irradiating the entire surface of a substrate, the processing time per substrate can be reduced to raise the substrate processing efficiency.

Figure 10:
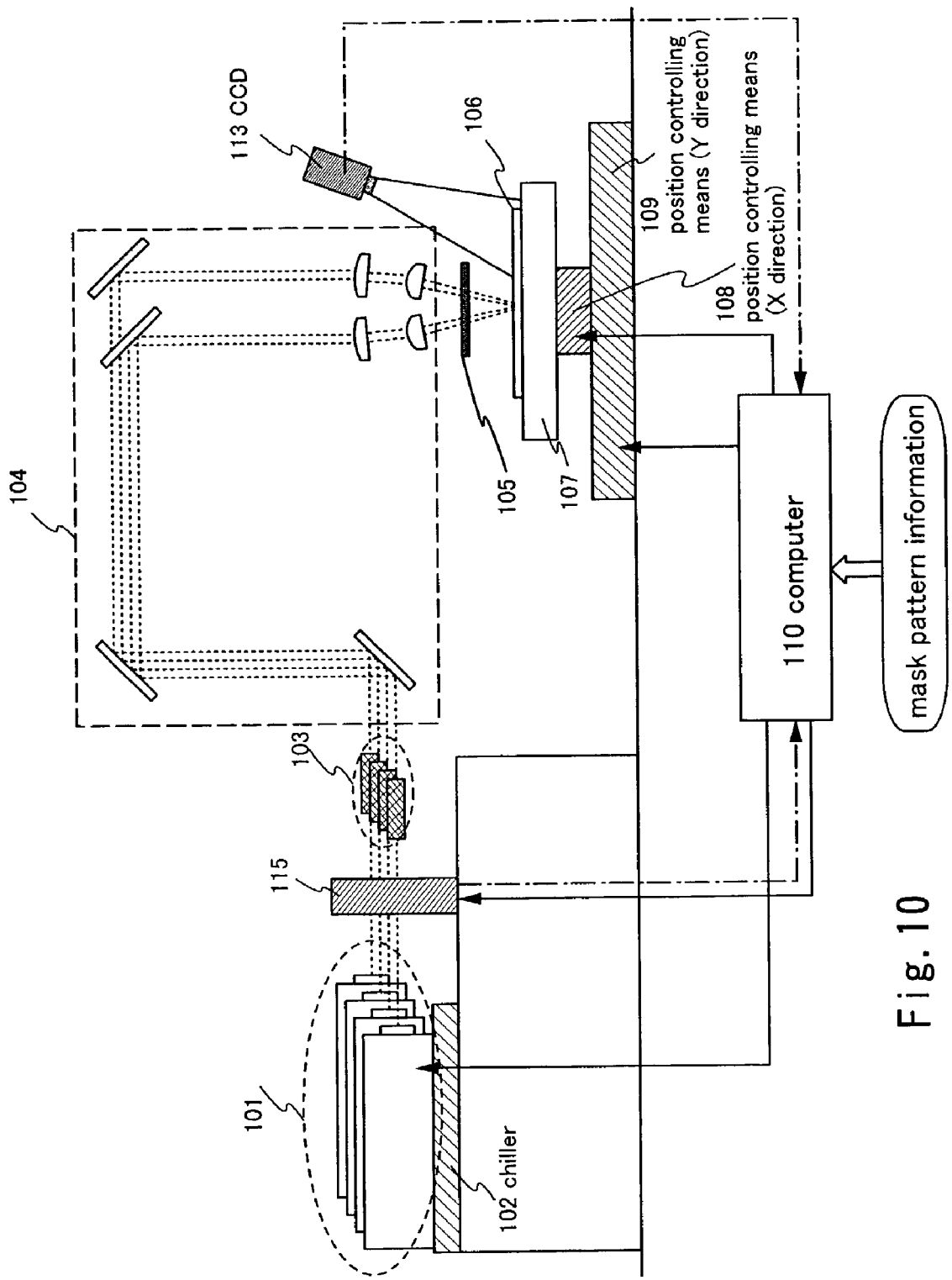
FIG. 10 is a diagram of a laser irradiation apparatus.

Next, a description is given with reference to FIG. 10 on the structure of laser irradiation apparatus used in the present invention. The reference numeral 101 denotes a laser oscillation apparatus. Four laser oscillation apparatuses are used in FIG. 10 but the number of laser oscillation apparatuses in the laser irradiation apparatus is not limited thereto.

A chiller 102 may be used to keep the temperature of the laser oscillation apparatus 101 constant. Although the chiller 102 is not always necessary, fluctuation in energy of laser light outputted due to a temperature change can be avoided by keeping the temperature of the laser oscillation apparatus 101 constant.

Denoted by 104 is an optical system, which changes the path of light emitted from the laser oscillation apparatus 101 or manipulates the shape of its beam spot to collect laser light. In the laser irradiation apparatus of FIG. 10, the optical system 104 can also synthesize beam spots of laser light outputted from the plural laser oscillation apparatuses 101 by partially overlapping the beam spots.

An AO modulator 103 capable of changing the travel direction of laser light in a very short time may be provided in the light path between a substrate 106 that is a processing object and the laser oscillation apparatus 101. Instead of the AO modulator, an attenuator (light amount adjusting filter) may be provided to adjust the energy density of laser light.

Alternatively, energy density measuring means 115, namely, means for measuring the energy density of laser light outputted from the laser oscillation apparatus 101 may be provided in the light path between the substrate 106 that is a processing object and the laser oscillation apparatus 101. Changes with time of measured energy density are monitored by a computer 110. In this case, output from the laser oscillation apparatus 101 may be increased to compensate attenuation in energy density of the laser light.

A synthesized beam spot irradiates through a slit 105 the substrate 106 that is a processing object. The slit 105 is desirably formed of a material that can block laser light and is not deformed or damaged by laser light. The width of the slit in the slit 105 is variable and a beam spot can be changed in width by changing the width of the slit.

When laser light emitted from the laser oscillation apparatus does not pass through the slit 105, the shape of its beam spot on the substrate 106 is varied depending on the laser type and may be shaped by an optical system.

The substrate 106 is set on a stage 107. In FIG. 10, position controlling means 108 and 109 correspond to means for controlling the position of a beam spot on a processing object. The position of the stage 107 is controlled by the position controlling means 108 and 109.

In FIG. 10, the position controlling means 108 controls the position of the stage 107 in the direction X and the position controlling means 109 controls the position of the stage 107 in the direction Y.

The laser irradiation apparatus of FIG. 10 has the computer 110, which is a central processing unit and at the same time storing means such as a memory. The computer 110 controls oscillation of the laser oscillation apparatus 101 and controls the position controlling means 108 and 109 to move the substrate to a given position so that a beam spot of laser light covers a region determined in accordance with mask pattern information.

In the present invention, the computer 110 also controls the width of the slit 105 so that the beam spot width can be changed in accordance with mask pattern information.

The laser irradiation apparatus may also has means for adjusting the temperature of a processing object. A damper may also be provided to prevent reflected light from irradiating a portion that should avoid laser irradiation since laser light is highly directional and has high energy density. Desirably, the damper is absorptive of reflected light. Cooling water may be circulated inside the damper to avoid a temperature rise of the partition wall due to absorption of reflected light. The stage 107 may be provided with means for heating a substrate (substrate heating means).

If a laser is used to form a marker, laser oscillation apparatus for a marker may be provided. In this case, oscillation of the laser oscillation apparatus for a marker may be controlled by the computer 110. Another optical system is needed when the laser oscillation apparatus for a marker is provided in order to collect laser light outputted from the laser oscillation apparatus for a marker. The laser used to form a marker is typically a YAG laser or a $CO_2$ laser but other lasers may be employed.

One or more CCD cameras 113 may be provided for positioning using a marker.

Instead of forming a marker, the CCD camera(s) 113 may be used to recognize the pattern of a sub-island for positioning. In this case, sub-island pattern information by a mask which is inputted to the computer 110 and the actual sub-island pattern information collected by the CCD camera(s) 113 are checked against each other to obtain the substrate position information.

Figure 11:
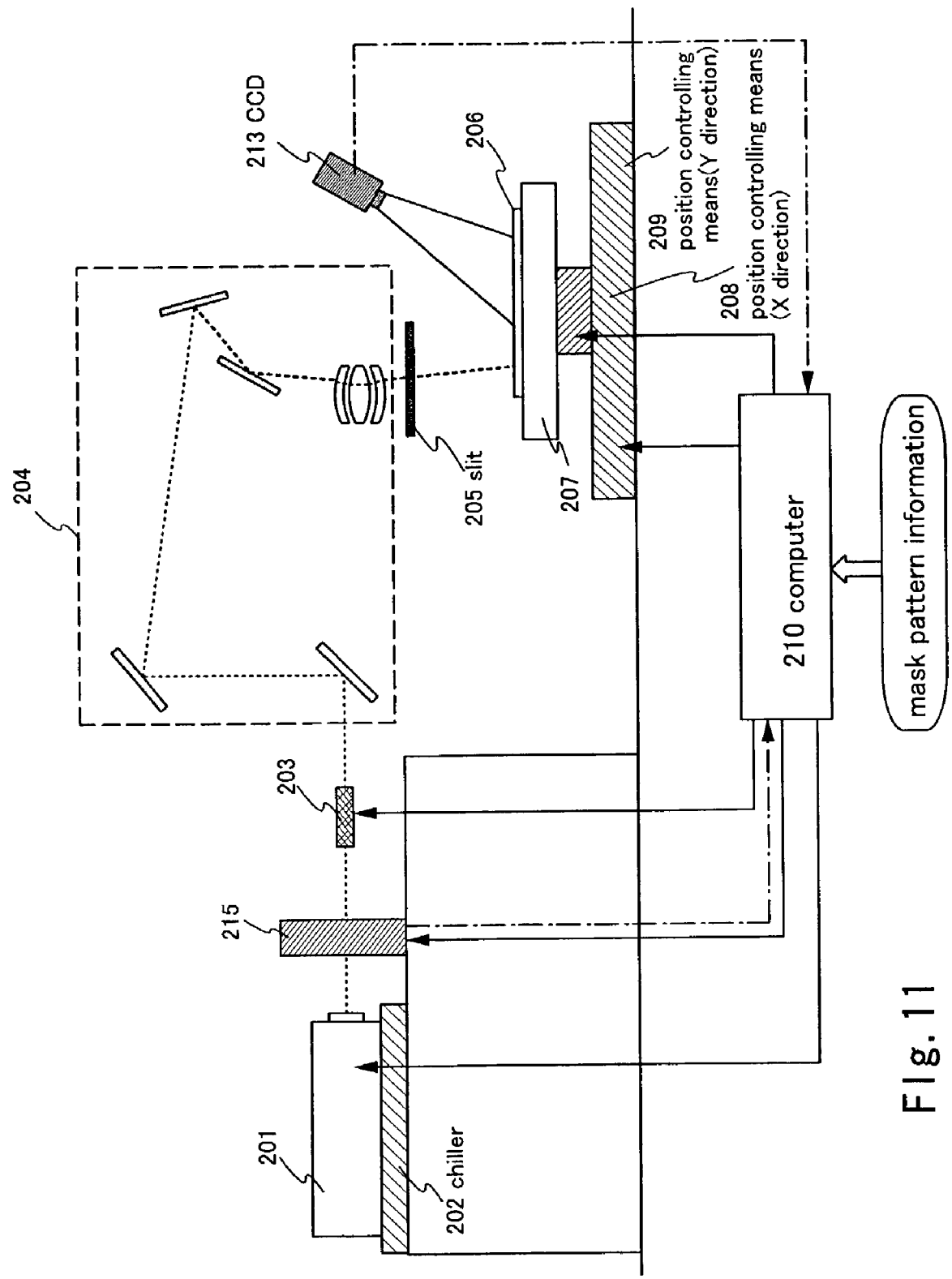
FIG. 11 is a diagram of a laser irradiation apparatus.

Although FIG. 10 shows a structure of a laser irradiation apparatus which has plural laser oscillation apparatuses, only one laser oscillation apparatus may be provided. FIG. 11 shows a laser irradiation apparatus structure which has one laser oscillation apparatus. In FIG. 11, 201 denotes a laser oscillation apparatus and 202 denotes a chiller. Denoted by 215 is an energy density measuring device, 203, an AO modulator, 204, an optical system, 205, a slit, and 213, a CCD camera. A substrate 206 is set on a stage 207. The position of the stage 207 is controlled by X-direction position controlling means 208 and Y-direction position controlling means 209. Similar to the apparatus shown in FIG. 10, a computer 210 controls operations of the respective means of this laser irradiation apparatus. The major difference between FIG. 11 and FIG. 10 is that there is one laser oscillation apparatus in FIG. 11. Unlike FIG. 10, the optical system 204 only has to have a function of collecting one laser beam.

Next, the flow of a semiconductor device manufacturing method of the present invention will be described.

Figure 12:
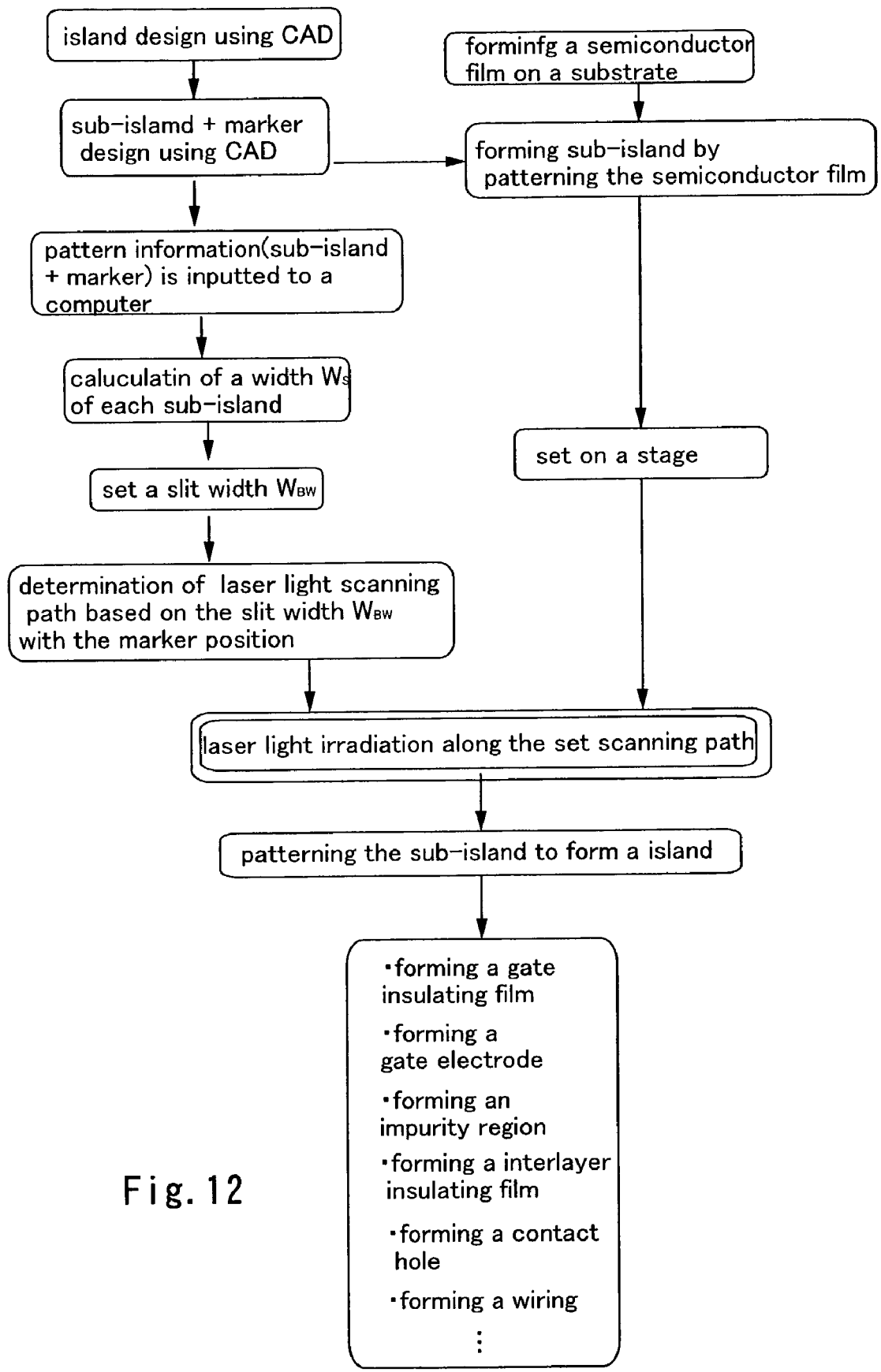
FIG. 12 is a diagram showing production flow of the present invention.

FIG. 12 is a flow chart showing production flow. First, a semiconductor device is designed using CAD. Specifically, a mask for an island is designed first and then a mask for a sub-island that includes one or more of such islands is designed. In designing the masks, all islands included in one sub-island are desirably arranged such that the carriers of their channel formation regions move in the same direction. However, the moving direction may be varied intentionally if doing so suits the use of the semiconductor device.

The mask for a sub-island may be designed such that a marker is formed at the same time the sub-island is formed.

Then, information concerning the shape of the designed mask for a sub-island (pattern information) is inputted to a computer of laser irradiation apparatus. From the sub-island pattern information inputted, the computer calculates a width $W_S$ of each sub-island in the direction perpendicular to the scanning direction. Based on the width $W_S$ of each sub-island, a slit width $W_{BW}$ in the direction perpendicular to the scanning direction is set.

Then, the laser light scanning path is determined based on the slit width $W_{BW}$ with the marker position as the reference.

During this, a semiconductor film is formed on a substrate and the semiconductor film is patterned using the mask for a sub-island to form a sub-island. The substrate on which the sub-island is formed is set on a stage of the laser irradiation apparatus.

With the marker as the reference, laser light runs along the set scanning path targeting the sub-island to crystallize the sub-island.

The sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming a gate insulating film and forming an impurity region in the island. Then, an interlayer insulating film is formed so as to cover the gate insulating film and a gate electrode. A contact hole is formed in the interlayer insulating film to partially expose the impurity region. A wiring is then formed on the interlayer insulating film to reach the impurity region through the contact hole.

Described next is an example of positioning a substrate and a mask by a CCD camera without forming a marker.

Figure 13:
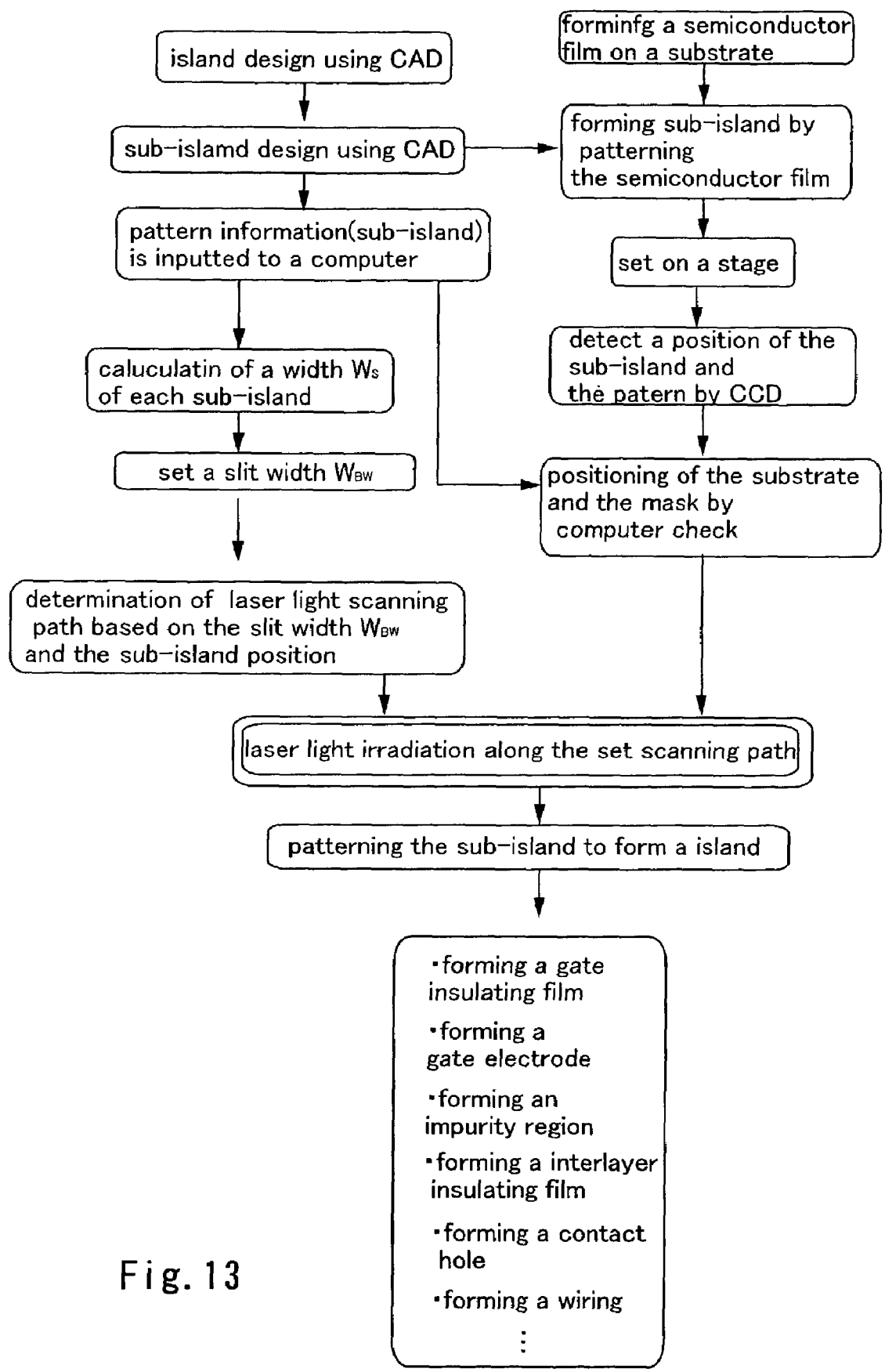
FIG. 13 is a diagram showing the production flow of the present invention.

FIG. 13 is a flow chart showing production flow. First, similar to the case of FIG. 12, a semiconductor device is designed using CAD. Specifically, a mask for an island is designed first and then a mask for a sub-island that includes one or more of such islands is designed.

Then, information concerning the shape of the designed mask for a sub-island (pattern information) is inputted to a computer of laser irradiation apparatus. From the sub-island pattern information inputted, the computer calculates a width $W_S$ of each sub-island in the direction perpendicular to the scanning direction. Based on the width $W_S$ of each sub-island, a slit width $W_{BW}$ in the direction perpendicular to the scanning direction is set.

During this, a semiconductor film is formed on a substrate and the semiconductor film is patterned using the mask for a sub-island to form a sub-island. The substrate on which the sub-island is formed is set on a stage of the laser irradiation apparatus.

Then, pattern information of the sub-island formed on the substrate that is set on the stage is detected by the CCD camera and inputted to the computer. The computer checks the pattern information of the sub-island actually formed on the substrate which is obtained by the CCD camera against the pattern information of the sub-island designed by the CAD for positioning of the substrate and the mask.

The laser light scanning path is determined based on the slit width $W_{BW}$ and the sub-island position information provided by the CCD camera.

Then, laser light runs along the set scanning path targeting the sub-island to crystallize the sub-island.

The sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming a gate insulating film and forming an impurity region in the island. Then, an interlayer insulating film is formed so as to cover the gate insulating film and a gate electrode. A contact hole is formed in the interlayer insulating film to partially expose the impurity region. A wiring is then formed on the interlayer insulating film to reach the impurity region through the contact hole.

Figure 14:
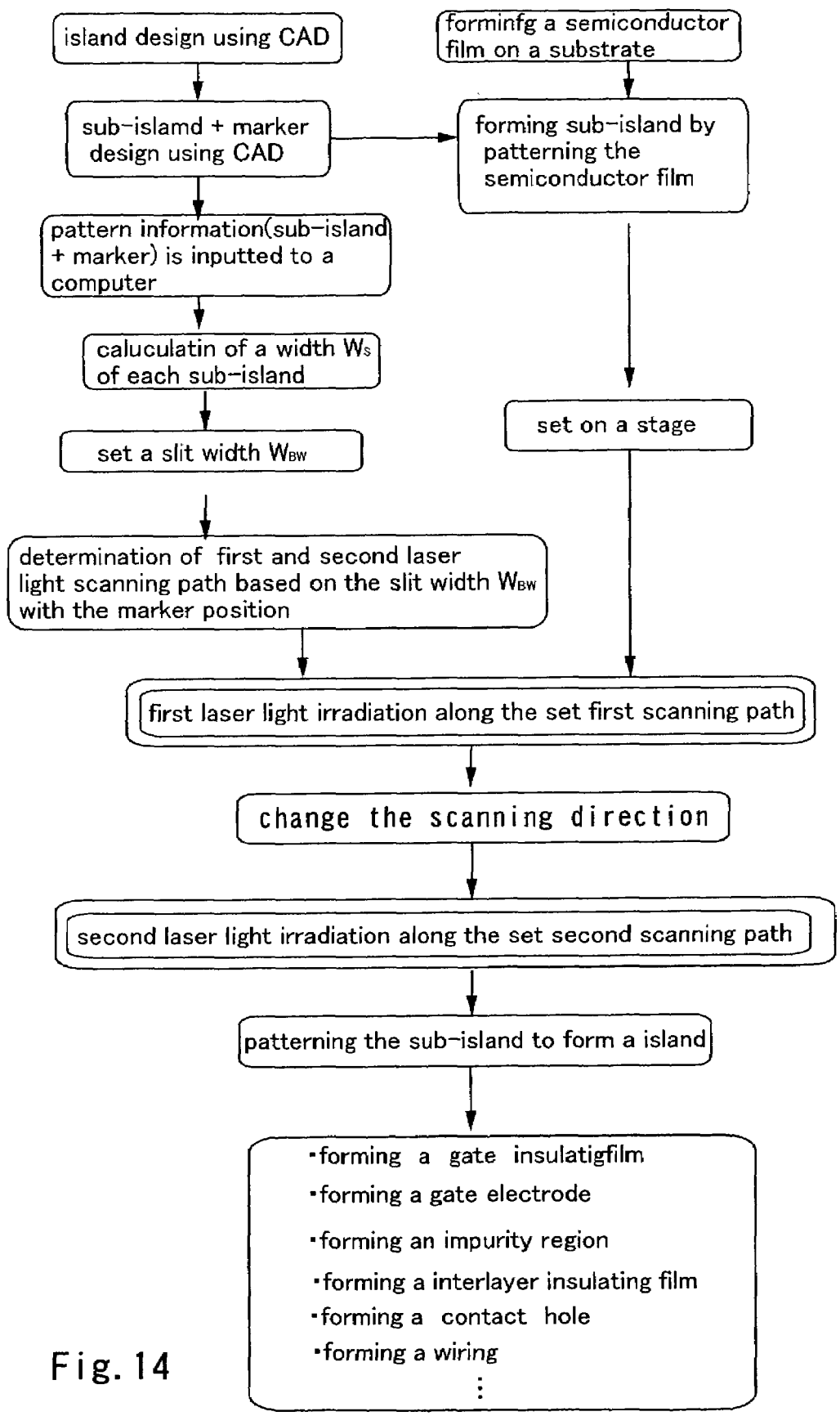
FIG. 14 is a diagram showing the production flow of the present invention.

FIG. 14 is a flow chart showing the flow of a producing method in which a processing object is irradiated with laser light twice.

First, a semiconductor device is designed using CAD. Specifically, a mask for an island is designed first and then a mask for a sub-island that includes one or more of such islands is designed. The mask for a sub-island may be designed such that a marker is formed at the same time the sub-island is formed.

Then, information concerning the shape of the designed mask for a sub-island (pattern information) is inputted to a computer of laser irradiation apparatus. From the sub-island pattern information inputted, the computer calculates for each sub-island two widths $W_S$ in the directions perpendicular to two scanning directions. Slit widths $W_{BW}$ in the directions perpendicular to the two scanning directions are calculated based on the widths $W_S$ of each sub-island.

Then, the laser light scanning path in each of the two scanning directions is determined based on the respective slit widths $W_{BW}$ with the marker position as the reference.

During this, a semiconductor film is formed on a substrate and the semiconductor film is patterned using the mask for a sub-island to form a sub-island. The substrate on which the sub-island is formed is set on a stage of the laser irradiation apparatus.

With the marker as the reference, a first laser light runs along a first scanning path, namely, one of the two scanning paths set, targeting the sub-island to crystallize the sub-island.

The angle the first time laser light scanning direction and the second time laser light scanning direction form may be stored in advance in a memory or the like, or may be inputted manually as the need arises.

The scanning direction is then changed and the second laser light runs along the second scanning path targeting the sub-island to crystallize the sub-island.

In the example shown in FIG. 14, the same sub-island is twice irradiated with laser light. However, it is also possible to change the scanning direction specifying the location if an AO modulator or the like is employed. For instance, when the scanning direction in a signal line driving circuit is different from the scanning direction in a pixel portion and a scanning line driving circuit and an AO modulator is used to irradiate with laser light an area to become the signal line driving circuit, the AO modulator prevents laser light from irradiating areas to become the pixel portion and the scanning line driving circuit. If instead the areas to become the pixel portion and the scanning line driving circuit are irradiated with laser light, the AO modulator prevents laser light from irradiating the area to become the signal line driving circuit. In this case, the computer synchronizes the AO modulator with the position controlling means.

The sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming a gate insulating film and forming an impurity region in the island. Then, an interlayer insulating film is formed so as to cover the gate insulating film and a gate electrode. A contact hole is formed in the interlayer insulating film to partially expose the impurity region. A wiring is then formed on the interlayer insulating film to reach the impurity region through the contact hole.

Figure 15:
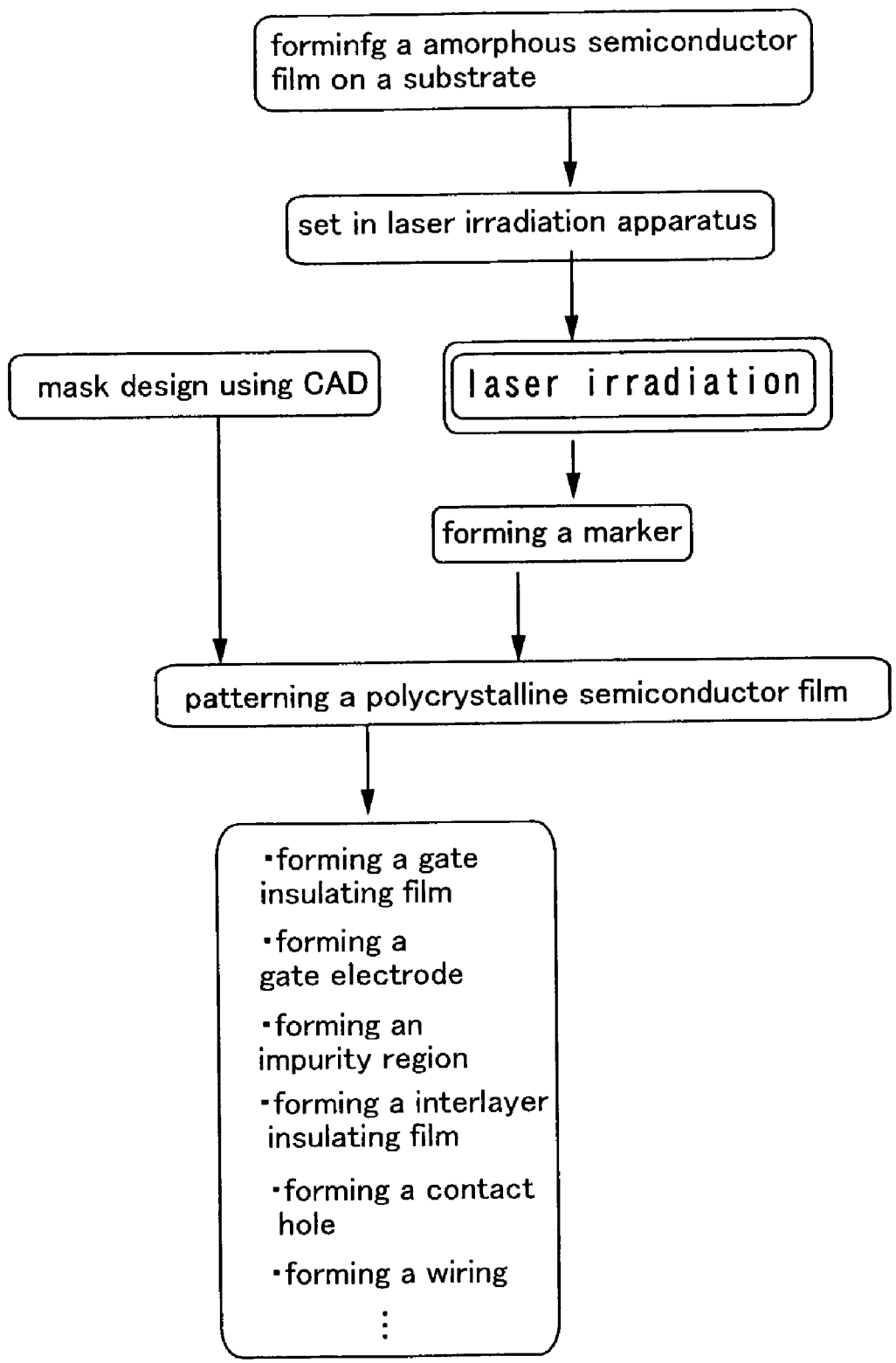
FIG. 15 is a diagram showing the production flow of prior art.

For comparison, the flow of a conventional semiconductor device producing method is shown in FIG. 15. As shown in FIG. 15, a mask of a semiconductor device is designed using CAD. An amorphous semiconductor film is formed on a substrate, and the substrate on which the amorphous semiconductor film is formed is set in laser irradiation apparatus. Then, laser light runs over the substrate so that the entire amorphous semiconductor film is irradiated with laser light. As a result, the entire amorphous semiconductor film is crystallized. A marker is formed in the polycrystalline semiconductor film obtained by the crystallization, and the polycrystalline semiconductor film is patterned with the marker as the reference to form an island. Then, a TFT is formed from the island.

As described, unlike prior art as the one shown in FIG. 15, the present invention uses laser light to form a marker before an amorphous semiconductor film is crystallized. The present invention then runs laser light in accordance with information of a mask for patterning of the semiconductor film.

With the above structure, time for laser irradiation of portions that are removed by patterning after crystallization of the semiconductor film can be saved to shorten the whole laser irradiation time and improve the substrate processing speed.

A step of crystallizing a semiconductor film using a catalyst may be included. If a catalytic element is used, it is desirable to employ techniques disclosed in JP 07-130652 A and JP 08-78329 A.

When a step of crystallizing a semiconductor film using a catalyst is included, the process includes a step of crystallizing an amorphous semiconductor film by using Ni after the film is formed (NiSPC). For example, if the technique disclosed in JP 07-130652 A is used, a nickel acetate solution containing 10 ppm of nickel by weight is applied to an amorphous semiconductor film to form a nickel-containing layer. After a dehydrogenation step at 500° C. for an hour, the amorphous semiconductor film is subjected to heat treatment at 500 to 650° C. for 4 to 12 hours, for example, at 550° C. for 8 hours, for crystallization. Examples of other employable catalytic elements than nickel (Ni) include germanium (Ge), iron (Fe), palladium (Pd), tin (Sn), lead (Pb), cobalt (Co), platinum (Pt), copper (Cu), and gold (Au).

The crystallinity of the semiconductor film that has been crystallized through NiSPC is further enhanced by laser light irradiation. The polycrystalline semiconductor film obtained by the laser light irradiation contains the catalytic element, which is removed from the crystalline semiconductor film by gettering after the laser light irradiation. For gettering, a technique disclosed in JP 10-135468 A or JP 10-135469 A can be employed.

To be specific, a part of the polycrystalline semiconductor film obtained through the laser irradiation is doped with phosphorus and then subjected to heat treatment at 550 to 800° C. for 5 to 24 hours, for example, at 600° C. for 12 hours in a nitrogen atmosphere. This causes the phosphorus-doped region of the polycrystalline semiconductor film to act as a gettering site, so that nickel present in the polycrystalline semiconductor film is moved to the phosphorus-doped region and segregated. After that, the phosphorus-doped region of the polycrystalline semiconductor film is removed by patterning to obtain an island in which the catalytic element concentration is reduced down to $1\times10^{17}$ atoms/cm$^3$ or less, preferably, $1\times10^{16}$ atoms/cm$^3$ or less.

Figure 16A:
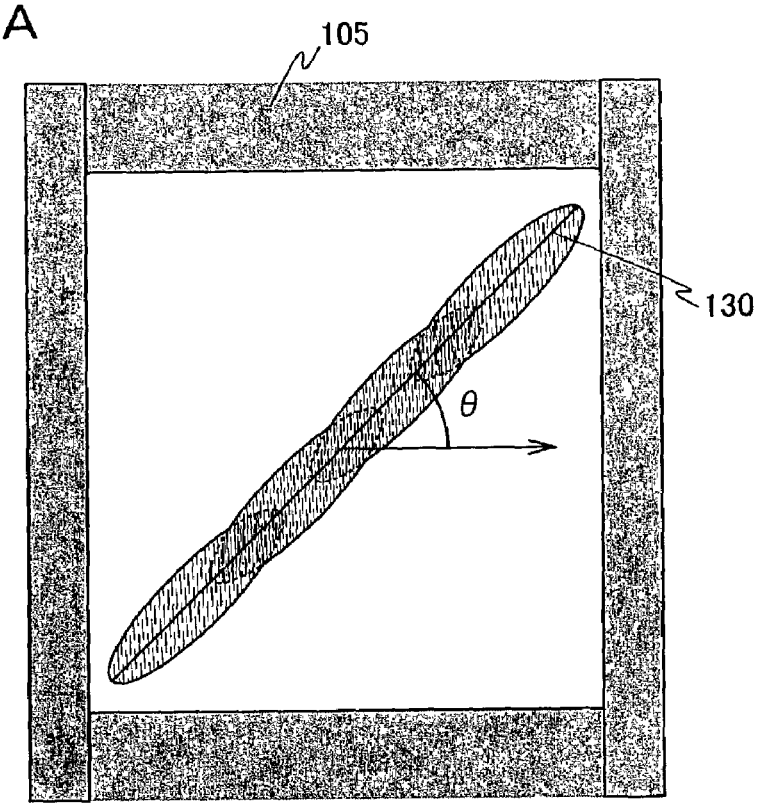
FIGS. 16A and 16B are diagrams showing the positional relation between a slit and a beam spot.
Figure 16B:
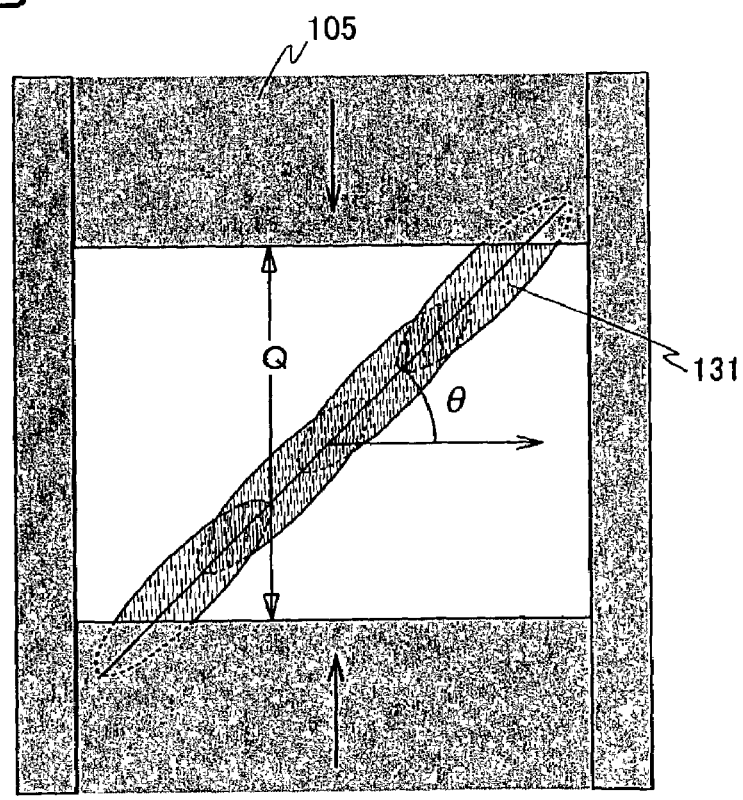

Next, a description is given with reference to FIGS. 16A and 16B on the positional relation between a slit and a beam spot when the central axis of the beam spot is kept at 45° with respect to the scanning direction. Denoted by 130 is a beam spot after synthesization and 105 denotes a slit. The slit 105 does not overlap the beam spot 130. The arrow indicates the scanning direction, which forms an angle θ with the central axis of the beam spot 130. The angle θ is kept to 45°.

FIG. 16B shows a beam spot 131 obtained by partially blocking laser light with the slit 105 to reduce the width. In the present invention, the slit 105 controls a width Q of a beam spot in the direction perpendicular to the scanning direction for uniform laser light irradiation.

As described, the present invention runs laser light so as to obtain at least the minimum degree of crystallization of a portion that has to be crystallized, instead of irradiating the entire semiconductor film with laser light. With the above structure, time for laser irradiation of portions that are removed by patterning after crystallization of the semiconductor film can be saved to greatly shorten the laser irradiation time per substrate.

Embodiments of the present invention will be described below.

Embodiment 1

This embodiment describes optical systems of laser irradiation apparatus used in the present invention, and the positional relation between a slit and each of the optical systems.

FIGS. 17A to 17D show optical systems of this embodiment. The optical system shown in FIG. 17A has two cylindrical lenses 401 and 402. Laser light entering from the direction indicated by the arrow passes through the two cylindrical lenses 401 and 402, which modify the shape of the beam spot of the laser light. The beam spot travels through a slit 404 to irradiate a processing object 403. Of the cylindrical lenses 401 and 402, 402 is closer to the processing object 403 and has a shorter focal length. In order to avoid return light and irradiate uniformly, the incident angle at which laser light enters the substrate is set to larger than 0°, desirably, 5 to 30°.

The optical system shown in FIG. 17B has a mirror 405 and a planoconvex spherical lens 406. Laser light entering from the direction indicated by the arrow is reflected by the mirror 405, and the shape of the beam spot of the laser light is modified by the planoconvex spherical lens 406. The beam spot travels through a slit 408 to irradiate a processing object 407. The radius of curvature of the planoconvex spherical lens can be set appropriately at designer's discretion. In order to avoid return light and irradiate uniformly, the incident angle at which laser light enters the substrate is set to larger than 0°, desirably, 5 to 30°.

The optical system shown in FIG. 17C has mirrors 410 and 411 and lenses 412, 413, and 414. Laser light entering from the direction indicated by the arrow is reflected by the mirrors 410 and 411, and the shape of the beam spot of the laser light is modified by the lenses 412, 413, and 414. The beam spot travels through a slit 416 to irradiate a processing object 415. In order to avoid return light and irradiate uniformly, the incident angle at which laser light enters the substrate is set to larger than 0°, desirably, 5 to 30°.

FIG. 17D shows an optical system for synthesizing four beam spots shown in Embodiment 2 to obtain one beam spot. The optical system shown in FIG. 17D has six cylindrical lenses 417 to 422. Four laser beams entering the optical system from the directions indicated by the arrows enter the four cylindrical lenses 419 to 422, respectively. Two laser beams shaped by the cylindrical lenses 419 and 421 reach the cylindrical lens 417, which modifies the shapes of their beam spots. The beam spots travel through a slit 424 to irradiate a processing object 423. On the other hand, two laser beams shaped by the cylindrical lenses 420 and 422 reach the cylindrical lens 418, which modifies the shapes of their beam spots. The beam spots travel through the slit 424 to irradiate the processing object 423.

The beam spots of the laser beams on the processing object 423 partially overlap one another for synthesization, thereby forming one beam spot.

The focal length and incident angle of each lens can be set appropriately at designer's discretion. However, the focal length of the cylindrical lenses 417 and 418 which are the closest to the processing object 423 is set shorter than the focal length of the cylindrical lenses 419 to 422. For example, the focal length of the cylindrical lenses 417 and 418 which are the closest to the processing object 423 is set to 20 mm whereas the focal length of the cylindrical lenses 419 to 422 is set to 150 mm. In this embodiment, the lenses are arranged such that laser beams enter the processing object 423 from the cylindrical lenses 417 and 418 at an incident angle of 25° and laser beams enter the cylindrical lenses 417 and 418 from the cylindrical lenses 419 to 422 at an incident angle of 10°. In order to avoid return light and irradiate uniformly, the incident angle at which laser light enters the substrate is set to larger than 0°, desirably, 5 to 30°.

In the example shown in FIG. 17D, four beam spots are synthesized. In this case, four cylindrical lenses respectively associated with four laser oscillation apparatuses and two cylindrical lenses associated with the four cylindrical lenses are provided. The number of beam spots synthesized is not limited to 4. It is sufficient if the number of beam spots synthesized is equal to or more than 2 and equal to or less than 8. When n (n=2, 4, 6, 8) beam spots are synthesized, n cylindrical lenses respectively associated with n laser oscillation apparatuses and n/2 cylindrical lenses associated with the n cylindrical lenses are provided. When n (n=3, 5, 7) beam spots are synthesized, n cylindrical lenses respectively associated with n laser oscillation apparatuses and (n+1)/2 cylindrical lenses associated with the n cylindrical lenses are provided.

When five or more beam spots are synthesized, the fifth and the following laser beams desirably irradiate a substrate from the opposite side of the substrate, taking into consideration where to place the optical system, interference, and the like. In this case, another slit is needed on the opposite side of the substrate. Also, the substrate has to be transmissive.

In order to prevent light from traveling back its light path (return light), the incident angle at which laser light enters the substrate is desirably kept at larger than 0° and smaller than 90°.

A plane which is perpendicular to the irradiated face and which includes a shorter side of the rectangular shape of each beam before synthesization, or a longer side thereof, is defined as an incident plane. When the length of the shorter side or longer side included in the incident plane is given as W, and the thickness of a substrate which is transmissive of the laser light and which is set on the irradiated face is given as d, an incident angle θ of the laser light desirably satisfies θ≧arctan (W/2 d) to achieve uniform laser light irradiation. This has to be true in each laser light before synthesization. If the track of this laser light is not on the incident plane, the incident angle of the track projected onto the incident plane is deemed as θ. When laser light enters the substrate at this incident angle θ, interference between light reflected at the front side of the substrate and reflected light from the back side of the substrate can be avoided to give the substrate uniform laser beam irradiation. The premise of the above discussion is that the refractive index of the substrate is 1. In practice, the refractive index of the substrate is often around 1.5, and the angle calculated taken this fact into account is larger than the angle calculated in the above discussion. However, the energy of a beam spot is attenuated at its ends in the longitudinal direction and influence of interference is small in these portions. Therefore enough interference attenuation effect can be obtained with the value calculated in the above discussion.

An optical system of the laser irradiation apparatus used in the present invention can have other structures than those shown in this embodiment.

Embodiment 2

This embodiment describes an example in which plural laser oscillation apparatuses are used and the width of a beam spot of laser light is changed by an AO modulator in the middle of laser light irradiation.

In this embodiment, a computer grasps a laser light scanning path based on mask information inputted. Furthermore, this embodiment uses an AO modulator to change the direction of laser light outputted from any one of the plural laser oscillation apparatuses to prevent the redirected laser light from irradiating a processing object and thereby change the width of the beam spot in accordance with the mask shape. In this case, although the width of the beam spot is changed by the AO modulator, a region of the beam spot that is low in energy density still has to be blocked in the direction perpendicular to the scanning direction. Therefore, control of the slit width and blocking of laser light by the AO modulator have to be synchronized.

Figure 18A:
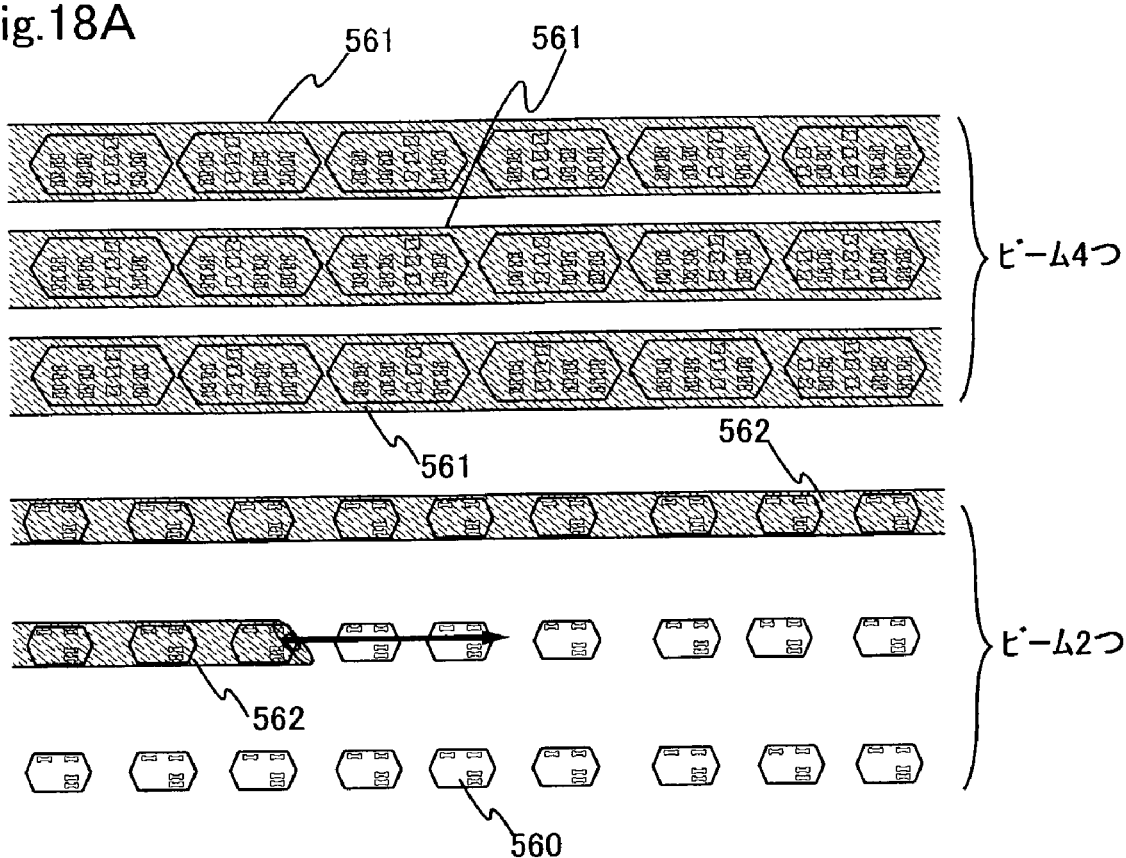
FIGS. 18A and 18B are diagrams showing the positional relation between a portion irradiated with laser light and a mask.

FIG. 18A shows an example of the relation between the shape of a mask for patterning a semiconductor film and the beam spot width when a processing object is irradiated with laser light once. Indicated by 560 is the shape of a mask for patterning a semiconductor film. A semiconductor film is patterned in accordance with the mask after the semiconductor film is crystallized by laser irradiation.

Denoted by 561 and 562 are areas irradiated with laser light. The areas 561 and 562 are scanned with a beam spot obtained by overlapping and synthesizing laser beams outputted from four laser oscillation apparatuses. A slit controls the beam spot width such that it is narrower in 562 than in 561.

By using an AO modulator as in this embodiment, the beam spot width can be changed freely without stopping output of every laser oscillation apparatus and unstable output due to interruption of output of laser oscillation apparatus can be avoided.

With the above structure, the laser light track can be changed in width and edges of the laser light track can be prevented from overlapping a semiconductor that is obtained by patterning. Also, the above structure further reduces damage to a substrate which is caused by irradiating with laser light an area that does not need irradiation.

Next, a description is given on an example of blocking laser light by an AO modulator in the middle of laser light irradiation to irradiate only a given area with laser light. In this embodiment, laser light is blocked by using an AO modulator to change the direction of the laser light. However, the present invention is not limited thereto and can employ any measure that can block laser light.

In the present invention, a computer grasps which part is to be scanned with laser light from mask information inputted. Furthermore, this embodiment uses an AO modulator to change the direction of laser light so that the laser light is blocked and an area to be scanned alone is irradiated with laser light. The AO modulator is desirably formed of a material which can block laser light and which is not deformed or damaged by laser light.

Figure 18B:
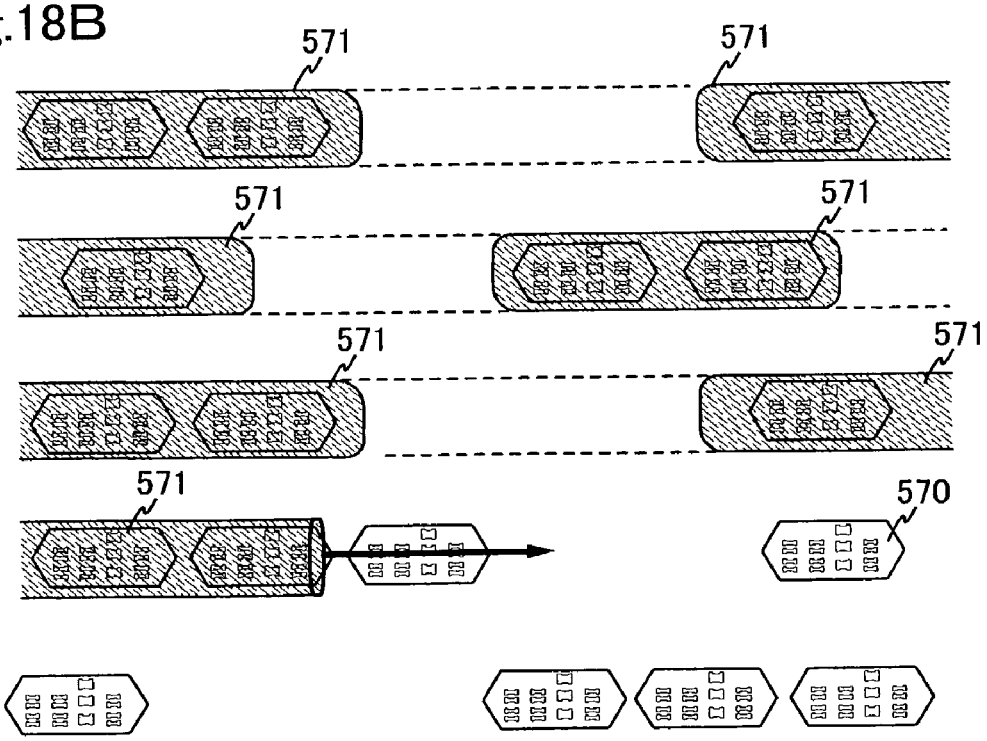

FIG. 18B shows an example of the relation between the shape of a mask for patterning a semiconductor film and an area to be irradiated with laser light. Indicated by 570 is the shape of a mask for patterning a semiconductor film. A semiconductor film is patterned in accordance with the mask after the semiconductor film is crystallized by laser irradiation.

Denoted by 571 is an area irradiated with laser light. An area surrounded by the dashed line is not irradiated with laser light because an AO modulator changes the direction of laser light to block the laser light. In this embodiment, an area where crystallization is unnecessary is not irradiated with laser light, or even if irradiated, laser light used is low in energy density. Therefore, damage to a substrate which is caused by irradiating an area that does not need irradiation with laser light can be further reduced.

Next, a description is given on a process of manufacturing a semiconductor device having a pixel portion, a signal line driving circuit, and a scanning line driving circuit, in which an AO modulator is used for selective laser light irradiation of the pixel portion, the signal line driving circuit, and the scanning line driving circuit to irradiate each of them once.

Figure 19A:
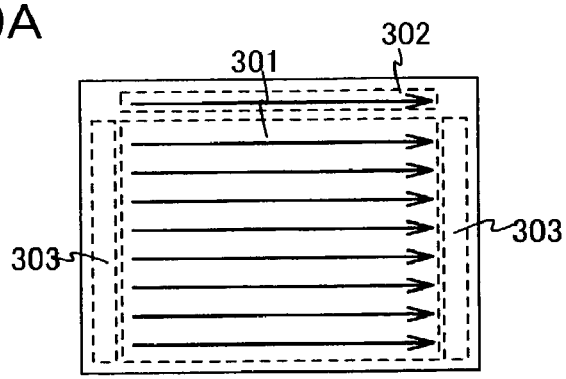
FIGS. 19A to 19D are diagrams showing directions of laser light moving on a processing object.

First, as shown in FIG. 19A, laser light runs over a signal line driving circuit 302 and a pixel portion 301 in the direction indicated by the arrow for laser light irradiation. At this point, instead of irradiating the entire surface of the substrate with laser light, an AO modulator is used to change the direction of laser light and block the laser light so that a scanning line driving circuit 303 is not irradiated with laser light.

Figure 19B:
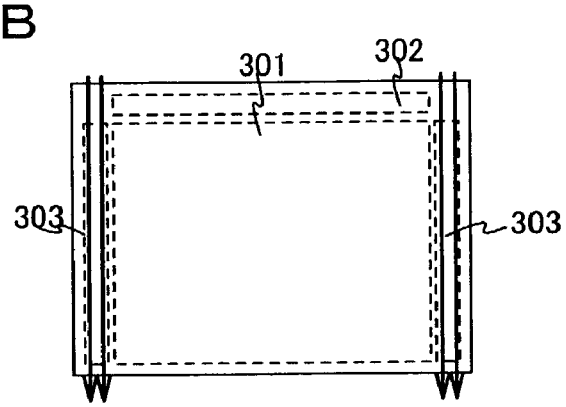

Then, as shown in FIG. 19B, the scanning line driving circuit 303 is irradiated with laser light by running laser light over the scanning line driving circuit 303 in the direction indicated by the arrow. At this time, the signal line driving circuit 302 and the pixel portion 301 are not irradiated with laser light.

The description given next is about another example of using an AO modulator for selective laser light irradiation of a pixel portion, a signal line driving circuit, and a scanning line driving circuit to irradiate each of them once.

Figure 19C:
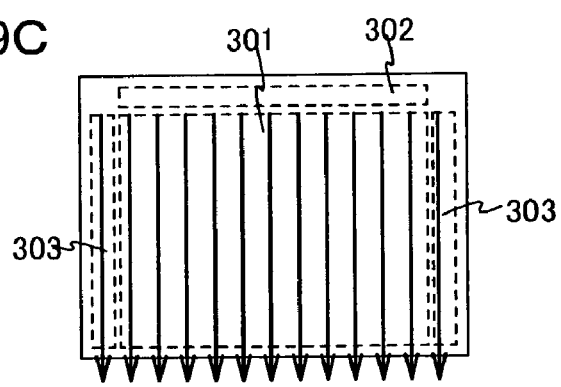

First, as shown in FIG. 19C, laser light runs over the scanning line driving circuit 303 and a pixel portion 301 in the direction indicated by the arrow for laser light irradiation. At this point, instead of irradiating the entire surface of the substrate with laser light, an AO modulator is used to change the direction of laser light and block the laser light so that the signal line driving circuit 302 is not irradiated with laser light.

Figure 19D:
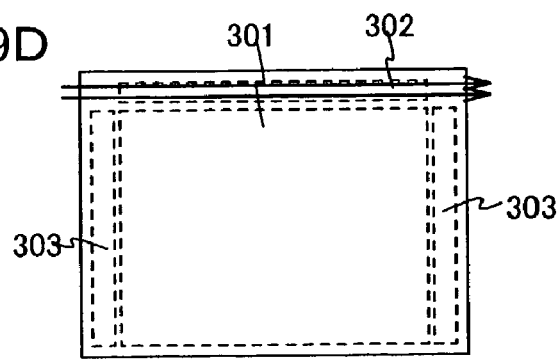

Then, as shown in FIG. 19D, the signal line driving circuit 302 is irradiated with laser light by running laser light over the signal line driving circuit 302 in the direction indicated by the arrow. During this, the scanning line driving circuit 303 and the pixel portion 301 are not irradiated with laser light.

As described above, using an AO modulator makes selective laser irradiation possible and therefore the laser light scanning direction can be changed for each circuit in accordance with layout of channel formation regions in active layers of the respective circuits. Since irradiating the same circuit with laser light twice can be avoided, it eliminates limitations in laser light path setting and active layer layout which are for preventing edges of second time laser light from overlapping active layers laid out.

Next, an example is described in which plural panels are manufactured from a large-sized substrate when an AO modulator is used for selective laser light irradiation of a pixel portion, a signal line driving circuit, and a scanning line driving circuit to irradiate each of them once.

Figure 20:
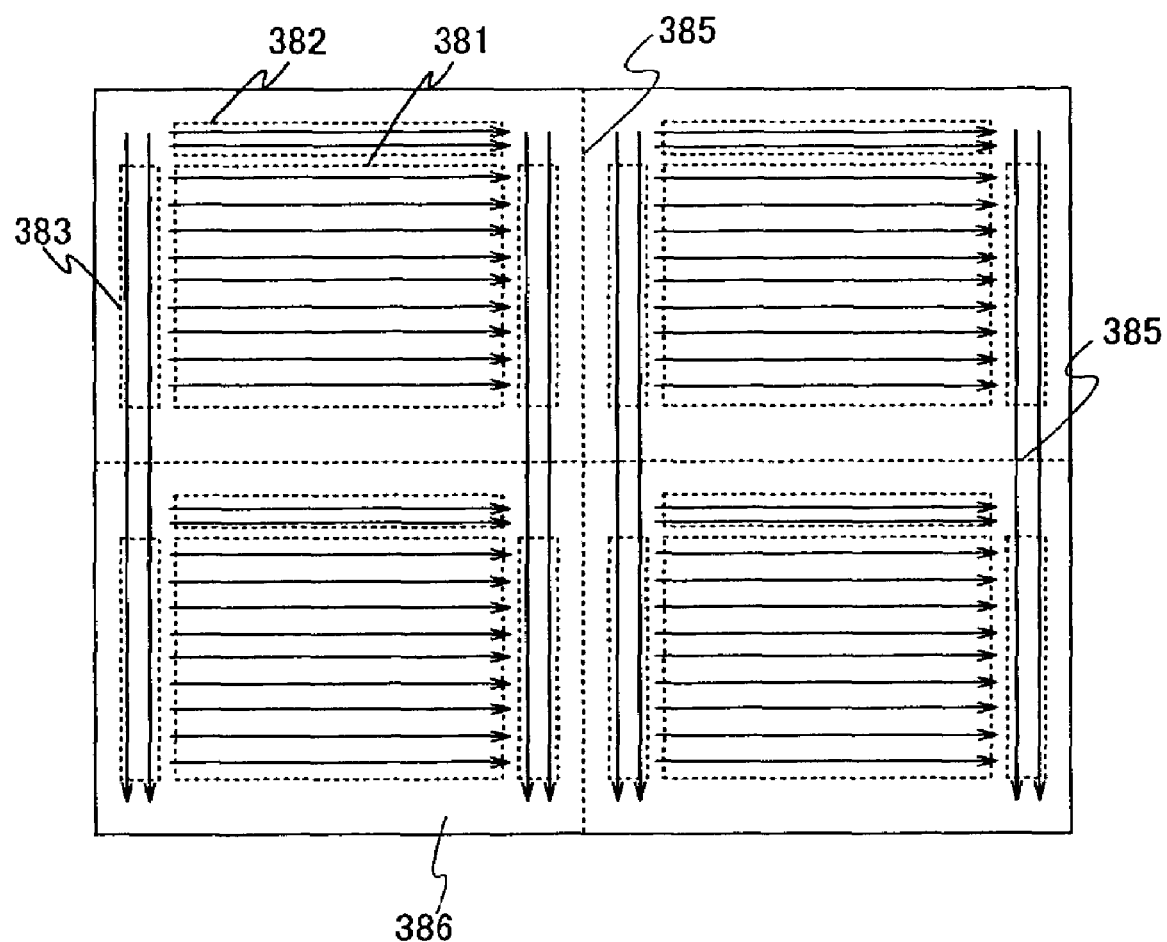
FIG. 20 is a diagram showing a direction of laser light moving on a processing object.

First, as shown in FIG. 20, laser light runs over a signal line driving circuit 382 and pixel portion 381 of each panel in the direction indicated by the arrow for laser light irradiation. At this point, instead of irradiating the entire surface of the substrate with laser light, an AO modulator is used to change the direction of laser light and block the laser light so that a scanning line driving circuit 383 is not irradiated with laser light.

Then, the scanning line driving circuit 383 of each panel is irradiated with laser light by running laser light over the scanning line driving circuit 383 in the direction indicated by the arrow. At this time, the signal line driving circuit 382 and the pixel portion 381 are not irradiated with laser light. Denoted by 385 is a scrub line of a substrate 386.

This embodiment can be combined with Embodiment 1.

Embodiment 3

This embodiment describes, in relation to the energy density, the distance between centers of beam spots when they are overlapped.

Figure 21:
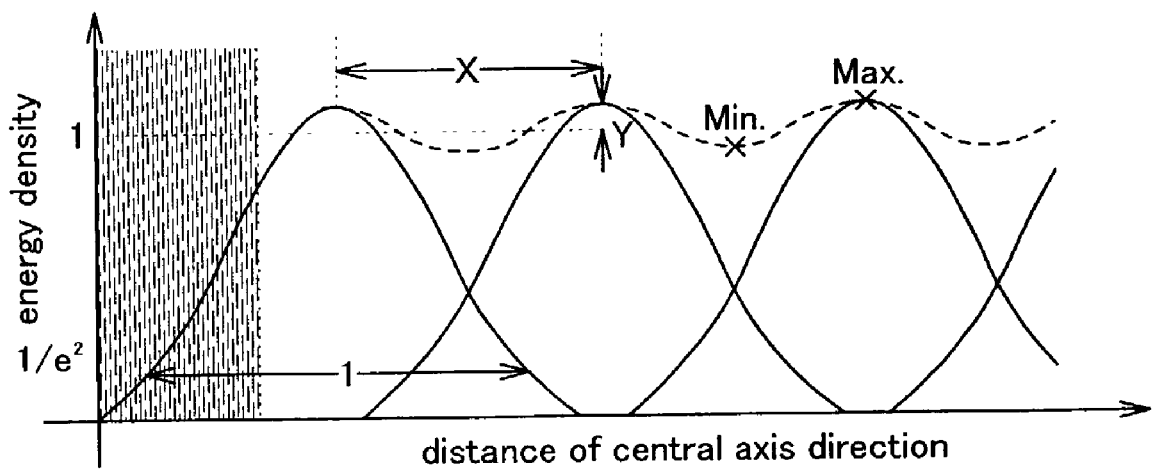
FIG. 21 is a diagram showing the energy density distribution in a central axis direction of overlapping beam spots.

In FIG. 21, the energy density distribution in the central axis direction of each beam spot is indicated by the solid line and the energy density distribution of the synthesized beam spot is indicated by the dashed line. The energy density value in the central axis direction of a beam spot generally follows Gaussian distribution.

Figure 38:
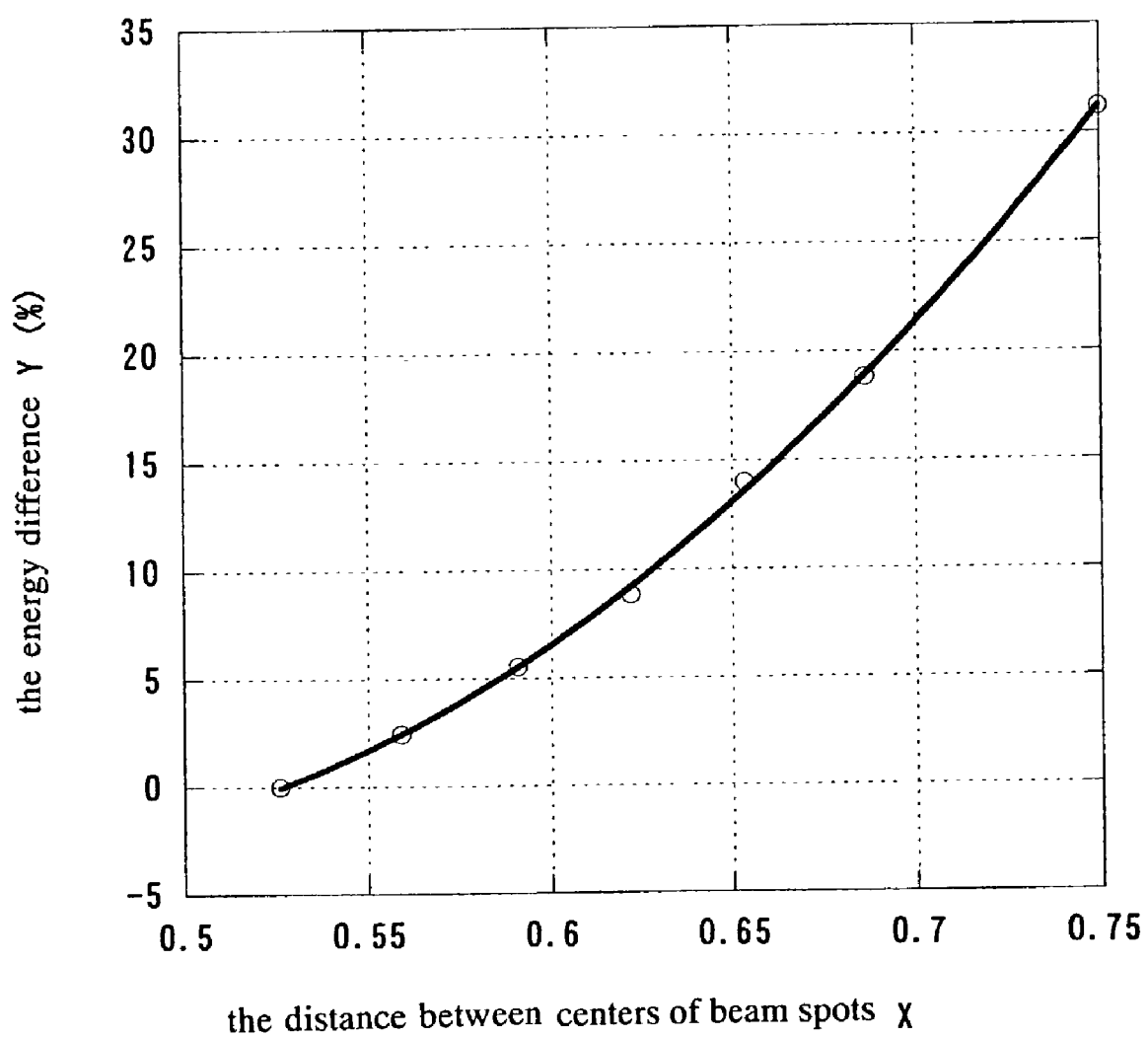
FIG. 38 is a graph showing the energy difference in relation to the distance between centers of beam spots.

Assume that, before synthesization, the distance in the central axis direction of a beam spot where the energy density is equal to or more than the peak value, $1/e^2$, is 1. Then, the distance between peaks is given as X. An increase from the peak value of the average valley value to the peak value after synthesization is given as Y. The relation between X and Y obtained through simulation is shown in FIG. 38. Y in FIG. 38 is expressed as a percentage.

In FIG. 38, the energy difference Y is expressed by the following Expression 1, which is an approximate expression.

[Expression 1]

$$Y=60-293X+340X^2 \text{ (X is the larger one of two solutions.)}$$

According to Expression 1, if energy difference is desired to be, for example, around 5%, X≅0.584 has to be satisfied. Ideally, Y=0 but this makes the length of the beam spot short. Therefore, X is preferably determined balancing it with throughput.

Figure 39:
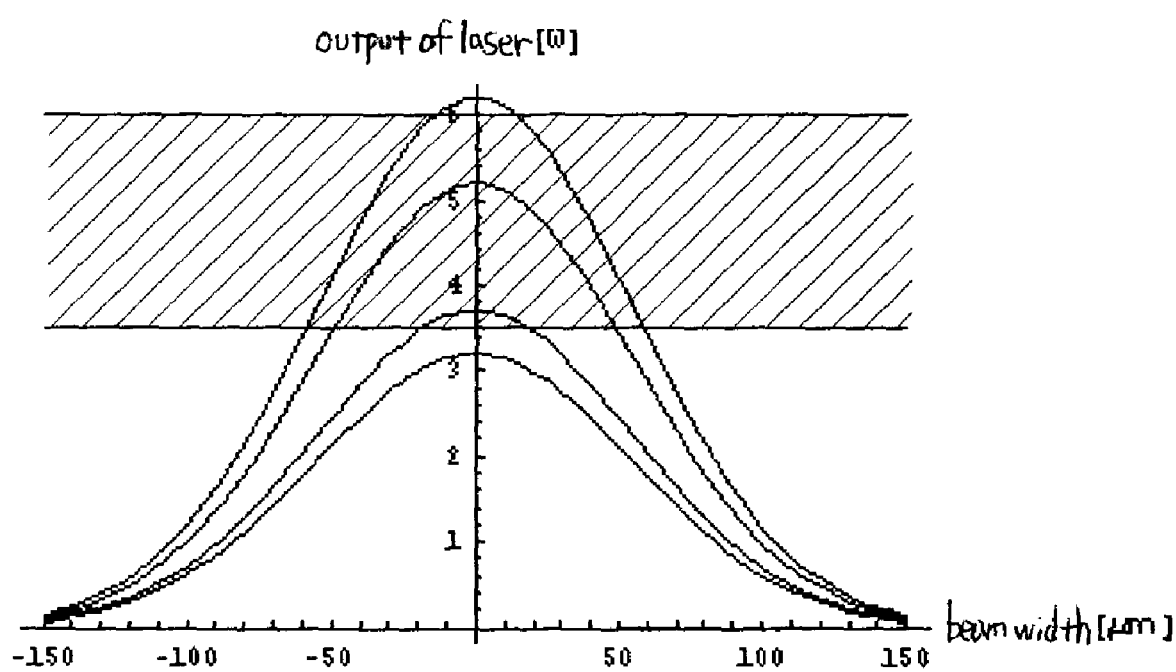
FIG. 39 is a graph showing the output energy distribution in the central axis direction of a beam spot.

The acceptable range of Y is described next. FIG. 39 shows the output (W) distribution of a $YVO_4$ laser in relation to the beam width in the central axis direction when a beam spot has an elliptical shape. A hatched region is the range of an energy output necessary to obtain satisfactory crystallinity. The graph shows that it is sufficient if the output energy of synthesized laser light falls between 3.5 W and 6 W.

The energy difference Y for obtaining satisfactory crystallinity reaches its maximum when the maximum value and minimum value of the output energy of the synthesized beam spot fall within the range of an energy output necessary to obtain satisfactory crystallinity such that the values closely match the upper limit and lower limit of the range, respectively. Therefore, in the case of FIG. 39, satisfactory crystallinity is obtained if the energy difference Y is ±26.3%.

The range of an energy output necessary to obtain satisfactory crystallinity is varied depending on which level of crystallinity is deemed as satisfactory, and the output energy distribution is also varied depending on the beam spot shape. Accordingly, the acceptable range of the energy difference Y is not limited to the values described above. It is necessary for a designer to determine the range of an energy output necessary to obtain satisfactory crystallinity and to set the acceptable range of the energy difference Y from the output energy distribution of the laser light used.

This embodiment can be combined with Embodiment 1 or 2.

Embodiment 4

This embodiment describes how beam spots are overlapped. FIGS. 22A to 22C show beam spots before synthesization and their regions where the energy density is the peak energy density multiplied by $1/e^2$.

FIG. 22A shows a case in which four beam spots are overlapped while avoiding overlap of the center of one beam spot and the center of another beam spot.

FIG. 22B shows a case in which four beam spots are overlapped with the center of one beam spot overlapping an edge of another beam spot.

FIG. 22C shows a case of overlapping four beam spots such that the center of one beam spot overlaps an edge of a beam spot next to a beam spot that is adjacent to the one beam spot.

The present invention is not limited to these structures. How beam spots are overlapped can be determined at designer's discretion. This embodiment can be combined with Embodiments 1 through 3.

Embodiment 5

This embodiment gives a description with reference to FIGS. 23A to 26 on a method of manufacturing an active matrix substrate using a laser crystallization method of the present invention. In this specification, a substrate on which a CMOS circuit, a driving circuit, and a pixel portion that has a pixel TFT and capacitor storage are all formed is called an active matrix substrate for conveniences' sake.

This embodiment uses glass such as barium borosilicate glass or aluminoborosilicate glass to form a substrate 600. Instead of glass, the substrate 600 may be a quartz substrate, silicon substrate, metal substrate, or stainless steel substrate with an insulating film formed on its surface. A plastic substrate may also be employed if it has enough heat resistance to withstand the processing temperature.

Figure 23A:
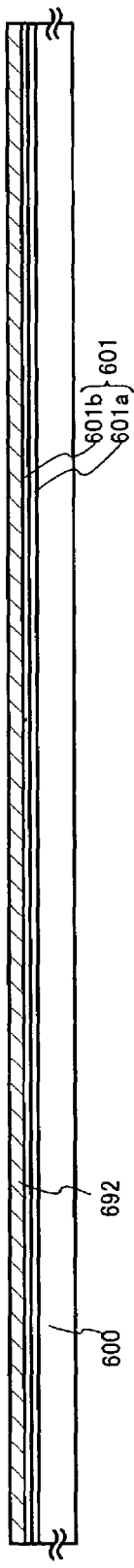
FIGS. 23A to 23D are diagrams showing a method of manufacturing a semiconductor device which uses a laser irradiation method of the present invention.

On the substrate 600, an insulating film such as a silicon oxide film, a silicon nitride film, or a silicon oxynitride film is formed as a base film 601 by a known method (sputtering, LPCVD, plasma CVD, or the like). The base film 601 in this embodiment consists of two layers, base films 601a and 601b. However, the base film 601 may be a single layer or three or more layers of the insulating films listed in the above (FIG. 23A).

Figure 23B:
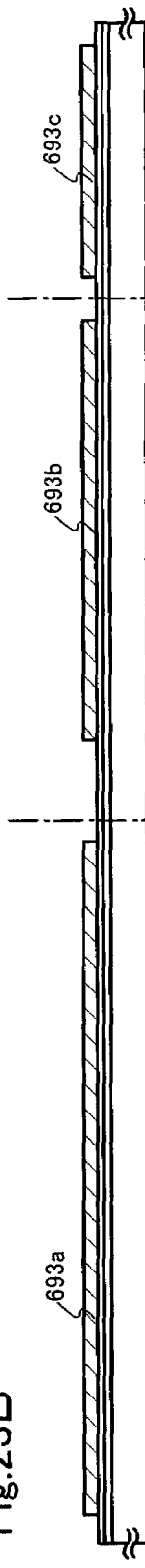

Next, an amorphous semiconductor film 692 is formed on the base film 601 by a known method (sputtering, LPCVD, plasma CVD, or the like) to a thickness of 25 to 80 nm (preferably 30 to 60 nm) (FIG. 23B). Although an amorphous semiconductor film is formed in this embodiment, a microcrystalline semiconductor film or a crystalline semiconductor film may be formed instead. A compound semiconductor film having an amorphous structure, such as an amorphous silicon germanium film, may also be employed.

Next, the amorphous semiconductor film 692 is patterned and etched by anisotropic dry etching in an atmosphere containing halogen fluoride, for example, ClF, $ClF_3$, BrF, $BrF_3$, IF, or $IF_3$, to form sub-islands 693a, 693b, and 693c.

The sub-islands 693a, 693b, and 693c are crystallized by laser crystallization. This laser crystallization employs a laser irradiation method of the present invention. Specifically, the sub-islands 693a, 693b, and 693c are selectively irradiated with laser light in accordance with mask information inputted to a computer of laser irradiation apparatus. Instead of crystallizing the sub-islands by laser crystallization alone, other known crystallization methods (such as RTA, thermal crystallization using an annealing furnace, or thermal crystallization using a metal element that promotes crystallization) may be used in combination with laser crystallization.

If the amorphous semiconductor film is crystallized by a continuous wave solid-state laser using the second to fourth harmonic of the fundamental wave thereof, crystals of large grain size can be obtained. Typically, the second harmonic (532 nm) or third harmonic (355 nm) of a Nd:YVO$_4$ laser (fundamental wave: 1064 nm) is desirably employed. To be specific, laser light emitted from a continuous wave YVO$_4$ laser is converted into harmonic by a non-linear optical element to obtain laser light with output of 10 W. Alternatively, harmonic is obtained by putting a YVO$_4$ crystal and a non-linear optical element in a resonator. The harmonic is preferably shaped into oblong or elliptical laser light on an irradiation surface by an optical system and then irradiates a processing object. The energy density required at this point is around 0.01 to 100 MW /cm$^2$ (preferably 0.1 to 10 MW /cm$^2$). During the irradiation, the semiconductor film is moved relative to the laser light at a rate of about 10 to 2000 cm/s.

For laser irradiation, a pulse oscillation or continuous wave gas laser or solid-state laser can be employed. Examples of the gas laser include an excimer laser, an Ar laser, and a Kr laser. Examples of the solid-state laser include a YAG laser, a YVO$_4$ laser, a YLF laser, a YAlO$_3$ laser, a glass laser, a ruby laser, an alexandrite laser, a Ti: sapphire laser, and a Y$_2$O$_3$ laser. The solid-state laser employed may be a laser that uses crystals of YAG, YVO$_4$, YLF, YAlO$_3$ or the like doped with Cr, Nd, Er, Ho, Ce, Co, Ti, Yb, or Tm. The fundamental wave of the laser is varied depending on the material used for doping but laser light obtained has a fundamental wave of about 1 µm. A non-linear optical element is used to obtain harmonic of the fundamental wave.

Through the above laser crystallization, the sub-islands 693*a*, 693*b*, and 693*c* are irradiated with laser light and sub-islands 694*a*, 694*b*, and 694*c* with improved crystallinity are formed (FIG. 23B).

Figure 23C:
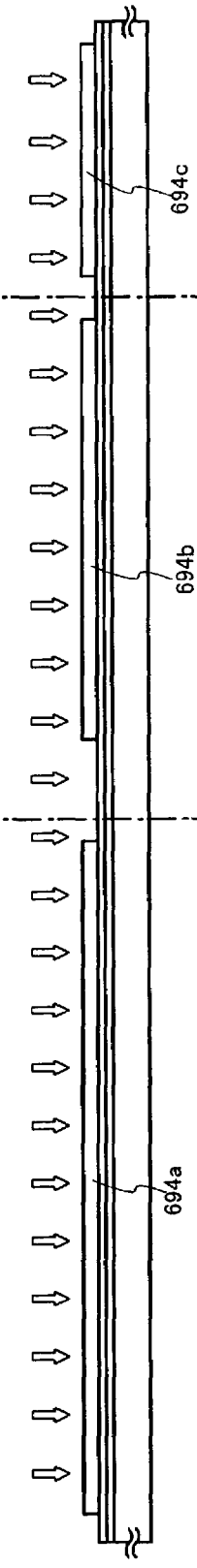
Figure 23D:

The sub-islands 694*a*, 694*b*, and 694*c* with improved crystallinity are patterned into desired shapes to form crystallized islands 602 to 606 (FIG. 23C).

After the islands 602 to 606 are formed, the islands may be doped with a minute amount of impurity element (boron or phosphorus) in order to control the threshold of TFTs.

Then a gate insulating film 607 is formed to cover the islands 602 to 606. The gate insulating film is an insulating film containing silicon and is formed by plasma CVD or sputtering to a thickness of 40 to 150 nm. In this embodiment, a silicon oxynitride film (composition ratio: Si=32%, O=59%, N=7%, H=2%) is formed by plasma CVD to a thickness of 110 nm. The gate insulating film is not limited to the silicon oxynitride film, and a single layer or laminate of other insulating films containing silicon may also be employed.

If a silicon oxide film is chosen for the gate insulating film, it is formed by plasma CVD in which TEOS (tetraethyl orthosilicate) and O$_2$ are mixed, the reaction pressure is set to 40 Pa, the substrate temperature to 300 to 400° C., and the high frequency (13.56 MHz) power density to 0.5 to 0.8 W/cm$^2$ for electric discharge. The thus formed silicon oxide film can provide excellent characteristics as a gate insulating film if it subsequently receives thermal annealing at 400 to 500° C.

Next, a laminate of a first conductive film 608 with a thickness of 20 to 100 nm and a second conductive film 609 with a thickness of 100 to 400 nm is formed on the gate insulating film 607. In this embodiment, a TaN film with a thickness of 30 nm is formed as the first conductive film 608 and then a W film with a thickness of 370 nm is laid thereon as the second conductive film 609. The TaN film is formed by sputtering with Ta as the target in an atmosphere containing nitrogen. The W film is formed by sputtering using a W target.

The W film may instead be formed by thermal CVD using tungsten hexafluoride (WF$_6$). In either case, the W film has to have low resistivity in order to use it as a gate electrode. Desirably, the W film has a resistivity of 20 µΩcm or less. The resistivity of the W film can be lowered by increasing the grain size. However, if too many impurity elements such as oxygen are contained in the W film, crystallization is hindered to raise the resistivity. Accordingly, this embodiment uses sputtering with W of high purity (purity: 99.9999%) as the target to form the W film taking care not to allow impurities from the air to mix in the film during its formation. As a result, the W film can have a resistivity of 9 to 20 µΩcm.

Although the first conductive film 608 and the second conductive film 609 in this embodiment are a TaN film and a W film, respectively, there is no particular limitation thereto. The first conductive film and second conductive film each can be formed from an element selected from the group consisting of Ta, W, Ti, Mo, Al, Cu, Cr, and Nd, or an alloy or compound mainly containing the above elements. Alternatively, the first conductive film and the second conductive film may be semiconductor films, typically polycrystalline silicon films, doped with phosphorus or other impurity elements or may be Ag—Pd—Cu alloy films. The following combinations are also employable: a combination of a tantalum (Ta) film as the first conductive film and a W film as the second conductive film, a combination of a titanium nitride (TiN) film as the first conductive film and a W film as the second conductive film, a combination of a tantalum nitride (TaN) film as the first conductive film and a W film as the second conductive film, a combination of a tantalum nitride (TaN) film as the first conductive film and an Al film as the second conductive film, and a combination of a tantalum nitride (TaN) film as the first conductive film and a Cu film as the second conductive film.

The present invention is not limited to a two-layer structure conductive film. For example, a three-layer structure consisting of a tungsten film, aluminum-silicon alloy (Al—Si) film, and titanium nitride film layered in this order may be employed. When the three-layer structure is employed, the tungsten film may be replaced by a tungsten nitride film, the aluminum-silicon alloy (Al—Si) film may be replaced by an aluminum-titanium alloy (Al—Ti) film, and the titanium nitride film may be replaced by a titanium film.

It is important to select the optimum etching method and etchant for the conductive film material employed.

Figures 24A, 24B, 24C:
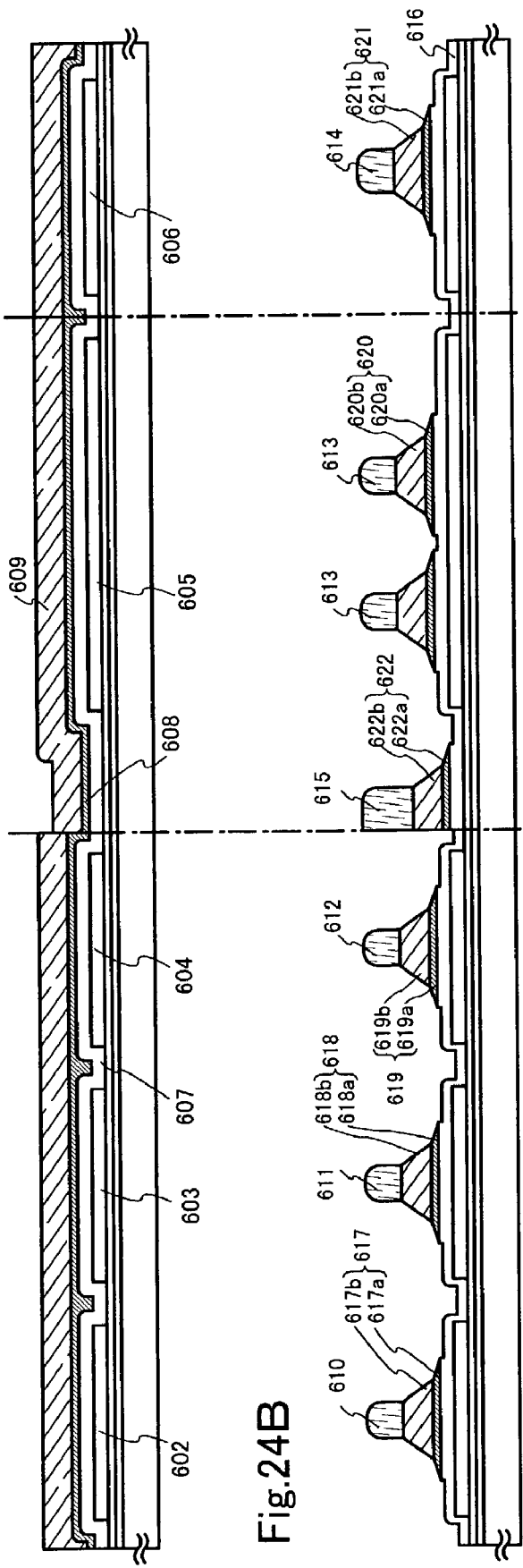
FIGS. 24A to 24C are diagrams showing a method of manufacturing a semiconductor device which uses a laser irradiation method of the present invention.

Next, resist masks 610 to 615 are formed by photolithography and the first etching treatment is conducted in order to form electrodes and wirings. The first etching treatment employs first and second etching conditions (FIG. 24B). In this embodiment, the first etching conditions include employing ICP (inductively coupled plasma) etching, using CF$_4$, Cl$_2$, and O$_2$ as etching gas, setting the gas flow rate ratio thereof to 25:25:10 (seem), and applying an RF (13.56 MHz) power of 500 W to a coiled electrode at a pressure of 1 Pa to generate plasma for etching. The substrate side (sample stage) also receives an RF (13.56 MHz) power of 150 W to apply a substantially negative self-bias voltage. The W film is etched under these first etching conditions to taper the first conductive layer around the edges.

Thereafter, the first etching conditions are switched to the second etching conditions without removing the resist masks 605 to 615. The second etching conditions include using CF$_4$ and Cl$_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power (13.56 MHz) of 20 W to apply a substantially negative self-bias voltage. Under the second etching conditions where a mixture of $CF_4$ and $Cl_2$ is used, the W film and the TaN film are etched to the same degree. In order to etch the films without leaving any residue on the gate insulating film, the etching time is increased by around 10 to 20%.

In the first etching treatment, the first conductive layer and the second conductive layer are tapered around their edges by the effect of the bias voltage applied to the substrate side if the resist masks have appropriate shapes. The angle of the tapered portions is 15 to 45°. In this way, first shape conductive layers 617 to 622 consisting of the first conductive layer and the second conductive layer (first conductive layers 617a to 622a and second conductive layers 617b to 622b) are formed through the first etching treatment. Denoted by 616 is a gate insulating film, and regions of the gate insulating film that are not covered with the first shape conductive layers 617 to 622 are etched and thinned by about 20 to 50 nm.

Next follows the second etching treatment with the resist masks kept in place (FIG. 24C). Here, $CF_4$, $Cl_2$ and $O_2$ are used as etching gas to etch the W film selectively. Second conductive layers 628b to 633b are formed through the second etching treatment. On the other hand, the first conductive layers 617a to 622a are hardly etched in this treatment and second shape conductive layers 628 to 633 are formed.

Without removing the resist masks, the first doping treatment is conducted to dope the islands with an impurity element that gives the n-type conductivity in low concentration. The doping treatment employs ion doping or ion implantation. The ion doping conditions include setting the dose to $1\times10^{13}$ to $5\times10^{14}$ atoms/cm$^2$ and the acceleration voltage to 40 to 80 kV. In this embodiment, the dose is set to $1.5\times10^{13}$ atoms/cm$^2$ and the acceleration voltage is set to 60 kV. An impurity element that gives the n-type conductivity is an element belonging to Group 15, typically, phosphorus (P) or arsenic (As). This embodiment employs phosphorus (P). In this case, the conductive layers 628 to 633 serve as masks against the impurity element that gives the n-type conductivity and impurity regions 623 to 627 are formed in a self-aligning manner. The impurity regions 623 to 627 are doped with the impurity element that gives the n-type conductivity in a concentration of $1\times10^{18}$ to $1\times10^{20}$ /cm$^3$.

The resist masks are removed and new resist masks 634a to 634c are formed for the second doping treatment. The acceleration voltage is higher in the second doping treatment than in the first doping treatment. The ion doping conditions include setting the dose to $1\times10^{13}$ to $1\times10^{15}$ atoms/cm$^2$ and the acceleration voltage to 60 to 120 kV. In the second doping treatment, the second conductive layers 628b to 632b are used as masks against the impurity element and the islands under the tapered portions of the first conductive layers are doped with the impurity element. Then, the third doping treatment is carried out with the acceleration voltage set lower than that in the second doping treatment to obtain the state of FIG. 25A. The ion doping conditions include setting the dose to $1\times10^{15}$ to $1\times10^{17}$ atoms/cm$^2$ and the acceleration voltage to 50 to 100 kV. As a result of the second and third doping treatments, low concentration impurity regions 636, 642, and 648 overlapping the first conductive layers are doped with an impurity element that gives the n-type conductivity in a concentration of $1\times10^{18}$ to $5\times10^{19}$/cm$^3$, and high concentration impurity regions 635, 641, 644, and 647 are doped with an impurity element that gives the n-type conductivity in a concentration of $1\times10^{19}$ to $5\times10^{21}$/cm$^3$.

If the acceleration voltage is suitably set, the second doping treatment and the third doping treatment can be integrated, so that the low concentration impurity regions and high concentration impurity regions are formed in one doping treatment.

Next, the resist masks are removed and new resist masks 650a to 650c are formed for the fourth doping treatment. Through the fourth doping treatment, impurity regions 653, 654, 659, and 660 are formed in the islands that are to serve as active layers of p-channel TFTs. The impurity regions 653, 654, 659, and 660 are doped with an impurity element that gives the conductivity reverse to the n-type conductivity. In the fourth doping treatment, the second conductive layers 628a to 632a are used as masks against the impurity element. In this way, the impurity regions doped with an impurity element that gives the p-type conductivity are formed in a self-aligning manner. The impurity regions 653, 654, 659 and 660 in this embodiment are formed by ion doping using diborane ($B_2H_6$) (FIG. 25B). In the fourth doping treatment, the islands for forming n-channel TFTs are covered with the resist masks 650a to 650c. The impurity regions 653, 654, 659, and 660 have been doped with phosphorus by the first through the third doping treatment in different concentrations. However, any of the impurity regions is doped in the fourth doping treatment with an impurity element that gives the p-type conductivity in a concentration of $1\times10^{19}$ to $5\times10^{21}$ atoms/cm$^2$. Therefore, the impurity regions have no problem in functioning as source regions and drain regions of p-channel TFTs.

Through the above steps, impurity regions are formed in the respective islands.

Next, the resist masks 650a to 650c are removed and a first interlayer insulating film 661 is formed. This first interlayer insulating film 661 is an insulating film containing silicon and is formed by plasma CVD or sputtering to a thickness of 100 to 200 nm. In this embodiment, a silicon oxynitride film is formed by plasma CVD to a thickness of 150 nm. The first interlayer insulating film 661 is not limited to the silicon oxynitride film but may be a single layer or laminate of other insulating films containing silicon.

Next, a laser irradiation method is used as shown in FIG. 25C for activation treatment. If laser annealing is chosen, the laser that has been used in crystallization can be employed. In activation, the mobility is set to the same level as the mobility in crystallization and the energy density required is 0.01 to 100 MW/cm$^2$ (preferably 0.01 to 10 MW/cm$^2$). It is also possible to use a continuous wave laser in crystallization and a pulse oscillation laser in activation.

The activation treatment may be conducted before the first interlayer insulating film is formed.

Then, thermal processing (heat treatment at 300 to 550° C. for 1 to 12 hours) is conducted for hydrogenation. This step is to terminate dangling bonds in the islands using hydrogen that is contained in the first interlayer insulating film 661. Examples of alternative hydrogenation means include plasma hydrogenation using hydrogen that is excited by plasma, and heat treatment conducted in an atmosphere which contains 3 to 100% of hydrogen at 300 to 650° C. for 1 to 12 hours. In this case, the semiconductor layers can be hydrogenated irrespective of presence or absence of the first interlayer insulating film.

On the first interlayer insulating film 661, a second interlayer insulating film 662 is formed from an inorganic insulating material or an organic insulating material. In this embodiment, an acrylic resin film is formed to a thickness of 1.6 µm. Next, a third interlayer insulating film 672 is formed after the formation of the second interlayer insulating film 662 so as to come into contact with the second interlayer insulating film 662.

Figure 26:
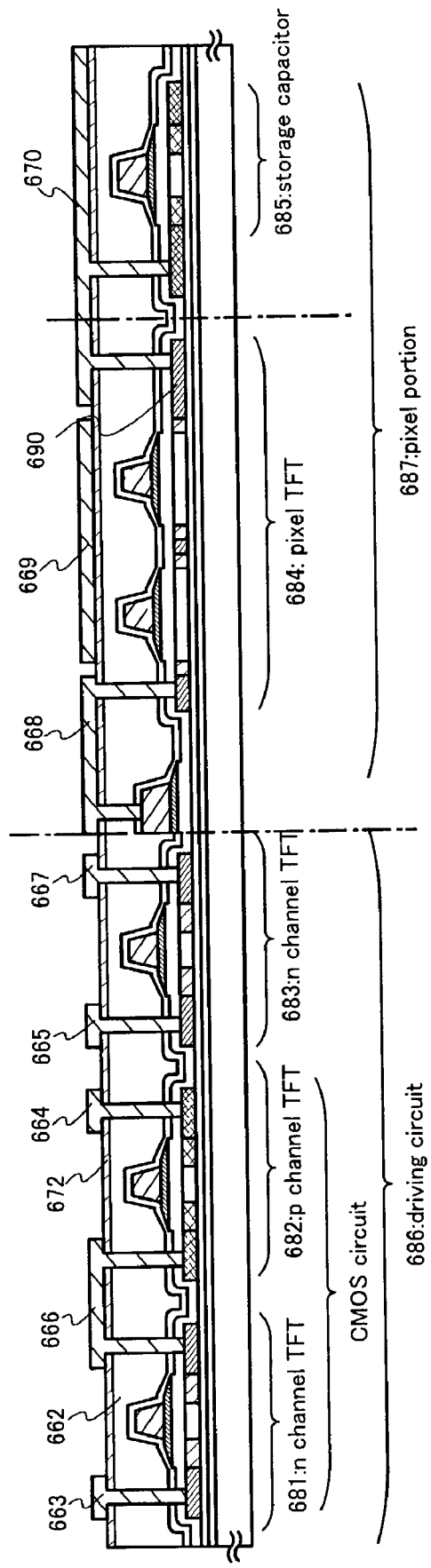
FIG. 26 is a diagram showing a method of manufacturing a semiconductor device which uses a laser irradiation method of the present invention.

Subsequently, wirings 663 to 668 are formed to be electrically connected to the respective impurity regions in a driving circuit 686. These wirings are formed by patterning a laminate of a 50 nm thick Ti film and 500 nm thick alloy film (Al—Ti alloy film). The wirings are not limited to the two-layer structure and may take a single-layer structure or a multi-layer structure with three or more layers. Wiring materials are not limited to Al and Ti. For example, the wirings may be formed by patterning a laminate film in which an Al film or a Cu film is formed on a TaN film and a Ti film is formed thereon (FIG. 26).

In a pixel portion 687, a pixel electrode 670, a gate wiring 669, and a connection electrode 668 are formed. The connection electrode 668 allows source wirings (a laminate of 643a and 643b) to electrically connect with a pixel TFT. The gate wiring 669 forms an electrical connection with a gate electrode of the pixel TFT. The pixel electrode 670 forms an electrical connection with a drain region 690 of the pixel TFT and another electrical connection with an island 685 that functions as one of electrodes constituting capacitor storage. In this patent application, the pixel electrode and the connection electrode are formed from the same material. Desirably, the pixel electrode 670 is formed from a material having excellent reflectivity, for example, a film mainly containing Al or Ag, or a laminate of such films.

The driving circuit 686, which has a CMOS circuit composed of an n-channel TFT 681 and a p-channel TFT 682 and has an n-channel TFT 683, and the pixel portion 687, which has a pixel TFT 684 and capacitor storage 685, can thus be formed on the same substrate. In this way, an active matrix substrate is completed.

The n-channel TFT 681 of the driving circuit 686 has a channel formation region 637, the low concentration impurity regions 636 (GOLD (gate overlapped LDD) region), and high concentration impurity regions 652. The low concentration impurity regions 636 overlap the first conductive layer 628a that constitutes a part of a gate electrode. One of the high concentration impurity regions 652 serves as a source region and the other serves as a drain region. Connected to this n-channel TFT 681 through an electrode 666 to form the CMOS circuit is the p-channel TFT 682. The p-channel TFT 682 has a channel formation region 640, the high concentration impurity regions 653, and the impurity regions 654. One of the high concentration impurity regions 653 serves as a source region and the other serves as a drain region. The impurity regions 654 have introduced therein an impurity element that gives the p-type conductivity. The n-channel TFT 683 has a channel formation region 643, the low concentration impurity regions 642 (GOLD regions), and high concentration impurity regions 656. The low concentration impurity regions 642 overlap the first conductive layer 630a that constitutes a part of a gate electrode. One of the high concentration impurity regions 656 serves as a source region and the other serves as a drain region.

The pixel TFT 684 of the pixel portion has a channel formation region 646, the low concentration impurity regions 645 (LDD regions), and high concentration impurity regions 658. The low concentration impurity regions 645 are formed outside of the gate electrode. One of the high concentration impurity regions 658 serves as a source region and the other serves as a drain region. The island that serves as one of electrodes of the capacitor storage 685 is doped with an impurity element that gives the n-type conductivity and an impurity element that gives the p-type conductivity. The capacitor storage 685 is composed of an electrode (a laminate of 632a and 632b) and an island with the insulating film 616 as dielectric.

According to the pixel structure of this embodiment, edges of a pixel electrode overlap a source wiring so that the gap between pixel electrodes is shielded against light without using a black matrix.

This embodiment can be combined with Embodiments 1 through 4.

Embodiment 6

This embodiment describes a process of manufacturing a reflective liquid crystal display device from the active matrix substrate that is manufactured in Embodiment 5. The description is given with reference to FIG. 27.

First, an active matrix substrate in the state of FIG. 26 is obtained following the description in Embodiment 5. On the active matrix substrate of FIG. 26, at least on the pixel electrode 670, an orientation film 867 is formed and subjected to rubbing treatment. In this embodiment, before forming the orientation film 867, an acrylic resin film or other organic resin film is patterned to form in desired positions columnar spacers 872 for keeping the gap between substrates. Instead of the columnar spacers, spherical spacers may be sprayed onto the entire surface of the substrate.

Next, an opposite substrate 869 is prepared. Colored layers 870 and 871 and a planarization film 873 are formed on the opposite substrate 869. The red colored layer 870 and the blue colored layer 871 are overlapped to form a light-shielding portion. Alternatively, a red colored layer and a green colored layer may be partially overlapped to form a light-shielding portion.

This embodiment uses the substrate shown in Embodiment 5. Therefore, at least the gap between the gate wiring 669 and the pixel electrode 670, the gap between the gate wiring 669 and the connection electrode 668, and the gap between the connection electrode 668 and the pixel electrode 670 have to be shielded against light. In this embodiment, the colored layers are arranged such that the light-shielding portion that is a laminate of the colored layers overlaps these gaps to be shielded against light. Then, the opposite substrate is bonded.

The number of steps is thus reduced by using a light-shielding portion that is a laminate of colored layers to shield gaps between pixels against light instead of forming a light-shielding layer such as a black mask.

Next, a transparent conductive film is formed as an opposite electrode 876 on the planarization film 873 at least in the pixel portion. An orientation film 874 is formed on the entire surface of the opposite substrate and is subjected to rubbing treatment.

Figure 27:
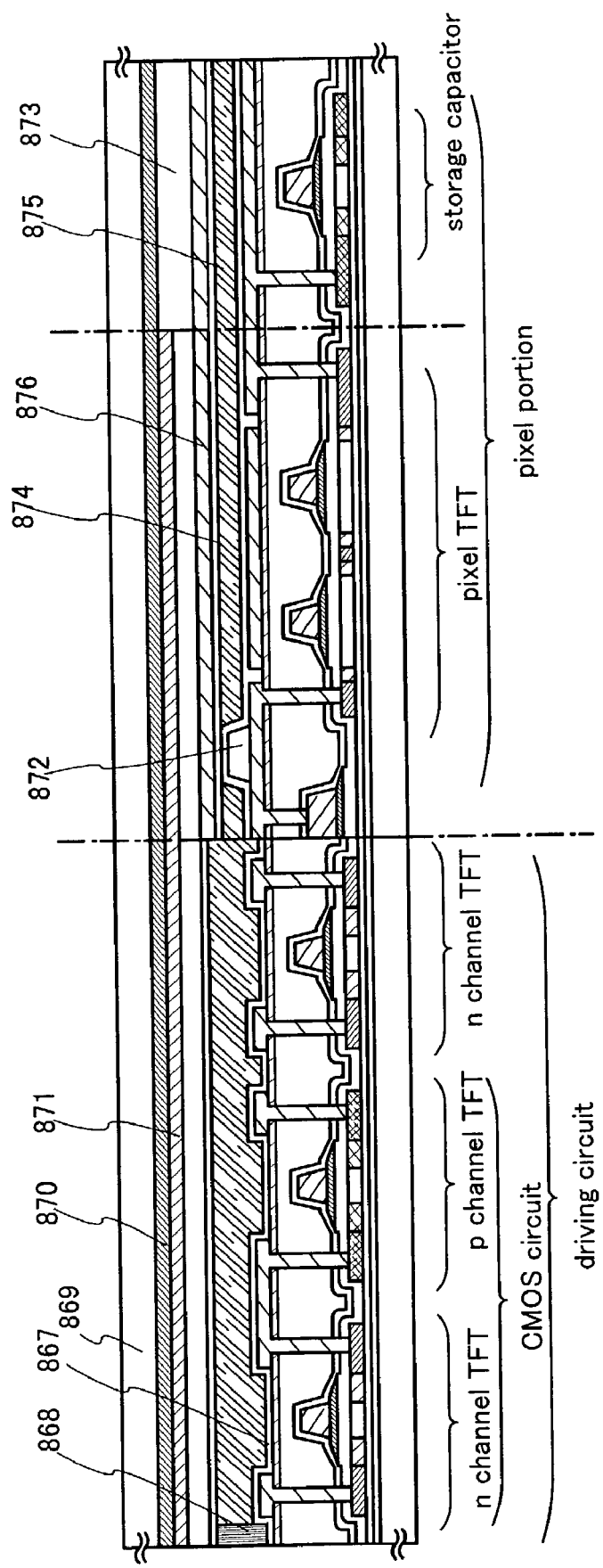
FIG. 27 is a diagram of a liquid crystal display device manufactured by using a laser irradiation method of the present invention.

Then, the opposite substrate is bonded by a seal member 868 to the active matrix substrate on which the pixel portion and the driving circuit are formed. The seal member 868 has fillers mixed therein, and the fillers together with the columnar spacers keep the gap uniform between the two substrates while they are bonded. Thereafter, a liquid crystal material 875 is injected to the space between the two substrates and the device is completely sealed with a sealing agent (not shown in the drawing). The liquid crystal material 875 is a known liquid crystal material. In this way, a reflective liquid crystal display device shown in FIG. 27 is completed. If necessary, the active matrix substrate or the opposite substrate is cut into pieces of desired shapes. A polarizing plate (not shown in the drawing) is then bonded to the opposite substrate alone. Thereafter, an FPC is bonded by a known technique.

The thus manufactured liquid crystal display device has TFTs formed from a semiconductor film that has crystal grains of large grain size formed through irradiation by laser light with periodic or uniform energy distribution. This gives the liquid crystal display device satisfactory operation characteristics and reliability. Such liquid crystal display device can be used as a display unit of various electronic equipment.

This embodiment can be combined with Embodiments 1 through 5.

Embodiment 7

This embodiment describes an example of manufacturing a light emitting device using the TFT manufacturing method when manufacturing the active matrix substrate shown in Embodiment 5. "Light emitting device" is a generic term for a display panel in which a light emitting element is formed on a substrate and sealed between the substrate and a cover member, and for a display module obtained by mounting a TFT and the like to the display panel. A light emitting element has a layer containing an organic compound that provides luminescence upon application of electric field (electroluminescence), as well as an anode layer and a cathode layer. Luminescence obtained from organic compounds is classified into light emission upon return to the base state from singlet excitation (fluorescence) and light emission upon return to the base state from triplet excitation (phosphorescence). The present invention includes one or both of the two types of light emission.

In this specification, all the layers that are formed between a cathode and an anode in a light emitting element are collectively defined as an organic light emitting layer. Specifically, an organic light emitting layer includes a light emitting layer, a hole injection layer, an electron injection layer, a hole transporting layer, an electron transporting layer, etc. The basic structure of a light emitting element is a laminate of an anode layer, light emitting layer, and cathode layer layered in this order. The basic structure may be modified into a laminate in which an anode layer, a hole injection layer, a light emitting layer, a cathode layer, etc. are layered in this order, or a laminate in which an anode layer, a hole injection layer, a light emitting layer, an electron transporting layer, a cathode layer, etc. are layered in this order.

A light emitting element used in this embodiment may also take a mode in which a hole injection layer, an electron injection layer, a hole transporting layer, or an electron transporting layer is formed solely of an inorganic compound or from a material obtained by mixing an inorganic compound with an organic compound. The layers listed may be partially mixed with one another.

Figure 28A:
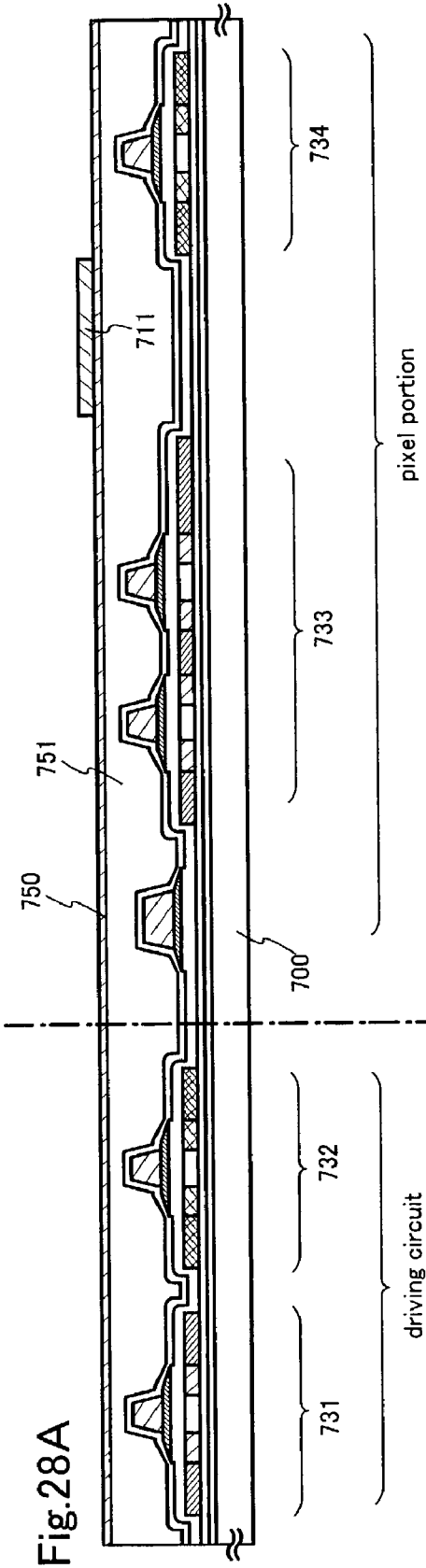
FIGS. 28A and 28B are diagrams showing a method of manufacturing a light emitting device which uses a laser irradiation method of the present invention.

FIG. 28A is a sectional view of a light emitting device of this embodiment where manufacturing process is finished up through formation of a third interlayer insulating film 750. In FIG. 28A, a switching TFT 733 and a current controlling TFT 734 on a substrate 700 are formed by the manufacturing method of Embodiment 5. The switching TFT 733 in this embodiment has a double gate structure in which two channel formation regions are formed. However, the switching TFT 733 may take a single gate structure having one channel formation region or a structure having three or more channel formation regions. The current controlling TFT 734 in this embodiment has a single gate structure in which one channel formation region is formed, but it may take a structure having two or more channel formation regions.

An n-channel TFT 731 and p-channel TFT 732 of a driving circuit on the substrate 700 are formed by the manufacturing method of Embodiment 5. The TFTs have a single gate structure in this embodiment, but may take a double gate structure or a triple gate structure.

The third interlayer insulating film 750 is, in a light emitting device, effective in preventing moisture contained in a second interlayer insulating film 751 from entering an organic light emitting layer. When the second interlayer insulating film 751 has an organic resin material, forming the third interlayer insulating film 750 is particularly effective since organic resin materials contain a lot of moisture.

After the process of Embodiment 5 is finished up through the step of forming the third interlayer insulating film, a pixel electrode 711 is formed on the third interlayer insulating film 750 in this embodiment.

The pixel electrode 711 is a pixel electrode formed from a transparent conductive film (an anode of a light emitting element). The transparent conductive film used may be formed from a compound of indium oxide and tin oxide or a compound of indium oxide and zinc oxide, or from zinc oxide alone, tin oxide alone, or indium oxide alone. The transparent conductive film doped with gallium may be used. The pixel electrode 711 is formed on the flat third interlayer insulating film 750 before wirings are formed. In this embodiment, it is very important to use a second interlayer insulating film 751 formed of a resin to level the level differences caused by the TFTs. If there are level differences, they may cause defective light emission since a light emitting layer which is formed later is very thin. Accordingly, the surface should be leveled before the pixel electrode is formed, so that the light emitting layer can be formed on as flat a surface as possible.

Figure 28B:
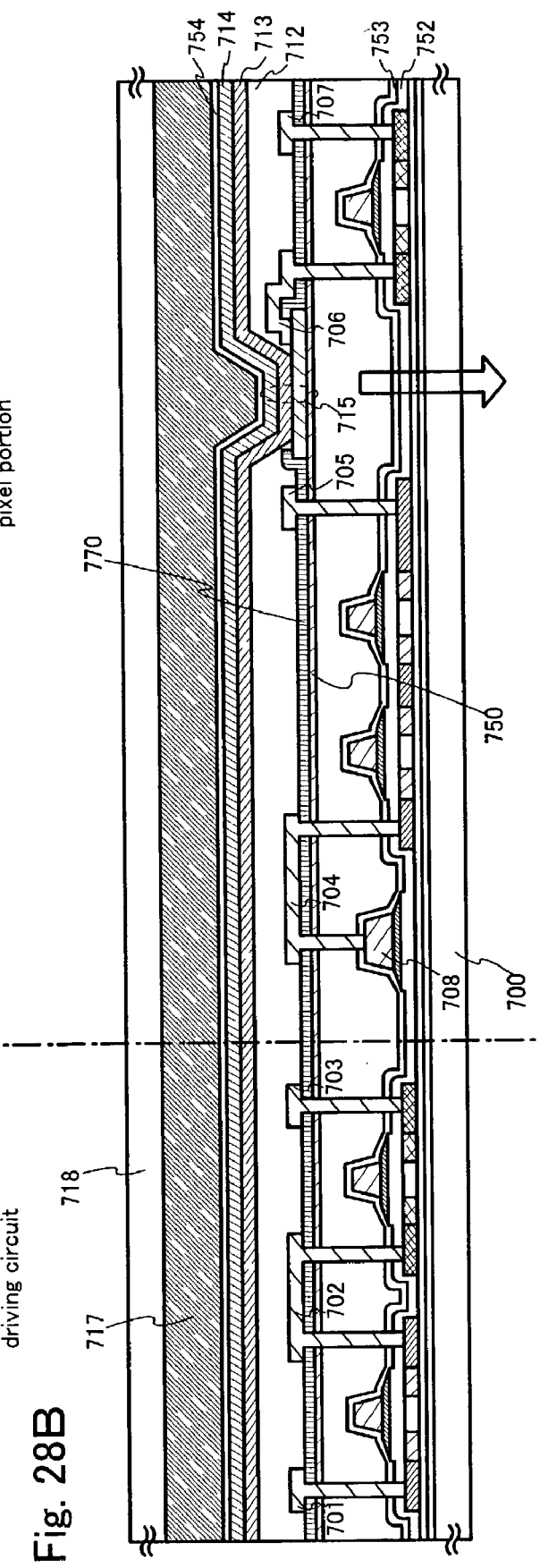

Next, as shown in FIG. 28B, a resin film dispersed with black dye, carbon, or black pigments is formed so as to cover the third interlayer insulating film 750. An opening is formed in the film at a position where a light emitting element is formed. This film serves as a light-shielding film 770. The material of the resin film is typically polyimide, polyamide, acrylic, or BCB (benzocyclobutene), but is not limited thereto. Examples of other light-shielding film materials than organic resins include silicon, silicon oxide, silicon oxynitride, and the like with black dye, carbon, or black pigments mixed therein. The light-shielding film 770 has an effect of preventing external light reflected by wirings 701 to 707 from reaching eyes of a viewer.

After the pixel electrode 711 is formed, contact holes are formed in a gate insulating film 752, a first interlayer insulating film 753, the second interlayer insulating film 751, the third interlayer insulating film 750, and the light-shielding film 770. Then a conductive film is formed on the light-shielding film 770 to cover the pixel electrode 711. The conductive film is etched to form wirings 701 to 707 that are electrically connected to impurity regions of the respective TFTs. These wirings are formed by patterning a laminate of a 50 nm thick Ti film and 500 nm thick alloy film (an alloy of Al and Ti). The wirings are not limited to the two-layer structure and may take a single-layer structure or a multi-layer structure of three or more layers. Wiring materials are not limited to Al and Ti. For example, the wirings may be formed by patterning a laminate film in which an Al film or a Cu film is formed on a TaN film and a Ti film is formed thereon (FIG. 28A).

The wiring 707 is a source wiring (corresponding to a current supply line) of the current controlling TFT. The wiring 706 is an electrode that electrically connects a drain region of the current controlling TFT with the pixel electrode 711.

After the wirings 701 to 707 are formed, a bank 712 is formed from a resin material.

The bank 712 is formed by patterning acrylic film or polyimide film with a thickness of 1 to 2 µm so as to expose a part of the pixel electrode 711.

A light emitting layer 713 is formed on the pixel electrode 711. Although only one pixel is shown in FIG. 28B, three types of light emitting layers for R (red), G (green), and B (blue) colors are formed in this embodiment. The light emitting layers in this embodiment are formed by evaporation from low-molecular weight organic light emitting materials. Specifically, a copper phthalocyanine (CuPc) film with a thickness of 20 nm is formed as a hole injection layer and a tris-8-quinolinolate aluminum complex ($Alq_3$) film is layered thereon as a light emitting layer. The color of emitted light can be controlled by doping $Alq_3$ with a fluorescent pigment such as quinacridon, perylene, or DCM1.

However, the materials given in the above are merely examples of organic light emitting materials that can be used as light emitting layers and there is no need to exclusively use them. A light emitting layer (a layer in which carriers are moved to thereby emit light) is formed by freely combining a light emitting layer with an electric charge transporting layer or an electric charge injection layer. Although a low-molecular weight organic light emitting material is used for a light emitting layer in the example shown in this embodiment, an intermediate-molecular weight organic light emitting material or a high-molecular weight organic light emitting material may be used instead. In this specification, an organic light emitting material with no sublimation property in which the number of molecules is 20 or less and the length of molecular chain is 10 µm or less is called an intermediate-molecular weight organic light emitting material. As an example of employing a high-molecular weight organic light emitting material, a laminate structure may be adopted in which a polythiophene (PEDOT) film is formed as a hole injection layer by spin coating to a thickness of 20 nm and a paraphenylene vinylene (PPV) film with a thickness of about 100 nm is layered thereon as a light emitting layer. If a π-conjugate polymer of PPV is used, a light emission wavelength ranging from red to blue can be chosen. Inorganic materials such as silicon carbide can be used for an electric charge transporting layer and an electric charge injection layer. These organic light emitting materials and inorganic materials may be known materials.

Next, a cathode 714 is formed from a conductive film on the light emitting layer 713. In this embodiment, the conductive film is a film of an alloy of aluminum and lithium. A known MgAg film (a film of an alloy of magnesium and silver) may also be used. It is sufficient if the cathode material is a conductive film formed of an element that belongs to Group 1 or 2 in the periodic table or a conductive film doped with such element.

With formation of the cathode 714, a light emitting element 715 is completed. The light emitting element 715 here refers to a diode composed of the pixel electrode (anode) 711, the light emitting layer 713, and the cathode 714.

A protective film 754 may be provided so as to completely cover the light emitting element 715. A carbon film or insulating films including a silicon nitride film and a silicon oxynitride film can be used for the protective film 754, which is a single layer or laminate of those films.

Preferably, a film with good coverage is used as the protective film 754. A carbon film, especially DLC (diamond-like carbon) film is effective. A DLC film can be formed at a temperature ranging from room temperature to 100° C. or less and therefore it is easy to form a DLC film above the light emitting layer 713, which has low heat resistance. Also, a DLC film has high oxygen blocking effect and is capable of preventing oxidization of the light emitting layer 713. Therefore, a problem of the light emitting layer 713 being oxidized during the subsequent sealing step can be avoided.

In this embodiment, the light emitting layer 713 is completely covered with an inorganic insulating film such as a carbon film, a silicon nitride film, a silicon oxynitride film, an aluminum nitride film, or an aluminum oxynitride film, which serves well as a barrier. Therefore, degradation of the light emitting layer due to moisture, oxygen, and the like seeping into the light emitting layer can be prevented more effectively.

Prevention of the intrusion of impurities into the light emitting layer becomes more thorough if silicon nitride films formed by sputtering with silicon as the target are used particularly for a third insulating film 750, a passivation film 712, and the protective film 754. The film formation conditions can be suitably chosen. Particularly preferable conditions include using nitrogen ($N_2$) or a mixture gas of nitrogen and argon as sputtering gas and applying a high-frequency power for sputtering. The substrate temperature is set to room temperature and no heating means is necessary. If an organic insulating film and an organic compound layer have already been formed, it is desirable to form the silicon nitride films without heating the substrate. However, heating in vacuum for several minutes to several hours at 50 to 100° C. for dehydrogenation treatment is preferable in order to thoroughly remove adsorbed or occluded moisture.

Silicon nitride films formed from nitrogen gas alone by sputtering at room temperature using silicon as the target and applying a 13.56 MHz high-frequency power are characterized in that the absorption peaks of N—H bond and Si—H bond are not observed in its infrared absorption spectrum and neither is the absorption peak of Si—O bond, and the oxygen concentration and hydrogen concentration in these silicon nitride films are each 1 atomic % or less. This is another proof of effectiveness of the silicon nitride films in preventing the intrusion of impurities such as oxygen and moisture.

The light emitting element 715 is further covered with a sealing member 717 and a cover member 718 is bonded thereto. A UV-curable resin can be used as the sealing member 717 and it is effective to put a hygroscopic material or antioxidant inside the sealing member. The cover member 718 used in this embodiment is a glass substrate, quartz substrate, or plastic substrate (or plastic film) with a carbon film (preferably diamond-like carbon film) formed on each side.

In this way, a light emitting device structured as shown in FIG. 28B is completed. As to the steps following formation of the bank 712, it is effective to process in succession without exposing the device to the air until after the protective film is formed. An advanced version of this is to process in succession without exposing the device to the air until after the cover member 718 is bonded.

The n-channel TFTs 731 and 732, the switching TFT (n-channel TFT) 733, and the current controlling TFT (n-channel TFT) 734 are thus formed on the substrate 700.

The light-shielding film 770 is formed between the third interlayer insulating film 750 and the bank 712 in this embodiment. However, the present invention is not limited to this structure. The important thing about placement of light-shielding film is that it has to be placed in such a position that can prevent external light reflected by the wirings 701 to 707 from reaching eyes of a viewer. For instance, if light emitted from the light emitting element 715 travels toward the substrate 700 side as in this embodiment, the light-shielding film may be placed between the first interlayer insulating film 753 and the second interlayer insulating film 751. In this case also, the light-shielding film has an opening to let light from the light emitting element to pass therethrough.

As described with reference to FIGS. 28A and 28B, an n-channel TFT that is not easily degraded by the hot carrier effect can be formed by providing an impurity region that overlaps a gate electrode with an insulating film sandwiched therebetween. Therefore, a highly reliable light emitting device is obtained.

Although this embodiment shows the structures of the pixel portion and driving circuit alone, logic circuits such as a signal divider circuit, a D/A converter, an operation amplifier, and a y correction circuit can be formed on the same insulator in addition to the pixel portion and the driving circuit by following the manufacturing process of this embodiment. Furthermore, a memory and a micropro- cessor can be formed on the same insulator.

The thus manufactured light emitting device has TFTs formed from a semiconductor film that has crystal grains of large grain size formed through irradiation by laser light with periodic or uniform energy distribution. This gives the light emitting device satisfactory operation characteristics and reliability. Such light emitting device can be used as a display unit of various electronic equipment.

Light emitted from the light emitting element travels toward the TFT side in this embodiment. Alternatively, light from the light emitting element may travel in the opposite direction of the TFTs. In this case, a resin with black dye, carbon, or black pigments mixed therein can be used for the bank. A sectional view of a light emitting device in which light emitted from a light emitting element travels in the opposite direction of TFTs is shown in FIG. 33.

Figure 33:
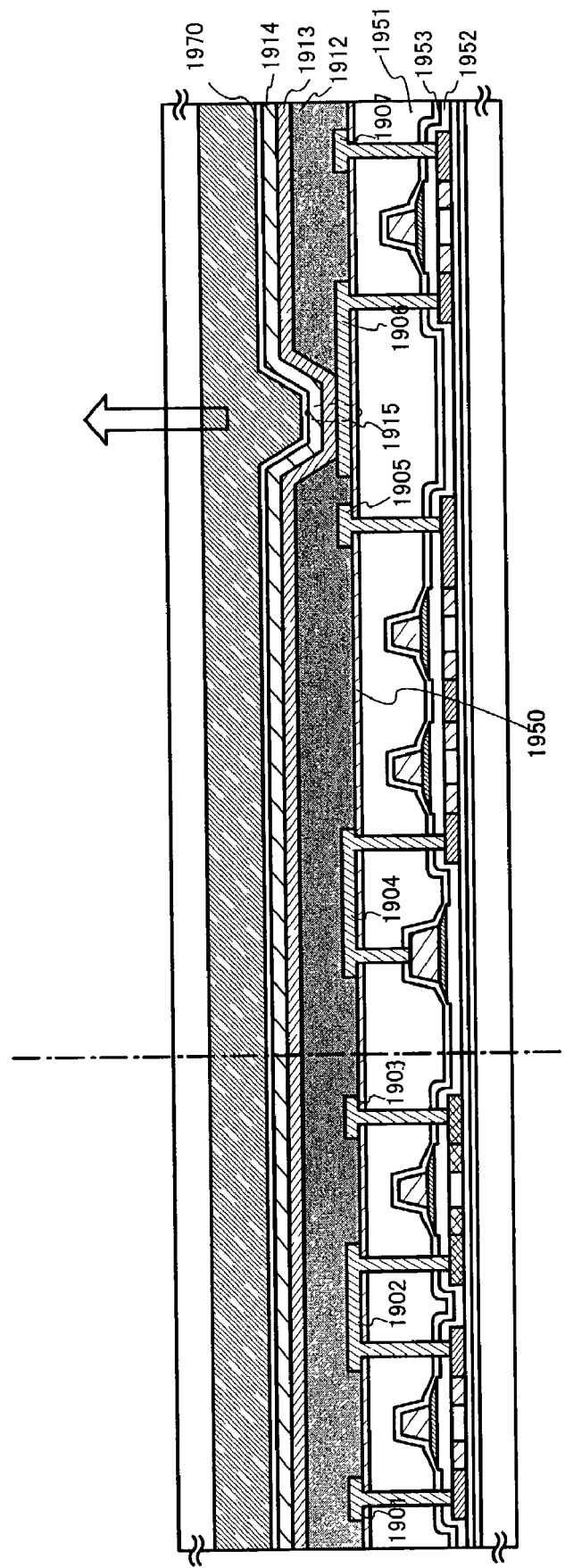
FIG. 33 is a sectional view of a light emitting device using a laser irradiation method of the present invention.

In FIG. 33, after a third interlayer insulating film 1950 is formed, contact holes are formed in a gate insulating film 1952, a first interlayer insulating film 1953, a second interlayer insulating film 1951, and the third interlayer insulating film 1950. Then, a conductive film is formed on the third interlayer insulating film 1950 and is etched to form wirings 1901 to 1907 that are electrically connected to impurity regions of the respective TFTs. These wirings are formed by patterning an aluminum alloy film (an aluminum film con- taining 1 wt % of titanium) with a thickness of 300 nm. The wirings are not limited to a single-layer structure and may take a multi-layer structure having two or more layers. Wiring materials are not limited to Al and Ti. A part of the wiring 1906 doubles as a pixel electrode.

After the wirings 1901 to 1907 are formed, a bank 1912 is formed from a resin material. The bank 1912 is formed by patterning a resin film with black dye, carbon, or black pigments mixed therein, having a thickness of 1 to 2 µm so as to expose a part of the pixel electrode 1906. The material of the resin film is typically polyimide, polyamide, acrylic, or BCB (benzocyclobutene), but is not limited thereto.

A light emitting layer 1913 is formed on the pixel elec- trode 1906. Then, an opposite electrode (an anode of a light emitting element) is formed from a transparent conductive material to cover the light emitting layer 1913. The trans- parent conductive film used may be formed from a com- pound of indium oxide and tin oxide or a compound of indium oxide and zinc oxide, or from zinc oxide alone, tin oxide alone, or indium oxide alone. The transparent con- ductive film may be doped with gallium.

The pixel electrode 1906, the light emitting layer 1913, and an opposite electrode 1914 constitute a light emitting element 1915.

A light-shielding film 1970 has an effect of preventing external light reflected by the wirings 1901 to 1907 from reaching eyes of a viewer.

This embodiment can be combined with any one of Embodiments 1 through 6.

Embodiment 8

This embodiment describes the structure of a pixel in a light emitting device that is one of semiconductor devices of the present invention. A sectional view of a pixel in a light emitting device of this embodiment is shown in FIG. 29.

Figure 29:
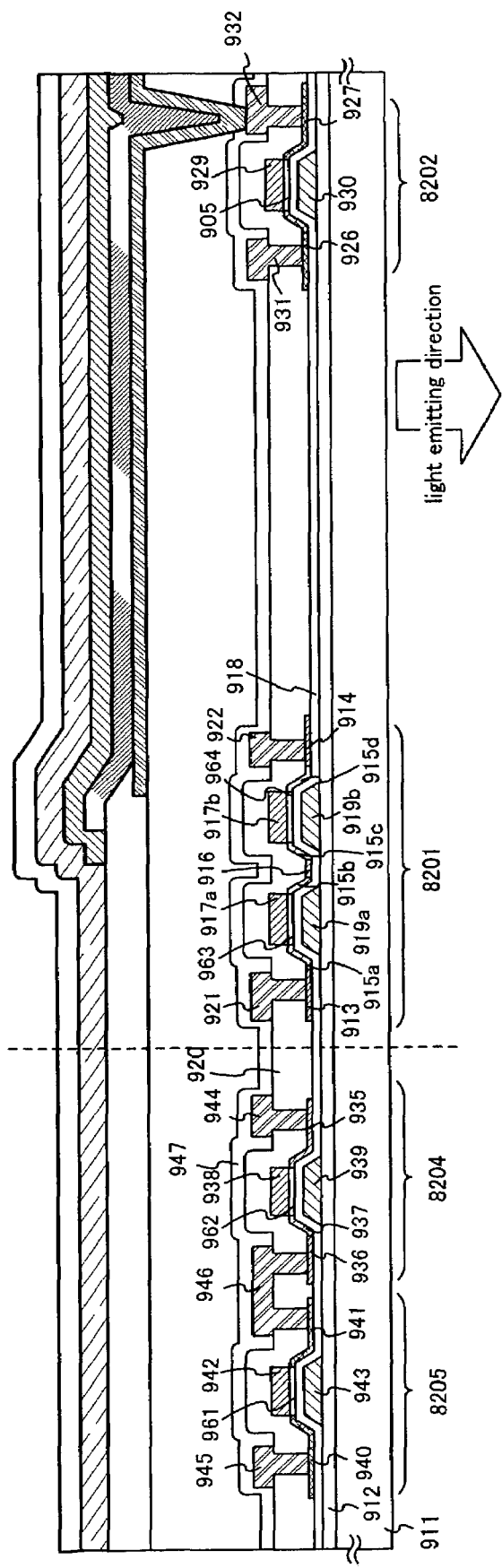
FIG. 29 is a sectional view of a light emitting device using a laser irradiation method of the present invention.

In FIG. 29, 911 denotes a substrate and 912 denotes an insulating film that serves as a base (hereinafter referred to as base film). The substrate 911 is a light-transmissive substrate, typically, a glass substrate, a quartz substrate, a glass ceramic substrate, or a crystallized glass substrate. However, one that can withstand the highest processing temperature of the manufacturing process has to be chosen.

Denoted by 8201 is a switching TFT that is an n-channel TFT and 8202 is a current controlling TFT that is a p-chan- nel TFT. When light is emitted from an organic light emitting layer toward the bottom face of a substrate (the side where TFTs and the organic light emitting layer are not formed), the above structure is preferred. However, the switching TFT and the current controlling TFT each can assume both conductivity types and therefore 8201 may be a p-channel TFT and 8202 may be an n-channel TFT.

The switching TFT 8201 has an active layer, a gate insulating film 918, gate electrodes 919a and 919b, a first interlayer insulating film 920, a source signal line 921, and a drain wiring 922. The active layer includes a source region 913, a drain region 914, LDD regions 915a to 915d, a divider region 916 and channel formation regions 963 and 964. The gate insulating film 918 or the first interlayer insulating film 920 may be common to all TFTs on the substrate, or different circuits or elements may have different gate insulating films or different first interlayer insulating films.

In the switching TFT 8201 shown in FIG. 29, the gate electrodes 917a and 917b are electrically connected to each other to form a double-gate structure. The switching TFT 8201 may take other multi-gate structure (a structure includ- ing an active layer that has two or more channel formation regions connected in series) than the double-gate structure, such as a triple-gate structure.

A multi-gate structure is very effective in reducing OFF current. If OFF current of the switching TFT is lowered enough, the minimum capacitance required for capacitor storage that is connected to a gate electrode of the current controlling TFT 8202 can be reduced that much. In other words, it reduces the area of the capacitor storage. It is therefore effective to employ a multi-gate structure in increasing the effective light emission area of a light emit- ting element.

Furthermore, the LDD regions 915a to 915d in the switching TFT 8201 are placed so as to avoid overlap of the LDD regions and the gate electrodes 919a and 919b with the gate insulating film 918 sandwiched therebetween, and this structure is very effective in reducing OFF current. The length (width) of each of the LDD regions 915a to 915d is set to 0.5 to 3.5 µm, typically, 2.0 to 2.5 µm. In a multi-gate structure having two or more gate electrodes, the divider region 916 (a region doped with the same impurity element in the same concentration as the source region or the drain region) provided between the channel formation regions is effective in lowering OFF current.

The current controlling TFT 8202 has an active layer, the gate insulating film 918, a gate electrode 930, the first interlayer insulating film 920, a source signal line 931, and a drain wiring 932. The active layer includes a source region 926, a drain region 927, and a channel formation region 905. The current controlling TFT 8202 in this embodiment is a p-channel TFT.

The drain region 914 of the switching TFT 8201 is connected to the gate electrode 930 of the current controlling TFT 8202. Specifically, though not shown in the drawing, the gate electrode 930 of the current controlling TFT 8202 is electrically connected through the drain wiring (also called a connection wiring) 922 to the drain region 914 of the switching TFT 8201. The gate electrode 930 has a single gate structure but may have a multi-gate structure. The source signal line 931 of the current controlling TFT 8202 is connected to a power supply line (not shown in the drawing).

The description given above is about the structures of the TFTs provided in the pixel. At the same time the TFTs are formed, a driving circuit is also formed. Shown in FIG. 29 is a CMOS circuit that is the basic unit constituting the driving circuit.

In FIG. 29A, a TFT structured to reduce hot carrier injection while avoiding slowing the operation speed as much as possible is used as an n-channel TFT 8204 of the CMOS circuit. The driving circuit here refers to a source signal side driving circuit or a gate signal side driving circuit. Other logic circuits (such as a level shifter, an A/D converter, and a signal divider circuit) may also be formed.

An active layer of the n-channel TFT 8204 of the CMOS circuit includes a source region 935, a drain region 936, an LDD region 937, and a channel formation region 962. The LDD region 937 overlaps a gate electrode 939 with the gate insulating film 918 sandwiched therebetween.

The LDD region 937 is formed only on the drain region 936 side because it prevents slowing of the operation speed. In the n-channel TFT 8204, the OFF current value is not so important and rather the operation speed should be given priority. Accordingly, it is desirable if the LDD region 937 overlaps the gate electrode completely to reduce the resistance component as much as possible. In other words, eliminating offset is preferred.

In a p-channel TFT 8205 of the CMOS circuit, degradation by hot carrier injection is almost ignorable and therefore has no particular need for an LDD region. Accordingly, its active layer includes a source region 940, a drain region 941, and a channel formation region 961. The gate insulating film 918 and a gate electrode 943 are provided under the active layer. It is also possible for the p-channel TFT 8205 to have an LDD region as a countermeasure for hot carrier as in the n-channel TFT 8204.

Denoted by 942, 938, 917a, 917b, and 929 are masks for forming the channel formation regions 961 to 965.

The n-channel TFT 8204 and the p-channel TFT 8205 have above their source regions a source signal line 944 and a source signal line 945, respectively, with first interlayer insulating films 920 (or the first interlayer insulating film 920) sandwiched between the source regions and the source signal lines. The drain regions of the n-channel TFT 8204 and p-channel TFT 8205 are electrically connected to each other by a drain wiring 946.

A laser irradiation method of the present invention can be used in formation of the semiconductor film, crystallization of the active layers, activation, and other steps where laser annealing is used.

Figure 30:
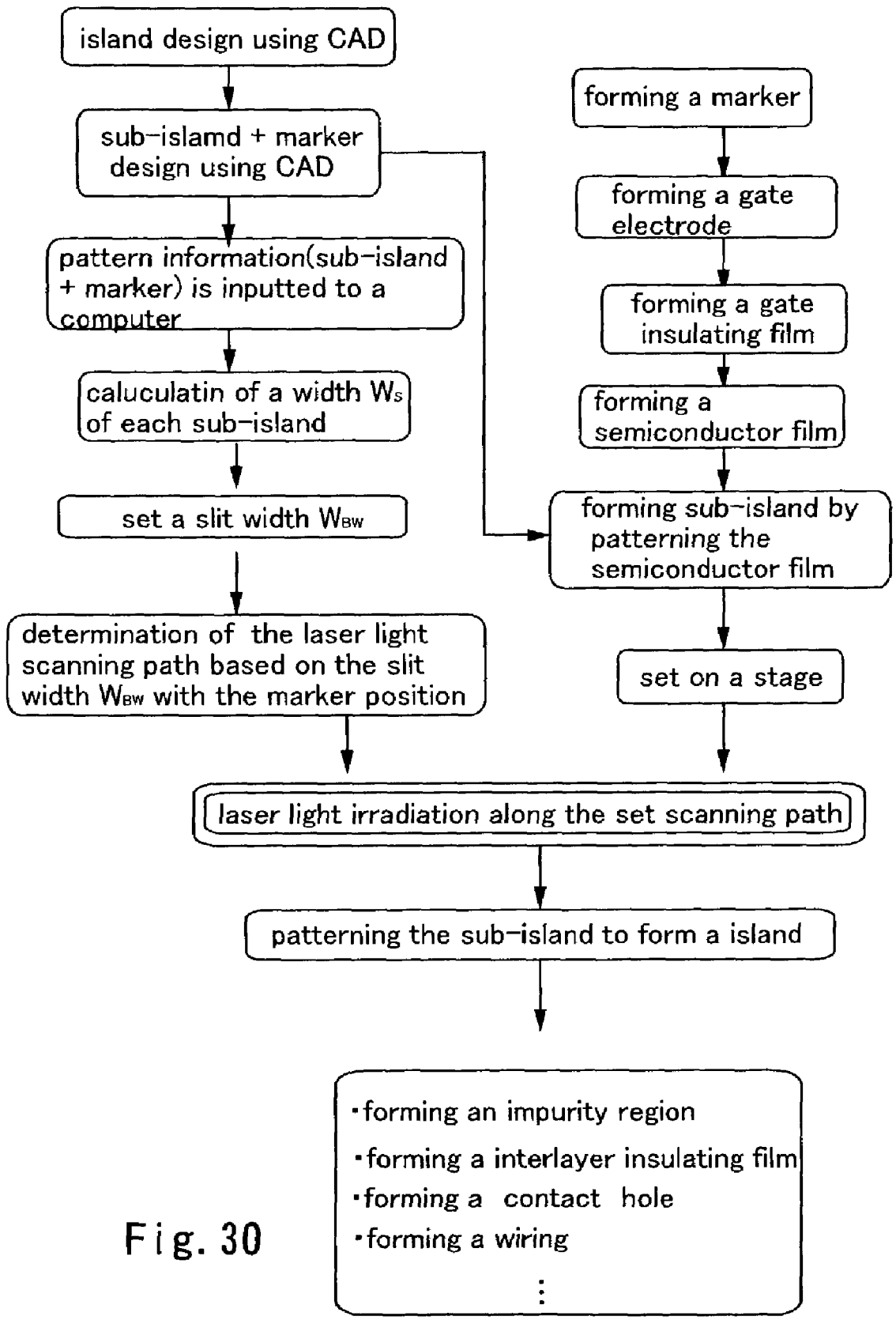
FIG. 30 is a diagram showing the production flow of the present invention.

FIG. 30 shows production flow for manufacturing the light emitting device of this embodiment. First, a semiconductor device is designed using CAD. Specifically, a mask for an island is designed first and then a mask for a sub-island that includes one or more of such islands is designed.

Then, information concerning the shape of the designed mask for a sub-island (pattern information) is inputted to a computer of laser irradiation apparatus. From the sub-island pattern information inputted, the computer calculates a width $W_S$ of each sub-island in the direction perpendicular to the scanning direction. Based on the width $W_S$ of each sub-island, a slit width $W_{BW}$ in the direction perpendicular to the scanning direction is set. The laser light scanning path is determined from the slit width $W_{BW}$ with the position of a marker as the reference.

During this, a gate electrode is formed in accordance with the marker formed on a substrate. Alternatively, the gate electrode and the marker may be formed at the same time. Then a gate insulating film is formed so as to cover the gate electrode and a semiconductor film is formed so as to come into contact with the gate insulating film. The semiconductor film is patterned using the mask for a sub-island to form a sub-island. The substrate on which the sub-island is formed is set on a stage of the laser irradiation apparatus.

With the marker as the reference, laser light is irradiated along the set scanning path targeting the sub-island to crystallize the sub-island.

Thereafter, the sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming an impurity region in the island. Then an interlayer insulating film is formed so as to cover the island. A contact hole is formed in the interlayer insulating film to partially expose the impurity region. A wiring is then formed on the interlayer insulating film to reach the impurity region through the contact hole.

The structure of this embodiment can be combined freely with Embodiments 1 through 7.

Embodiment 9

Figure 31:
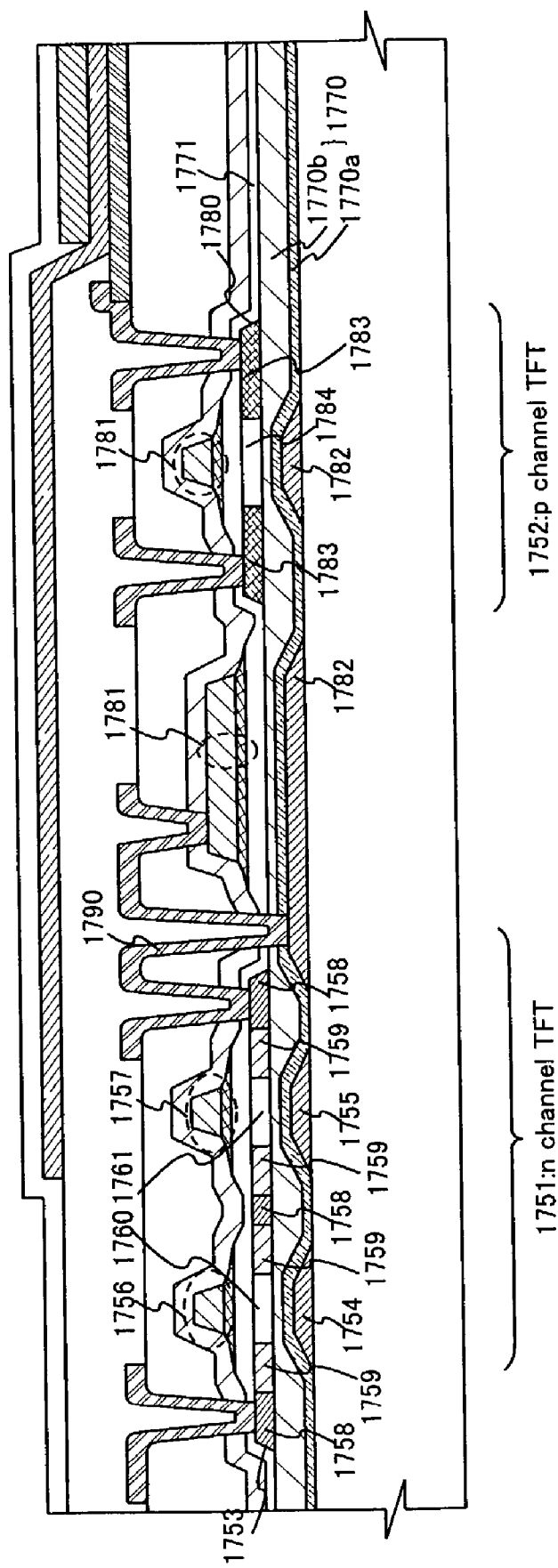
FIG. 31 is a diagram showing a method of manufacturing a light emitting device which uses a laser irradiation method of the present invention.

This embodiment describes the structure of a pixel in a light emitting device that is manufactured using a laser irradiation method of the present invention. A sectional view of a pixel in a light emitting device of this embodiment is shown in FIG. 31.

Denoted by 1751 is an n-channel TFT and 1752, a p-channel TFT. The n-channel TFT 1751 has a semiconductor film 1753, a first insulating film 1770, first electrodes 1754 and 1755, a second insulating film 1771, and second electrodes 1756 and 1757. The semiconductor film 1753 has a first concentration one conductivity type impurity region 1758, a second concentration one conductivity type impurity region 1759, and channel formation regions 1760 and 1761.

The first electrodes 1754 and 1755 overlap the channel formation regions 1760 and 1761, respectively, with the first insulating film 1770 sandwiched between the first electrodes and the channel formation regions. The second electrodes 1756 and 1757 overlap the channel formation regions 1760 and 1761, respectively, with the second insulating film 1771 sandwiched between the second electrodes and the channel formation regions.

The p-channel TFT 1752 has a semiconductor film 1780, the first insulating film 1770, a first electrode 1782, the second insulating film 1771, and a second electrode 1781. The semiconductor film 1780 has a third concentration one conductivity type impurity region 1783 and a channel formation region 1784.

The first electrode 1782 overlaps the channel formation region 1784 with the first insulating film 1770 sandwiched therebetween. The second electrode 1781 overlaps the channel formation region with the second insulating film 1771 sandwiched therebetween.

The first electrode 1782 and the second electrode 1781 are electrically connected to each other through a wiring 1790.

A laser irradiation method of the present invention can be used in formation of the semiconductor films 1753 and 1780, crystallization, activation, and other steps where laser annealing is used.

In this embodiment, a constant voltage is applied to the first electrode of the TFT used as a switching element (here, the n-channel TFT 1751). By applying a constant voltage 10 to the first electrode, fluctuation in threshold can be reduced and OFF current can be lowered compared to the case where the TFT has only one electrode.

In the TFT (the p-channel TFT 1752 in this embodiment) where a larger current flows compared to the TFT used as a switching element, the first electrode and the second electrode are electrically connected to each other. By applying the same voltage to the first electrode and the second electrode, the depletion layer spreads quickly as though the semiconductor film is actually reduced in thickness. Therefore the sub-threshold coefficient can be reduced and ON current can be increased. Accordingly, when used in a driving circuit, the TFT structured as this can lower the drive voltage. An increase in ON current leads to reduction in size (channel width, in particular) of the TFT. As a result, the integration density can be improved.

Figure 32:
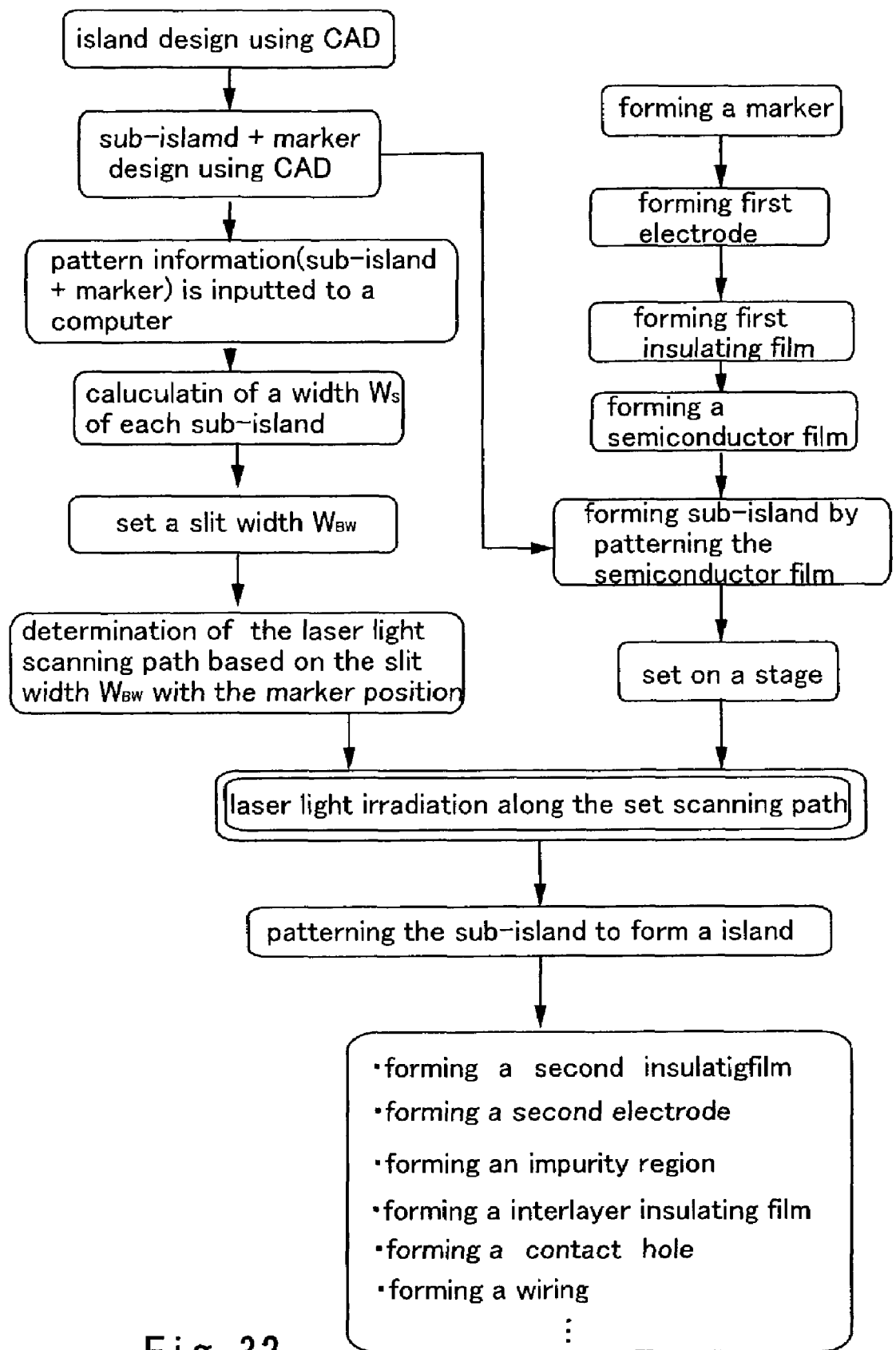
FIG. 32 is a diagram showing the production flow of the present invention.

FIG. 32 shows production flow for manufacturing the light emitting device of this embodiment. First, a semiconductor device is designed using CAD. Specifically, a mask for an island is designed first and then a mask for a sub-island that includes one or more of such islands is designed. Then the designed pattern information of a sub-island is inputted to a computer of laser irradiation apparatus.

From the sub-island pattern information inputted, the computer calculates a width $W_S$ of each sub-island in the direction perpendicular to the scanning direction. Based on the width $W_S$ of each sub-island, a slit width $W_{BW}$ in the direction perpendicular to the scanning direction is set. The laser light scanning path is determined from the slit width $W_{BW}$ with the position of a marker as the reference.

During this, a first gate electrode is formed in accordance with the marker formed on a substrate. Alternatively, the first gate electrode and the marker may be formed at the same time. Then a first insulating film is formed so as to cover the first gate electrode and a semiconductor film is formed so as to come into contact with the first insulating film. The semiconductor film is patterned using the mask for a sub-island to form a sub-island. The substrate on which the sub-island is formed is set on a stage of the laser irradiation apparatus.

With the marker as the reference, laser light runs along the set scanning path targeting the sub-island to crystallize the sub-island.

Thereafter, the sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming an impurity region in the island. Then laser irradiation follows and a second insulating film and a second electrode are sequentially formed so as to cover the island. An impurity region is formed in the island. An interlayer insulating film is then formed so as to cover the second insulating film and the second electrode. A contact hole is formed in the interlayer insulating film to partially expose the impurity region. A wiring is then formed on the interlayer insulating film to reach the impurity region through the contact hole.

This embodiment can be combined with any one of Embodiments 1 through 8.

Embodiment 10

This embodiment describes an example in which a driving circuit (a signal line driving circuit or a scanning line driving circuit) is formed by using a laser irradiation method of the present invention and is mounted to a pixel portion formed from an amorphous semiconductor film using TAB, COG, or the like.

Figure 40A:
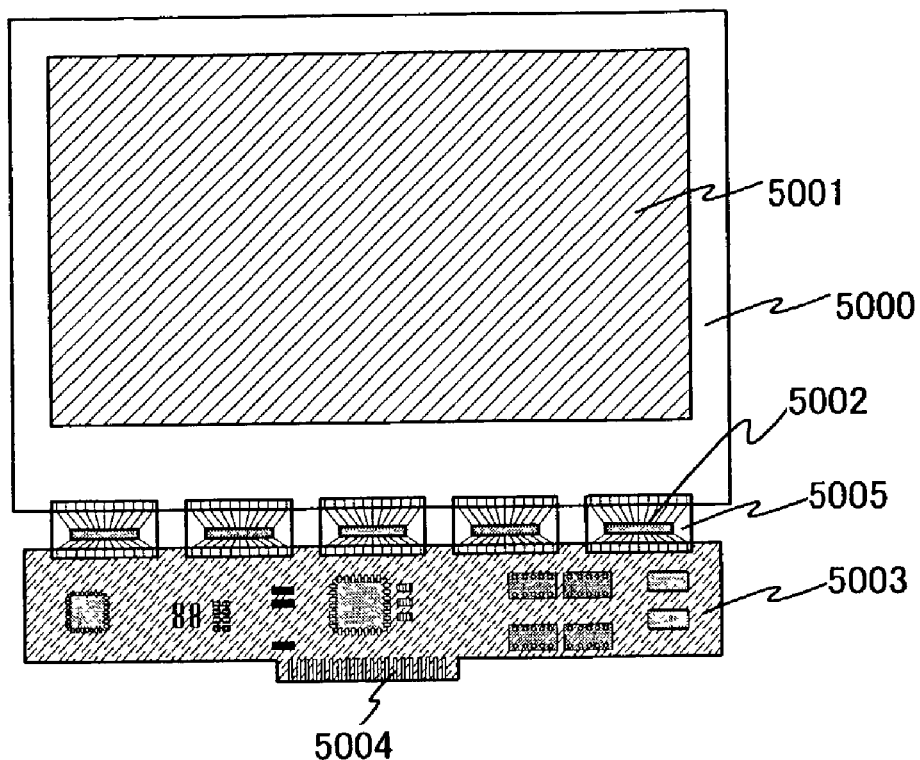
FIGS. 40A and 40B are diagrams of a panel with a driving circuit mounted thereto.

FIG. 40A shows an example of mounting a driving circuit to a TAB tape so that a pixel portion is connected by the TAB tape to a printed substrate on which an external controller and others are formed. A pixel portion 5001 is formed on a glass substrate 5000, and is connected through a TAB tape 5005 to a driving circuit 5002 that is manufactured by a laser irradiation method of the present invention. The driving circuit 5002 is connected through the TAB tape 5005 to a printed substrate 5003. The printed substrate 5003 has a terminal 5004 for connecting the substrate to an external interface.

Figure 40B:
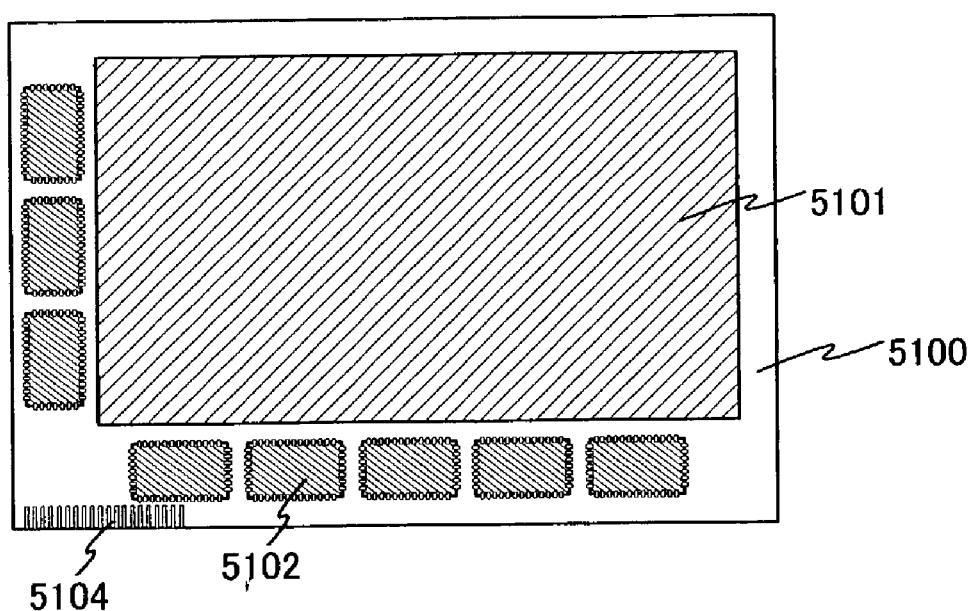

FIG. 40B shows an example of mounting a driving circuit and a pixel portion by COG. A pixel portion 5101 is formed on a glass substrate 5100, and a driving circuit 5102 manufactured by a laser irradiation method of the present invention is mounted to the glass substrate. The substrate 5100 has a terminal 5104 for connecting the substrate to an external interface.

As described, a TFT manufactured by a laser irradiation method of the present invention is improved in crystallinity of its channel formation region and therefore can operate at high speed. The TFT is therefore suitable for constituting a driving circuit which is required to operate at higher speed than a pixel portion. If the pixel portion and the driving circuit are manufactured separately, the yield is increased.

This embodiment can be combined with any one of Embodiments 1 through 9.

Embodiment 11

This embodiment describes a method of manufacturing a TFT using a laser irradiation method of the present invention.

Figure 34A:
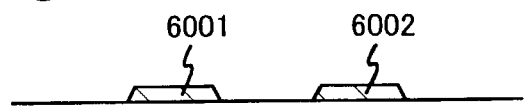
FIGS. 34A to 34L are diagrams showing a method of manufacturing a semiconductor device which uses a laser irradiation method of the present invention.
Figure 34G:
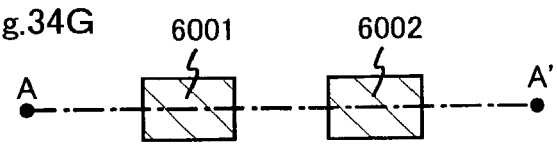
Figure 34B:
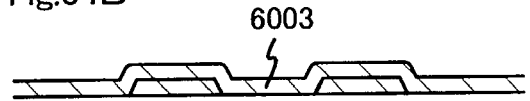
Figure 34H:
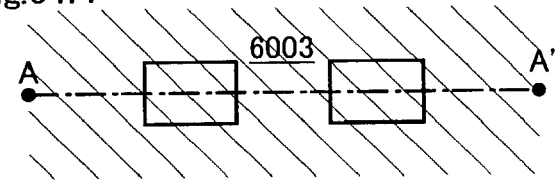

First, as shown in FIG. 34A, an amorphous semiconductor film is formed on an insulating surface and etched to form island-like semiconductor films 6001 and 6002. FIG. 34G is a top view of FIG. 34A, and a sectional view taken along the line A–A' corresponds to FIG. 34A. Next, as shown in FIG. 34B, an amorphous semiconductor film 6003 is formed so as to cover the island-like semiconductor films 6001 and 6002. FIG. 34H is a top view of FIG. 34B, and a sectional view taken along the line A–A' corresponds to FIG. 34B.

Figure 34C:
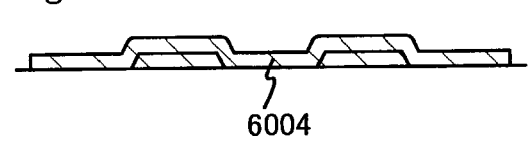
Figure 34I:
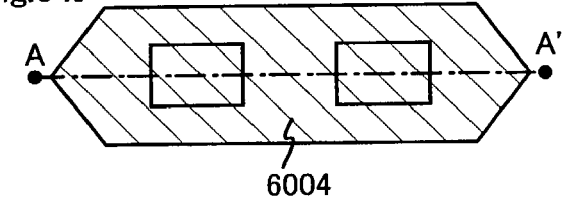
Figure 34D:
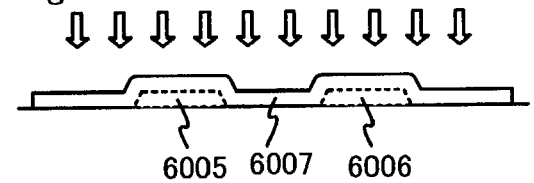
Figure 34J:
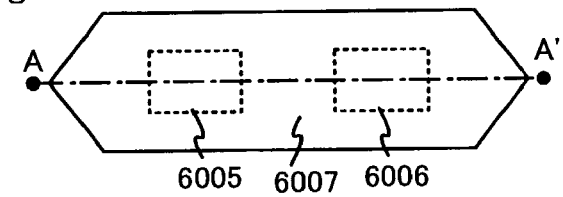

The amorphous semiconductor film 6003 is then patterned as shown in FIG. 34C to form a sub-island 6004 that covers the island-like semiconductor layers 6001 and 6002. FIG. 34I is a top view of FIG. 34C, and a sectional view taken along the line A–A' corresponds to FIG. 34C. Next, the island-like semiconductor layers 6001 and 6002 and the sub-island 6004 are selectively irradiated with laser light as shown in FIG. 34D to form island-like semiconductor films 6005 and 6006 and sub-island 6007 with improved crystallinity. The borders between the island-like semiconductor films 6005 and 6006 and sub-island 6007 with improved crystallinity may not be clear depending on laser light irradiation conditions. Here, they are distinguished from one another but may be deemed as one sub-island. FIG. 34J is a top view of FIG. 34D, and a sectional view taken along the line A–A' corresponds to FIG. 34D.

Figure 34E:
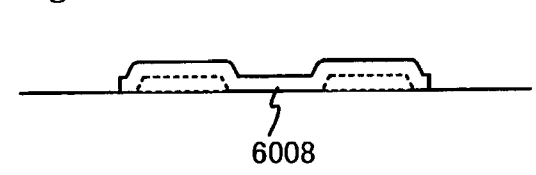
Figure 34K:
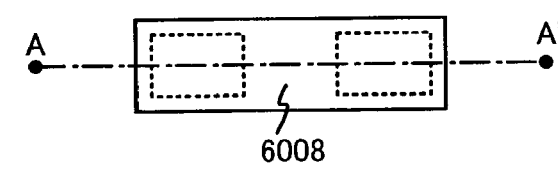
Figure 34F:
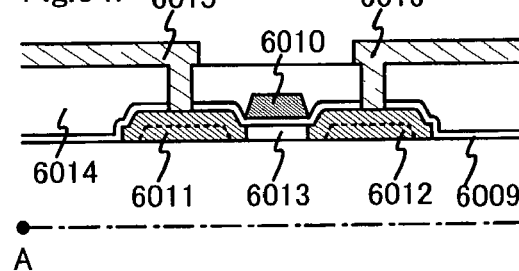
Figure 34L:
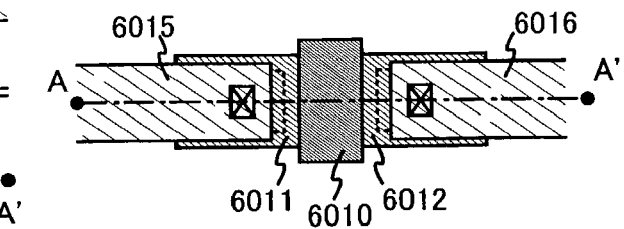

The sub-island 6007 with improved crystallinity is then patterned as shown in FIG. 34E to form an island 6008. FIG. 34K is a top view of FIG. 34E, and a sectional view taken along the line A–A' corresponds to FIG. 34E. A TFT is formed from the island 6008 as shown in FIG. 34F. Specifics of the TFT manufacturing process that follows are varied depending on the TFT form. However, a typical process includes forming a gate insulating film 6009 so as to come into contact with the island 6008, forming a gate electrode 6010 on the gate insulating film, forming impurity regions 6011 and 6012 and a channel formation region 6013 in the island 6008, forming an interlayer insulating film 6014 to cover the gate insulating film 6009, the gate electrode 6010, and the island 6008, and forming wirings 6015 and 6016 on the interlayer insulating film 6014 to connect the wirings to the impurity regions 6011 and 6012. FIG. 34L is a top view of FIG. 34F, and a sectional view taken along the line A–A' corresponds to FIG. 34F.

The impurity regions 6011 and 6012 are composed of the island-like semiconductor films 6005 and 6006 and a part of the island 6008. Therefore the impurity regions 6011 and 6012 are thicker than the channel formation region 6013 and the resistance of the impurity regions can be lowered.

Although the sub-island is crystallized by laser light alone in FIGS. 34A to 34L, a step of crystallizing the semiconductor films using a catalytic element may be added.

A method of forming an island using a catalytic element and laser light both is described with reference to FIGS. 35A to 35G. In using a catalytic element, it is desirable to employ techniques disclosed in JP 07-130652 A and JP 08-78329 A.

Figure 35A:
FIGS. 35A to 35G are diagrams showing a method of manufacturing a semiconductor device which uses a laser irradiation method of the present invention.
Figure 35B:
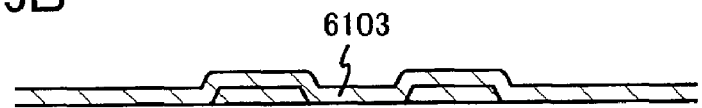
Figure 35C:
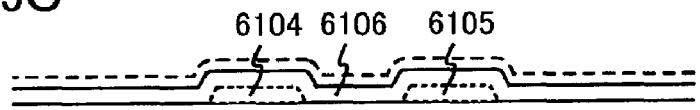

First, as shown in FIG. 35A, an amorphous semiconductor film is formed on an insulating surface and etched to form island-like semiconductor films 6101 and 6102. Next, as shown in FIG. 35B, an amorphous semiconductor film 6103 is formed so as to cover the island-like semiconductor films 6101 and 6102. As shown in FIG. 35C, a nickel acetate solution containing 10 ppm of nickel by weight is applied to the amorphous semiconductor film 6103 to form a nickel-containing layer. After a dehydrogenation step at 500° C. for an hour, the amorphous semiconductor film is subjected to heat treatment at 500 to 650° C. for 4 to 12 hours, for example, at 550° C. for 8 hours, for crystallization to obtain island-like semiconductor films 6104 and 6105 and semiconductor film 6106 with improved crystallinity. Examples of other employable catalytic elements than nickel (Ni) include elements such as germanium (Ge), iron (Fe), palladium (Pd), tin (Sn), lead (Pb), cobalt (Co), platinum (Pt), copper (Cu), and gold (Au).

Figure 35D:

The semiconductor film 6106 and the island-like semiconductor films 6104 and 6105 contain the catalytic element, which is removed from the crystalline semiconductor films by gettering. For gettering, a technique disclosed in JP 10-135468 A or JP 10-135469 A can be employed. As shown in FIG. 35D, portions of the semiconductor film 6106 with improved crystallinity, regions 6107 and 6108, are doped with phosphorus and then subjected to heat treatment in a nitrogen atmosphere at 550 to 800° C. for 5 to 24 hours, for example, at 600° C. for 12 hours. This causes the phosphorus-doped regions 6107 and 6108 to act as gettering sites, so that nickel present in the semiconductor film 6106 and in the island-like semiconductor films 6104 and 6105 is moved to the phosphorus-doped regions and segregated. After that, the phosphorus-doped regions of the polycrystalline semiconductor films are removed by patterning to obtain an island in which the catalytic element concentration is reduced down to $1 \times 10^{17}$ atoms/cm$^3$ or less, preferably, $1 \times 10^{16}$ atoms/cm$^3$ or less.

Figure 35E:
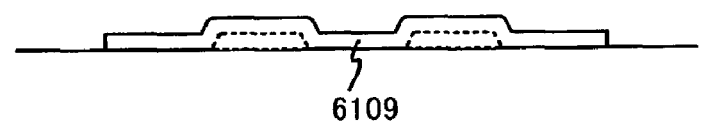
Figure 35F:
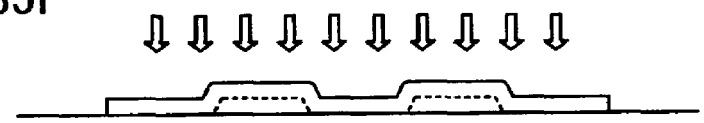
Figure 35G:
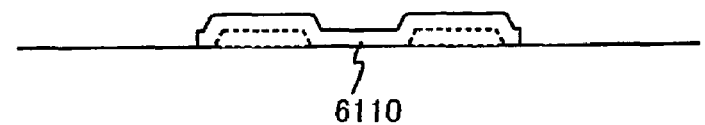

Next, the island-like semiconductor films that have received gettering are patterned as shown in FIG. 35E to form a sub-island 6109. The sub-island 6109 is selectively irradiated with laser light as shown in FIG. 35F to improve its crystallinity even more. The sub-island 6109 with improved crystallinity is then patterned to form an island 6110.

The description given next with reference to FIGS. 36A to 36G is about another method of forming an island using a catalytic element and laser light both.

Figure 36A:
FIGS. 36A to 36G are diagrams showing a method of manufacturing a semiconductor device which uses a laser irradiation method of the present invention.
Figure 36B:
Figure 36C:
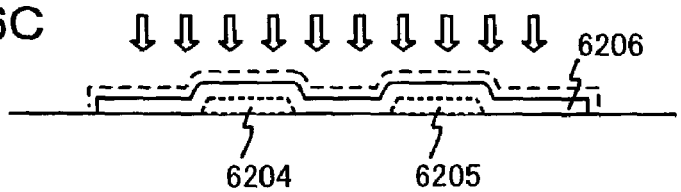

First, as shown in FIG. 36A, an amorphous semiconductor film is formed on an insulating surface and etched to form island-like semiconductor films 6201 and 6202. Next, as shown in FIG. 36B, an amorphous semiconductor film 6203 is formed so as to cover the island-like semiconductor films 6201 and 6202. The amorphous semiconductor film 6203 is patterned as shown in FIG. 36C to form a sub-island. A nickel acetate solution containing 10 ppm of nickel by weight is applied to the sub-island to form a nickel-containing layer. The sub-island is then irradiated with laser light and heated to form island-like semiconductor films 6204 and 6205 and sub-island 6206 with improved crystallinity. Examples of other employable catalytic elements than nickel (Ni) include elements such as germanium (Ge), iron (Fe), palladium (Pd), tin (Sn), lead (Pb), cobalt (Co), platinum (Pt), copper (Cu), and gold (Au).

The sub-island 6206 and the island-like semiconductor films 6204 and 6205 contain the catalytic element, which is removed from the crystalline semiconductor films by gettering.

Figure 36D:
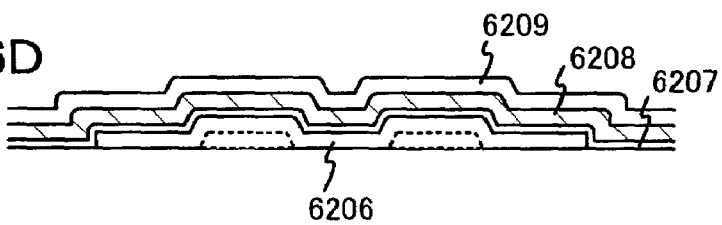
Figure 36E:
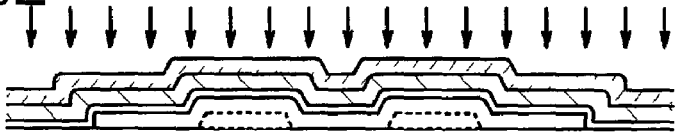
Figure 36F:

As shown in FIG. 36D, a barrier layer 6207 mainly containing silicon is formed on the sub-island 6206. A very thin film can serve as the barrier layer 6207 and it may be a natural oxide film. Alternatively, the barrier layer may be an oxide film oxidized by generating ozone through ultraviolet irradiation in an atmosphere containing oxygen. It is also possible to use as the barrier layer 6207 an oxide film oxidized by an ozone-containing solution that is used in surface treatment called hydro-washing for removing carbon, i.e., organic substances. The barrier layer 6207 mainly serves as an etching stopper. Formation of the barrier layer 6207 may be followed by channel doping and then irradiation with intense light for activation.

Next, a second semiconductor film 6208 is formed on the barrier layer 6207. The second semiconductor film 6208 may be a semiconductor film having an amorphous structure or a semiconductor film having a crystalline structure. The thickness of the second semiconductor film 6208 is set to 5 to 50 nm, preferably, 10 to 20 nm. It is desirable for the second semiconductor film 6208 to contain oxygen (in a concentration of $5 \times 10^{18}/cm^3$ or more, preferably $1 \times 10^{19}/cm^3$ or more according to SIMS) in order to improve the gettering efficiency.

Formed on the second semiconductor film 6208 is a third semiconductor film (gettering site) 6209 containing a rare gas element. The third semiconductor film 6209 may be a semiconductor film with an amorphous structure which is formed by plasma CVD, reduced pressure thermal CVD, or sputtering, or may be a semiconductor film having a crystalline structure. The third semiconductor film may contain a rare gas element when it is being formed into a film. Alternatively, a semiconductor film which does not contain a rare gas element at the time of its formation may be doped with a rare gas element and used as the third semiconductor film. The third semiconductor film 6209 in this embodiment has contained a rare gas element since its formation and is further doped with a rare gas element by selective doping. (FIG. 36E) The second semiconductor film and the third semiconductor film may be formed in succession without exposing them to the air. The sum of the thicknesses of the second semiconductor film and third semiconductor film is set to 30 to 200 nm, for example, 50 nm.

In this embodiment, the third semiconductor film (gettering site) 6209 is distanced from the sub-island 6206 and the island-like semiconductor films 6204 and 6205 by the second semiconductor film 6208. During gettering, a metal or other impurities present in the sub-island 6206 and in the island-like semiconductor films 6204 and 6205 tend to gather near the border of the gettering site. Therefore, the border of the gettering site is desirably distanced from the sub-island 6206 and the island-like semiconductor films 6204 and 6205 by the second semiconductor film 6208 as in this embodiment to improve the gettering efficiency. In addition, the second semiconductor film 6208 has an effect of blocking impurity elements that are contained in the gettering site to prevent them from diffusing and reaching the interface of the sub-island 6206 during gettering. Another effect of the second semiconductor film 6208 is protection of the sub-island 6206 against damage by doping of a rare gas element.

Next, gettering is carried out. Gettering is achieved by heat treatment in a nitrogen atmosphere at 450 to 800° C. for 1 to 24 hours, for example, at 550° C. for 14 hours. The heat treatment may be replaced by irradiation with intense light. Alternatively, heat treatment plus intense light irradiation may be employed. Another option is to heat the substrate by spraying heated gas. In this case, it is sufficient if the substrate is heated at 600 to 800° C., desirably 650 to 750° C., for 1 to 60 minutes and the gettering time can be shortened. Through the gettering, the impurity elements move in the direction indicated by the arrow in FIG. 36F. As a result, the impurity elements contained in the sub-island 6206 and island-like semiconductor films 6204 and 6205 which are covered with the barrier layer 6207 are removed, or the concentration of the impurity elements in the sub-island and the island-like semiconductor films is lowered. Here, all of the impurity elements are moved into the third semiconductor film 6209 while preventing the impurity elements from segregating in the sub-island 6206 and the island-like semiconductor films 6204 and 6205. The sub-island 6206 and the island-like semiconductor films 6204 and 6205 should receive thorough gettering so that almost none of the impurity elements are left in the sub-island 6206 and the island-like semiconductor films 6204 and 6205, in other words, so that the impurity element concentration in the films becomes $1 \times 10^{18}/cm^3$ or less, desirably $1 \times 10^{17}/cm^3$ or less.

Figure 36G:
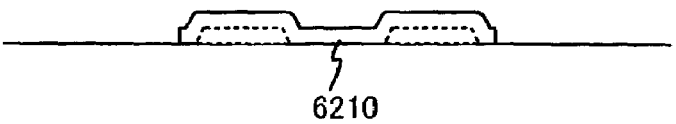

Next, the barrier layer 6207 is used as an etching stopper to selectively remove semiconductor films 6208 and 6209 alone. Then the sub-island 6206 is patterned by a known patterning technique to form an island 6210 with a desired shape. (FIG. 36G)

This embodiment can be combined with any one of Embodiments 1 through 10.

Embodiment 12

This embodiment gives a description on the structure of a TFT formed by using a laser irradiation method of the present invention.

Figure 37A:
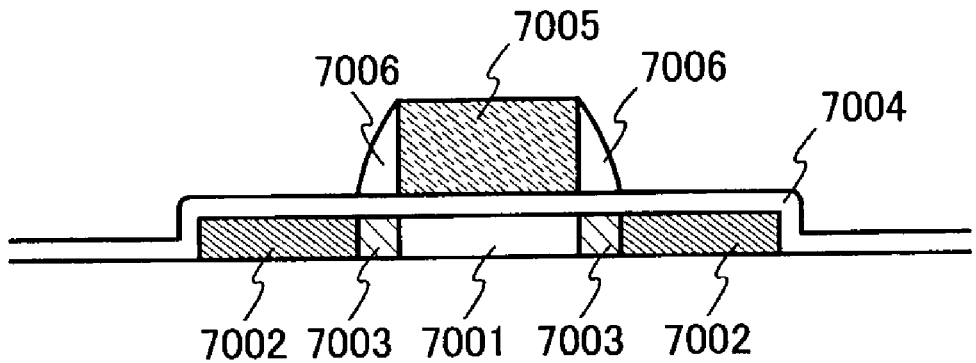
FIGS. 37A to 37C are diagrams showing a method of manufacturing a semiconductor device which uses a laser irradiation method of the present invention.

A TFT shown in FIG. 37A has an active layer that includes a channel formation region 7001, first impurity regions 7002, and second impurity regions 7003. The first impurity regions 7002 sandwich the channel formation region 7001. The second impurity regions 7003 are formed between the first impurity regions 7002 and the channel formation region 7001. The TFT also has a gate insulating film 7004 that is in contact with the active layer and a gate electrode 7005 that is formed on the gate insulating film. Side walls 7006 are formed by the gate electrode and in contact with the side faces of the gate electrode.

The side walls 7006 overlap the second impurity regions 7003 with the gate insulating film 7004 sandwiched between the side walls and the second impurity regions. The side walls 7006 may be conductive or insulative. When the side walls 7006 are conductive, the side walls 7006 may constitute a part of the gate electrode.

Figure 37B:
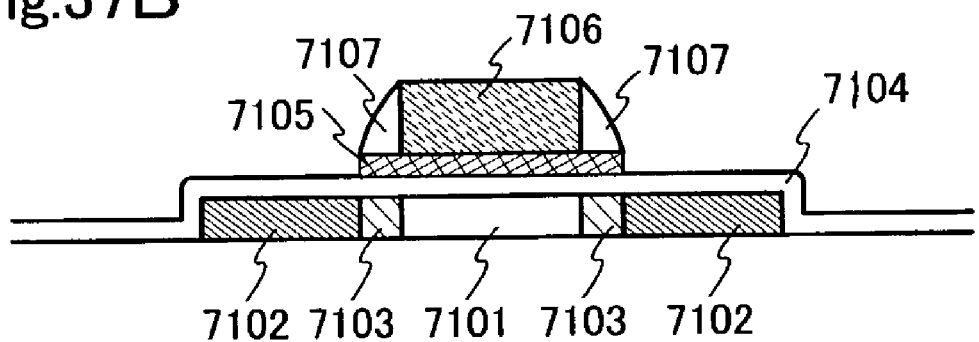

A TFT shown in FIG. 37B has an active layer that includes a channel formation region 7101, first impurity regions 7102, and second impurity regions 7103. The first impurity regions 7102 sandwich the channel formation region 7101. The second impurity regions 7103 are formed between the first impurity regions 7102 and the channel formation region 7101. The TFT also has a gate insulating film 7104 that is in contact with the active layer and a gate electrode that is formed on the gate insulating film. The gate electrode is a laminate of two conductive films 7105 and 7106. Side walls 7107 are formed on the conductive layer 7105 and by the conductive layer 7106 so that the side walls are in contact with the top face of 7105 and the side faces of 7106.

The side walls 7107 may be conductive or insulative. When the side walls 7107 are conductive, the side walls 7107 may constitute a part of the gate electrode.

Figure 37C:
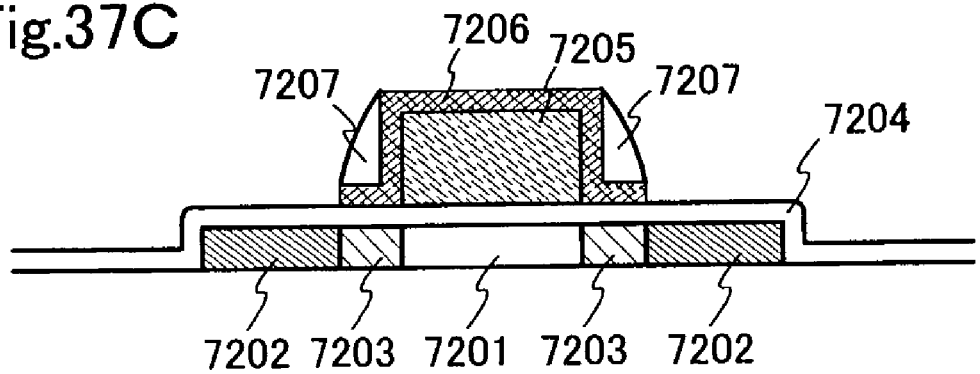

A TFT shown in FIG. 37C has an active layer that includes a channel formation region 7201, first impurity regions 7202, and second impurity regions 7203. The first impurity regions 7202 sandwich the channel formation region 7201. The second impurity regions 7203 are formed between the first impurity regions 7202 and the channel formation region 7201. The TFT also has a gate insulating film 7204 that is in contact with the active layer. A conductive film 7205 is formed on the gate insulating film. A conductive film 7206 covers the top and side faces of the conductive film 7205. Side walls 7207 are formed by the conductive film 7206 and in contact with the side faces of the conductive film 7206. The conductive films 7205 and 7206 function as a gate electrode.

The side walls 7207 may be conductive or insulative. When the side walls 7207 are conductive, the side walls 7207 may constitute a part of the gate electrode.

This embodiment can be combined with any one of Embodiments 1 through 11.

Embodiment 13

The structure of a pixel in a light emitting device of the present invention will be described with reference to FIG. 41.

Figure 41:
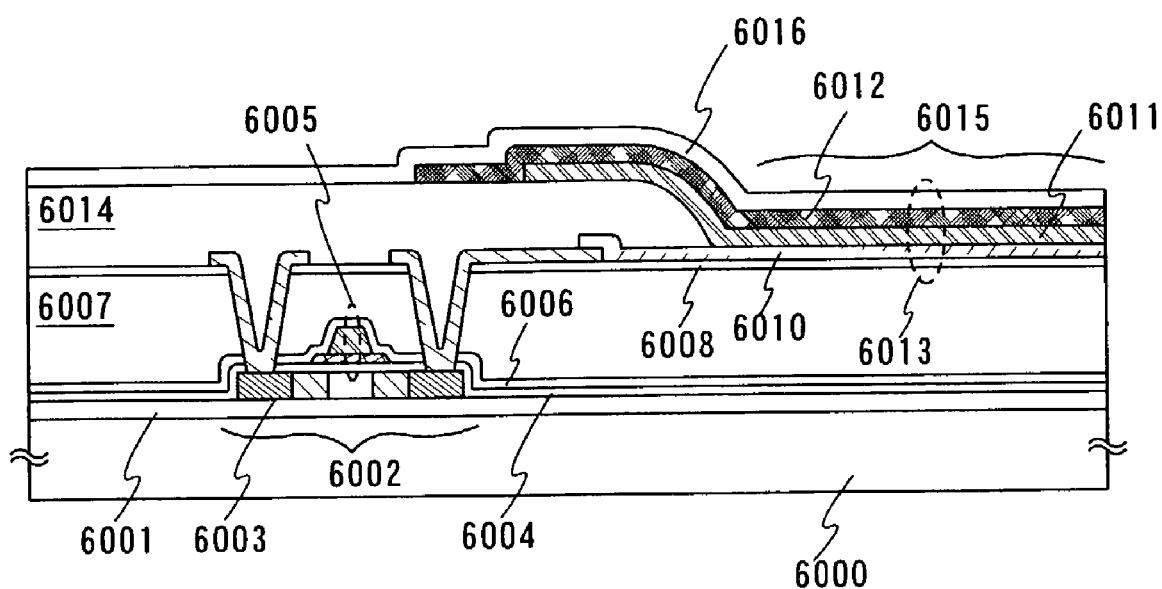
FIG. 41 is a sectional view of a light emitting device manufactured by using a laser apparatus of the present invention.

In FIG. 41, a base film 6001 is formed on a substrate 6000 and a transistor 6002 is formed on the base film 6001. The transistor 6002 has an active layer 6003, a gate electrode 6005, and a gate insulating film 6004, which is sandwiched between the active layer 6003 and the gate electrode 6005.

The active layer 6003 is preferably a polycrystalline semiconductor film, and the polycrystalline semiconductor film can be formed by a laser irradiation apparatus of the present invention.

The active layer may be formed of silicon germanium other than silicon. When silicon germanium is employed, the germanium concentration is preferably about 0.01 to 4.5 atomic %. Silicon doped with carbon nitride may also be used.

The gate insulating film 6004 can be formed from silicon oxide, silicon nitride, or silicon oxynitride. A silicon oxide film, a silicon nitride film, and a silicon oxynitride film may be layered to form the gate insulating film. For example, a SiN film laid on a $SiO_2$ film can be used. A silicon oxide film is formed by plasma CVD in which TEOS (tetraethyl orthosilicate) and $O_2$ are mixed, the reaction pressure is set to 40 Pa, the substrate temperature is set to 300 to 400° C., and the high frequency (13.56 MHz) power density is set to 0.5 to 0.8 W/cm$^2$ for electric discharge. The thus formed silicon oxide film can provide excellent characteristics as a gate insulating film if it subsequently receives thermal annealing at 400 to 500° C. The gate insulating film may also be formed of aluminum nitride. Aluminum nitride has relatively high heat conductivity and is capable of diffusing heat generated in the TFT effectively. A laminate obtained by laying an aluminum nitride film on a silicon oxide film, a silicon oxynitride film, or the like which does not contain aluminum may also be used as the gate insulating film. It is also possible to employ a $SiO_2$ film formed by RF sputtering with Si as the target for the gate insulating film.

The gate electrode 6005 is formed of an element selected from the group consisting of Ta, W, Ti, Mo, Al, and Cu, or an alloy or compound mainly containing the above elements. Alternatively, the gate electrode may be a semiconductor film, typically polycrystalline silicon film, doped with phosphorus or other impurity elements. Instead of a single-layer conductive film, a laminate of plural conductive films may be used as the gate electrode.

The following are examples of a preferred combination of conductive films: a combination of a tantalum nitride (TaN) film as the first conductive film and a W film as the second conductive film, a combination of a tantalum nitride (TaN) film as the first conductive film and a Ti film as the second conductive film, a combination of a tantalum nitride (TaN) film as the first conductive film and an Al film as the second conductive film, and a combination of a tantalum nitride (TaN) film as the first conductive film and a Cu film as the second conductive film. Alternatively, the first conductive film and the second conductive film may be semiconductor films, typically polycrystalline silicon films, doped with phosphorus or other impurities, or may be Ag—Pd—Cu alloy films.

The gate electrode is not limited to the two-layer structure. For example, a three-layer structure consisting of a tungsten film, aluminum-silicon alloy (Al—Si) film, and titanium nitride film layered in this order may be employed. When the three-layer structure is employed, the tungsten film may be replaced by a tungsten nitride film, the aluminum-silicon alloy (Al—Si) film may be replaced by an aluminum-titanium alloy (Al—Ti) film, and the titanium nitride film may be replaced by a titanium film.

It is important to select the optimum etching method and etchant for the conductive film material employed.

The transistor 6002 is covered with a first interlayer insulating film 6006. A second interlayer insulating film 6007 and a third interlayer insulating film 6008 are layered on the first interlayer insulating film 6006.

The first interlayer insulating film 6006 is a single layer or laminate of a silicon oxide film, silicon nitride film, and silicon oxynitride film formed by plasma CVD or sputtering. A laminate obtained by laying a silicon oxynitride film in which oxygen is higher in mole fraction than nitrogen on top of a silicon oxynitride film in which nitrogen is higher in mole fraction than oxygen may also be used as the first interlayer insulating film 6006.

If thermal processing (heat treatment at 300 to 550° C. for 1 to 12 hours) is conducted after the first interlayer insulating film 6006 is formed, dangling bonds of semiconductors in the active layer 6003 can be terminated (hydrogenated) by hydrogen contained in the first interlayer insulating film 6006.

The second interlayer insulating film 6007 can be formed of non-photosensitive acrylic.

Used as the third interlayer insulating film 6008 should be a film that does not easily transmit moisture, oxygen, and other substances that accelerate degradation of a light emitting element compared to the other insulating films. Typically, a DLC film, a carbon nitride film, a silicon nitride film formed by RF sputtering, or the like is desirably used as the third interlayer insulating film.

In FIG. 41, denoted by 6010 is an anode, 6011, an electric field light emitting layer, and 6012, a cathode. An area where the anode 6010, the electric field light emitting layer 6011, and the cathode 6012 overlap corresponds to a light emitting element 6013. The transistor 6002 is a driving transistor for controlling a current supplied to the light emitting element 6013, and is connected to the light emitting element 6013 directly or in series through another circuit element.

The electric field light emitting layer 6011 may be a light emitting layer alone or a laminate of plural layers including a light emitting layer.

The anode 6010 is formed on the third interlayer insulating film 6008. Also formed on the third interlayer insulating film 6008 is an organic resin film 6014, which is used as a partition wall. The organic resin film 6014 has an opening 6015 where the anode 6010, the electric field light emitting layer 6011, and the cathode 6012 overlap to form the light emitting element 6013.

A protective film 6016 is formed on the organic resin film 6014 and the cathode 6012. Used as the protective film 6016 is, similar to the third interlayer insulating film 6008, a film that does not easily transmit moisture, oxygen, and other substances that accelerate degradation of a light emitting element compared to the other insulating films. Typically, a DLC film, a carbon nitride film, a silicon nitride film formed by RF sputtering, or the like is used as the protective film. It is also possible to use as the protective film a laminate of the above-described film that does not easily transmit moisture, oxygen, and other substances and a film that transmits moisture, oxygen, and other substances easily compared to the former film.

Before the electric field light emitting layer 6011 is formed, the organic resin film 6014 is heated in a vacuum atmosphere to remove adsorbed moisture, oxygen, and the like. Specifically, heat treatment is conducted in a vacuum atmosphere at 100 to 200° C. for about 0.5 to 1 hour. The pressure is set to desirably $3\times10^{-7}$ Torr or lower, if possible, $3\times10^{-8}$ Torr or lower is the best. When the electric field light emitting layer is formed, after the heat treatment of the organic resin film in a vacuum atmosphere, the vacuum atmosphere is maintained until the last moment before the electric field light emitting layer is formed. This enhances the reliability even more.

The end of the organic resin film 6014 in the opening 6015 is desirably rounded in order to prevent the end from poking a hole in the electric field light emitting layer 6011 that is formed on the organic resin film 6014 and partially overlaps the organic resin film. To be specific, the radius of curvature of the curved organic resin film in section in the opening is desirably about 0.2 to 2 μm.

The above structure gives the electric field light emitting layer and cathode formed later an excellent coverage and can avoid a situation where a hole is formed in the electric field light emitting layer 6011 and causes short circuit of the anode 6011 and the cathode 6012. A defect called shrink which refers to reduction of the light emitting region can be reduced by relieving the stress of the electric field light emitting layer 6011, and the reliability is thus enhanced.

In the example shown in FIG. 41, a positive photosensitive acrylic resin is used for the organic resin film 6014. Photosensitive organic resins are classified into a positive type and a negative type. A-part of a resin that is exposed to an energy beam such as light, electron, and ion is removed if the resin is the positive type and is left if the resin is the negative type. A negative type organic resin film too can be used in the present invention. Also, the organic resin film 6014 may be formed from photosensitive polyimide.

When a negative acrylic resin is used to form the organic resin film 6014, the end of the organic resin film in the opening 6015 is shaped like the letter S in section. The radius of curvature thereof at the upper edge and lower edge of the opening is desirably 0.2 to 2 μm.

The anode 6010 may be formed from a transparent conductive film. An ITO film as well as a transparent conductive film obtained by mixing 2 to 20% of zinc oxide (ZnO) with indium oxide can be employed. In FIG. 41, ITO is used for the anode 6010. The anode 6010 may be polished by CMP or a porous polyvinyl alcohol-based substance (Bellclean washing) in order to level its surface. The surface of the anode 6010 which has received polishing by CMP may be subjected to ultraviolet irradiation or oxygen plasma treatment.

The cathode 6012 can be formed from other known material as long as it is a conductive film having a small work function. For instance, Ca, Al, CaF, MgAg, AlLi, and the like are desirable.

In the structure shown in FIG. 41, light from the light emitting element is emitted toward the substrate 6000 side. However, the light emitting element may be structured such that emitted light travels in the direction opposite to the substrate.

In FIG. 41, the transistor 6002 is connected to the anode 6010 of the light emitting element. However, the present invention is not limited thereto and the transistor 6002 may be connected to the cathode 6001 of the light emitting element. In this case, the cathode is formed on the third interlayer insulating film 6008 from TiN or the like.

In practice, it is preferable to package (seal) the device that has reached the stage of FIG. 41 with a protective film which is highly airtight and which allows little gas to leak (a laminate film, a UV-curable resin film, or the like) or a light-transmissive cover member in order to avoid exposure to the outside air. In packaging the device, the interior of the cover member may be set to inert atmosphere or a hygroscopic material (such as barium oxide) may be put inside in order to improve the reliability of the device.

The present invention is not limited to the manufacturing method described above, and the device can be manufactured using a known method. This embodiment can be combined freely with Embodiments 1 through 13.

The present invention runs laser light so as to obtain at least the minimum degree of crystallization of a portion that has to be crystallized, instead of irradiating the entire semiconductor film with laser light. With the above structure, time for laser irradiation of portions that are removed by patterning after crystallization of the semiconductor film can be saved to greatly shorten the processing time per substrate.

Furthermore, the crystallinity of a semiconductor film can be enhanced more efficiently by overlapping plural laser beams to compensate one another's low energy density portions compared to the case where laser beams are not overlapped and a single laser beam is used.

Although the description given in the present invention is about the case where laser light emitted from plural laser oscillation apparatuses are synthesized, the present invention is not particularly limited thereto. The present invention may use only one laser oscillation apparatus if it has relatively high output energy and is capable of providing a desired energy density without reducing the area of its beam spot. In this case also, the use of a slit makes it possible to block low energy density portions of laser light and to control the beam spot width in accordance with pattern information.

What is claimed is:

1. A method of manufacturing a semiconductor device, comprising:
    forming a semiconductor film over a substrate;
    patterning the semiconductor film to form a sub-island and a marker;
    determining, from pattern information of the sub-island, a width in a direction perpendicular to a scanning direction of a laser beam spot and a scanning path of the beam spot so as to include the sub-island;
    controlling the width in the direction perpendicular to the scanning direction of the beam spot by using a slit;
    running the beam spot along the scanning path with the marker as the reference to enhance crystallinity of the sub-island wherein the sub-island is included in an area irradiated in the width by the running of the beam spot; and
    patterning the sub-island with enhanced crystallinity to form an island.

2. A method of manufacturing a semiconductor device according to claim 1, wherein laser light irradiation takes place in a reduced pressure atmosphere or inert gas atmosphere.

3. A method of manufacturing a semiconductor device according to claim 1, wherein the laser light is outputted from one or more kinds of lasers selected from the group consisting of a YAG laser, a $YVO_4$ laser, a YLF laser, a $YAlO_3$ laser, a glass laser, a ruby laser, an alexandrite laser, a Ti: sapphire laser, and a $Y_2O_3$ laser.

4. A method of manufacturing a semiconductor device according to claim 1, wherein the laser light is continuous wave laser light.

5. A method of manufacturing a semiconductor device according to claim 1, wherein the laser light is second harmonic.

6. A method of manufacturing a semiconductor device according to claim 1, wherein the width of the slit is variable.

7. A method of manufacturing a semiconductor device, comprising:
forming a semiconductor film over a substrate;
patterning the semiconductor film to form a sub-island using a mask;
detecting pattern information of the sub-island using a CCD;
grasping a position of the substrate by checking pattern information of the mask against the pattern information of the sub-island;
determining, from the pattern information of the sub-island, a width in a direction perpendicular to a scanning direction of a laser beam spot and a scanning path of the beam spot so as to include the sub-island;
controlling the width in the direction perpendicular to the scanning direction of the beam spot by using a slit;
running the beam spot along the scanning path with the marker as the reference to enhance crystallinity of the sub-island wherein the sub-island is included in an area irradiated in the width by the running of the beam spot; and
patterning the sub-island with enhanced crystallinity to form an island.

8. A method of manufacturing a semiconductor device according to claim 7, wherein laser light irradiation takes place in a reduced pressure atmosphere or inert gas atmosphere.

9. A method of manufacturing a semiconductor device according to claim 7, wherein the laser light is outputted from one or more kinds of lasers selected from the group consisting of a YAG laser, a $YVO_4$ laser, a YLF laser, a $YAlO_3$ laser, a glass laser, a ruby laser, an alexandrite laser, a Ti: sapphire laser, and a $Y_2O_3$ laser.

10. A method of manufacturing a semiconductor device according to claim 7, wherein the laser light is continuous wave laser light.

11. A method of manufacturing a semiconductor device according to claim 7, wherein the laser light is second harmonic.

12. A method of manufacturing a semiconductor device according to claim 7, wherein the width of the slit is variable.

13. A method of manufacturing a semiconductor device, comprising:
forming a semiconductor film over a substrate;
patterning the semiconductor film to form a sub-island and a marker;
determining, from pattern information of the sub-island, a width in a direction perpendicular to a scanning direction of a laser beam spot and a scanning path of the beam spot so as to include the sub-island;
controlling the width in the direction perpendicular to the scanning direction of the beam spot by using a slit;
running the beam spot along the scanning path with the marker as a reference to enhance crystallinity of the sub-island wherein the sub-island is included in an area irradiated in the width by the running of the beam spot; and
patterning the sub-island with enhanced crystallinity to form an island,
wherein, when the beam spot reaches the sub-island during running the beam spot, one point of the beam spot comes into contact with the sub-island.

14. A method of manufacturing a semiconductor device according to claim 13, wherein laser light irradiation takes place in a reduced pressure atmosphere or inert gas atmosphere.

15. A method of manufacturing a semiconductor device according to claim 13, wherein the laser light is outputted from one or more kinds of lasers selected from the group consisting of a YAG laser, a $YVO_4$ laser, a YLF laser, a $YAlO_3$ laser, a glass laser, a ruby laser, an alexandrite laser, a Ti: sapphire laser, and a $Y_2O_3$ laser.

16. A method of manufacturing a semiconductor device according to claim 13, wherein the laser light is continuous wave laser light.

17. A method of manufacturing a semiconductor device according to claim 13, wherein the laser light is second harmonic.

18. A method of manufacturing a semiconductor device according to claim 13, wherein the width of the slit is variable.

19. A method of manufacturing a semiconductor device, comprising:
forming a semiconductor film over a substrate;
patterning the semiconductor film to form a sub-island using a mask;
detecting pattern information of the sub-island using a CCD;
grasping a position of the substrate by checking pattern information of the mask against the pattern information of the sub-island;
determining, from the pattern information of the sub-island, a width in a direction perpendicular to a scanning direction of a laser beam spot and a scanning path of the beam spot so as to include the sub-island;
controlling the width in the direction perpendicular to the scanning direction of the beam spot by using a slit;
running the beam spot along the scanning path with the marker as the reference to enhance crystallinity of the sub-island wherein the sub-island is included in an area irradiated in the width by the running of the beam spot; and
patterning the sub-island with enhanced crystallinity to form an island,
wherein, when the beam spot reaches the sub-island during running the beam spot, one point of the beam spot comes into contact with the sub-island.

20. A method of manufacturing a semiconductor device according to claim 19, wherein laser light irradiation takes place in a reduced pressure atmosphere or inert gas atmosphere.

21. A method of manufacturing a semiconductor device according to claim 19, wherein the laser light is outputted from one or more kinds of lasers selected from the group consisting of a YAG laser, a $YVO_4$ laser, a YLF laser, a $YAlO_3$ laser, a glass laser, a ruby laser, an alexandrite laser, a Ti: sapphire laser, and a $Y_2O_3$ laser.

22. A method of manufacturing a semiconductor device according to claim 19, wherein the laser light is continuous wave laser light.

23. A method of manufacturing a semiconductor device according to claim 19, wherein the laser light is second harmonic.

24. A method of manufacturing a semiconductor device according to claim 19, wherein the width of the slit is variable.

25. A method of manufacturing a semiconductor device, comprising:
forming a semiconductor film over a substrate;
patterning the semiconductor film to form a sub-island and a marker;
determining, from pattern information of the sub-island, a width in a direction perpendicular to a scanning direction of one laser beam spot and a scanning path of the one beam spot so as to include the sub-island;
forming the one beam spot by using an optical system and a slit;
running the one beam spot along the scanning path with a marker as a reference to enhance crystallinity of the sub-island wherein the sub-island is included in an area irradiated in the width by the running of the one beam spot; and
patterning the sub-island with enhanced crystallinity to form an island,
wherein the optical system makes beam spots of plural laser lights partially overlap each other to form the one beam spot,
wherein the plural laser lights are outputted from plural laser oscillation apparatuses, and
wherein the slit reduces a width of the one beam spot in a direction perpendicular to the scanning direction of the one beam spot.

26. A method of manufacturing a semiconductor device according to claim 25, wherein a central axis running through the center of the partially overlapped beam spots of plural laser lights is at angles of 10° or larger and 80° or less with a direction in which the substrate moves.

27. A method of manufacturing a semiconductor device according to claim 25, wherein a central axis running through the center of the partially overlapped beam spot of plural laser lights is almost at right angles with a direction the substrate moves.

28. A method of manufacturing a semiconductor device according to claim 25, wherein the beam spot formed has a linear shape.

29. A method of manufacturing a semiconductor device according to claim 25, wherein laser light irradiation takes place in a reduced pressure atmosphere or inert gas atmosphere.

30. A method of manufacturing a semiconductor device according to claim 25, wherein the laser light is outputted from one or more kinds of lasers selected from the group consisting of a YAG laser, a YVO$_4$ laser, a YLF laser, a YAlO$_3$ laser, a glass laser, a ruby laser, an alexandrite laser, a Ti: sapphire laser, and a Y$_2$O$_3$ laser.

31. A method of manufacturing a semiconductor device according to claim 25, wherein the laser light is continuous wave laser light.

32. A method of manufacturing a semiconductor device according to claim 25, wherein the laser light is second harmonic.

33. A method of manufacturing a semiconductor device according to claim 25, wherein the number of the laser oscillation apparatuses is equal to or more than 2 and equal to or less than 8.

34. A method of manufacturing a semiconductor device according to clam 25, wherein the width of the slit is variable.

35. A method of manufacturing a semiconductor device, comprising:
forming a semiconductor film over a substrate;
patterning the semiconductor film to form a sub-island and a marker,
determining, from pattern information of the sub-island, a width in a direction perpendicular to a scanning direction of one laser beam spot and a scanning path of the one beam spot so as to include the sub-island;
forming the one beam spot by using an optical system and a slit;
running the one beam spot alone the scanning path with a marker as a reference to enhance crystallinity of the sub-island wherein the sub-island is included in an area irradiated in the width by the running of the one beam spot; and
patterning the sub-island with enhanced crystallinity to form an island,
wherein the optical system makes beam spots of plural laser lights partially overlap each other so that centers of the plural laser lights draw a straight line to form the one beam spot,
wherein the plural laser lights are outputted from plural laser oscillation apparatuses, and
wherein the slit reduces a width of the one beam spot in a direction perpendicular to the scanning direction of the one beam spot.

36. A method of manufacturing a semiconductor device according to claim 35, wherein the straight line formed by the beam spot is at angles of 10° or larger and 80° or less with a direction in which the substrate moves.

37. A method of manufacturing a semiconductor device according to claim 35, wherein the straight line formed by the beam spot is almost at right angles with a direction the substrate moves.

38. A method of manufacturing a semiconductor device according to claim 35, wherein the beam spot formed has a linear shape.

39. A method of manufacturing a semiconductor device according to claim 35, wherein laser light irradiation takes place in a reduced pressure atmosphere or inert gas atmosphere.

40. A method of manufacturing a semiconductor device according to claim 35, wherein the laser light is outputted from one or more kinds of lasers selected from the group consisting of a YAG laser, a YVO$_4$ laser, a YLF laser, a YAlO$_3$ laser, a glass laser, a ruby laser, an alexandrite laser, a Ti: sapphire laser, and a Y$_2$O$_3$ laser.

41. A method of manufacturing a semiconductor device according to claim 35, wherein the laser light is continuous wave laser light.

42. A method of manufacturing a semiconductor device according to claim 35, wherein the laser light is second harmonic.

43. A method of manufacturing a semiconductor device according to claim 35, wherein the number of the laser oscillation apparatuses is equal to or more than 2 and equal to or less than 8.

44. A method of manufacturing a semiconductor device according to claim 35, wherein width of the slit is variable.

* * * * *